United States Patent
Ueda et al.

(10) Patent No.: US 6,402,401 B1
(45) Date of Patent: Jun. 11, 2002

(54) SUBSTRATE PROCESSING APPARATUS AND SUBSTRATE PROCESSING METHOD

(75) Inventors: Issei Ueda; Shinichi Hayashi; Naruaki Iida; Yuji Matsuyama, all of Kumamoto-Ken; Yoichi Deguchi, Tokyo-To, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/688,140

(22) Filed: Oct. 16, 2000

(30) Foreign Application Priority Data

Oct. 19, 1999 (JP) .......................................... 11-296395

(51) Int. Cl.[7] ................................................. G03D 5/00
(52) U.S. Cl. ........................ 396/611; 118/52; 118/666; 414/940
(58) Field of Search ................................ 396/604, 611; 118/52, 54, 56, 319–321, 666–668; 427/240; 134/902; 414/935–940; 29/25.01

(56) References Cited

U.S. PATENT DOCUMENTS

| 5,826,129 | A | | 10/1998 | Hasebe et al. ............... 396/611 |
|---|---|---|---|---|
| 5,928,390 | A | | 7/1999 | Yaegashi et al. ........... 29/25.01 |
| 5,942,013 | A | | 8/1999 | Akimoto ..................... 29/25.01 |
| 6,161,969 | A | * | 12/2000 | Kimura et al. .............. 396/611 |
| 6,215,545 | B1 | * | 4/2001 | Matsuyama .................. 396/611 |
| 6,290,405 | B1 | * | 9/2001 | Ueda .......................... 396/611 |
| 6,292,250 | B1 | * | 9/2001 | Matsuyama .................. 396/611 |

* cited by examiner

*Primary Examiner*—D Rutledge
(74) *Attorney, Agent, or Firm*—Rader, Fishman & Grauer, PLLC

(57) ABSTRACT

Thermal processing unit sections each with ten tiers and coating processing unit sections each with five tiers are disposed around a first main wafer transfer section and a second main wafer transfer section, and in the thermal processing unit section, the influence of the time required for substrate temperature regulation processing on a drop in throughput can be reduced greatly by transferring the wafer W while the temperature of the wafer W is being regulated by a temperature regulation and transfer device.

66 Claims, 39 Drawing Sheets

SUBSTRATE PROCESSING APPARATUS AND SUBSTRATE PROCESSING METHOD

BACKGROUND OF THE INVENTION

1. Field of the Invention

The present invention relates to a substrate processing apparatus such as a coating and developing processing apparatus for coating a semiconductor wafer with a resist solution and developing it, and a substrate processing method applied, for example, to such an apparatus.

2. Description of the Related Art

In the process of photo-resist processing in semiconductor device fabrication, for example, a substrate such as a semiconductor wafer (hereinafter referred to as "a wafer") or the like undergoes exposure of a pattern, heat processing, temperature regulation processing, and then developing processing. A coating and developing processing apparatus has been hitherto used for such a series of processing.

This coating and developing processing apparatus includes various kinds of processing units for individually performing a series of processing required for coating and developing processing of a wafer, for example, resist coating processing for applying a resist solution, heat processing for heating the wafer which has undergone exposure processing, temperature regulation processing for regulating the temperature of the wafer which has undergone the heat processing, and developing processing for performing developing processing for the wafer which has undergone the temperature regulation processing. The wafer is carried into/out of each processing unit and transferred between the processing units by a main transfer device.

The transfer of the wafer to the units by the main transfer device only, however, is a heavy burden for the main transfer device, whereby there is a possibility of causing a drop in the throughput of the entire apparatus.

Japanese Patent Laid-open No. Hei 8-162514 Official Gazette discloses an art in which processing unit group is composed of predetermined processing sections out of processing sections for performing continuous processing, a substrate delivery position is provided in the processing section group, and in which a sub-transfer robot transfers a substrate between the substrate delivery position and the processing sections composing the processing section group, while a main transfer robot transfers the substrate between processing sections other than the processing sections composing the processing section group and the substrate delivery position of the processing section group. Thus, the burden imposed on the transfer device can be lightened, thereby improving throughput.

Temperature regulation processing is performed after heat processing, for example, between exposure processing and developing processing, and throughput tends to decrease since the time required for temperature regulation processing is long, but according to the art disclosed as above, the sub-transfer robot, the burden imposed on which is lightened, transfers the substrate between the processing section for performing heat processing and the processing section for performing temperature regulation processing, whereby a period of time from the completion of heat processing to the start of developing solution is shortened, which make it possible to reduce the influence of the time required for temperature regulation processing on a drop in throughput.

In the art disclosed in the aforesaid Official Gazette, however, the actual time required for temperature regulation processing is the same as before, and hence there is a limit to a reduction in the influence of the time required for temperature regulation processing on a drop in throughput.

Further in the art disclosed in the aforesaid Official Gazette, the substrate is carried into the processing section for performing heat processing and the processing section for performing temperature regulation processing via the sub-transfer robot, and hence there is a problem that ununiformity occurs in the thermal budget of the substrate before heat processing or before temperature regulation processing, whereby processing at a precise temperature can not be performed. Specially in recent years, there is a tendency to cope with a change in temperature by making a hot plate and a temperature regulating plate thinner, in which case the temperatures of the hot plate and the temperature regulating plate are disturbed when the substrate with ununiform thermal budget is carried therein, thereby making substrate processing at a precise temperature difficult.

On the other hand, in order to decease the entire coating and developing processing apparatus in size, the saving of a space for the coating and developing processing apparatus has been hitherto attained by integrally disposing a plurality of heat processing units and temperature regulation processing units in multiple tiers together with a transfer device.

All the processing units increase in size with an increase in the diameter of the wafer. Accordingly, higher integration of the placement of processing units is necessary for saving space.

SUMMARY OF THE INVENTION

An object of the present invention is to provide a substrate processing apparatus and a substrate processing method capable of practically reducing the time required for temperature regulation processing of a substrate.

A second object of the present invention is to provide a substrate processing apparatus and a substrate processing method capable of performing thermal processing and temperature regulation processing for the substrate more precisely.

A third object of the present invention is to provide a substrate processing apparatus capable of precisely performing temperature control in a processing unit for performing solution processing for the substrate.

To attain the aforesaid objects, a substrate processing apparatus of the present invention comprises: a main transfer section for transferring a substrate: temperature regulating sections, disposed around the main transfer section in at least two directions facing each other out of four directions, for receiving and sending the substrate from/to the main transfer device and regulating the temperature of the substrate at a predetermined temperature: a thermal processing section for processing the substrate at a temperature not less than the predetermined temperature; and moving means for moving the temperature regulating section to deliver the substrate from/to the temperature regulating section to/from the thermal processing section.

The apparatus of the present invention further comprises a solution supplying section, disposed in at least one direction out of the four directions, for supplying a predetermined solution to the substrate, and the main transfer section receives and sends the substrate from/to the solution supplying section.

The apparatus of the present invention further comprises a substrate processing section (for example, an adhesion unit for making the substrate hydrophobic) other than the temperature regulating section and the solution supplying section, disposed in at least one direction out of the four directions, and the main transfer section receives and sends the substrate from/to the substrate processing section.

A substrate processing apparatus of the present invention comprises: a temperature regulating section for regulating the temperature of a substrate at a predetermined temperature; a temperature regulation and transfer mechanism for regulating the temperature of the substrate at a predetermined temperature and transferring the substrate; and a main transfer section for receiving and sending the substrate from/to the temperature regulating section and the temperature regulation and transfer mechanism.

The apparatus of the present invention further comprises a processing section for performing thermal processing for the substrate, and the temperature regulation and transfer mechanism receives and sends the substrate from/to the processing section.

In the apparatus of the present invention, the substrate delivered from the processing section to the temperature regulation and transfer mechanism is delivered to the main transfer section and transferred to the temperature regulating section.

In the apparatus of the present invention, the temperature of the substrate when the main transfer section receives the substrate from the temperature regulating section and the temperature of the substrate when the main transfer section receives the substrate from the temperature regulation and transfer mechanism are different.

A substrate processing apparatus of the present invention comprises a processing section for performing thermal processing for a substrate; a temperature regulation and transfer mechanism for regulating the temperature of the substrate at a predetermined temperature and transferring the substrate from/to the processing section; and a fist and a second main transfer section, disposed on both sides of the temperature regulation and transfer mechanism, for transferring the substrate from/to the temperature regulation and transfer mechanism.

The apparatus of the present invention further comprises a solution supplying section for supplying a predetermined solution to the substrate, and the main transfer section receives and sends the substrate from/to the solution supplying section.

In the apparatus of the present invention, the temperature regulating sections, the temperature regulation and transfer mechanisms, the processing sections, and the solution supplying sections are vertically stacked in multiple tiers individually.

In the apparatus of the present invention, the temperature regulation and transfer mechanism and the processing section are surrounded by the same casing to compose a processing unit, and the processing units and the temperature regulating sections are vertically stacked in multiple tiers while being intermingled.

A substrate processing apparatus of the present invention comprises: a main transfer section for transferring a substrate; a processing section for performing thermal processing for the substrate; and a temperature regulation and transfer section for regulating the temperature of the substrate at a predetermined temperature and transferring the substrate between the main transfer section and the processing section.

The apparatus of the present invention further comprises a casing surrounding the processing section and the temperature regulation and transfer section and having an opening for the delivery of the substrate from/to the main transfer section to/from the temperature regulation and transfer section.

A substrate processing apparatus of the present invention comprises: a main transfer section for transferring a substrate: a first processing section for performing thermal processing for the substrate; a second processing section for performing thermal processing for the substrate; and a temperature regulation and transfer section for regulating the temperature of the substrate at a predetermined temperature and transferring the substrate between the main transfer section, and the first processing section and the second processing section, and the first processing section, the second processing section, and the temperature regulation and transfer section are disposed linearly.

The apparatus of the present invention further comprises a casing surrounding the first processing section, the second processing section, and the temperature regulation and transfer section and having an opening for the delivery of the substrate from/to the main transfer section to/from the temperature regulation and transfer section.

A substrate processing apparatus of the present invention comprises: a temperature regulating section for regulating the temperature of a substrate at a predetermined temperature; a processing section for performing thermal processing for the substrate; a main transfer section for receiving and sending the substrate at least from/to the temperature regulating section; and a sub-transfer section for transferring the substrate between the temperature regulating section and the processing section.

The apparatus of the present invention further comprises a casing surrounding the temperature regulating section and the sub-transfer section and having an opening for the delivery of the substrate from/to the main transfer section to/from the temperature regulating section.

A substrate processing apparatus comprises: a temperature regulating section for regulating the temperature of a substrate at a predetermined temperature; a first processing section for performing thermal processing for the substrate; a second processing section for performing thermal processing for the substrate; a main transfer section for receiving and sending the substrate at least from/to the temperature regulating section; and a sub-transfer section for transferring the substrate between the temperature regulating section, and the first processing section, and the second processing section, and the temperature regulating section, the first processing section, and the second processing section are disposed linearly.

The apparatus of the present invention further comprises a casing surrounding the first processing section, the second processing section, the temperature regulating section, and the sub-transfer section and having an opening for the delivery of the substrate from/to the main transfer section to/from the temperature regulating section.

A substrate processing apparatus of the present invention comprises: a main transfer section for transferring a substrate; a processing section for performing thermal processing for the substrate; a temperature regulation and transfer section for regulating the temperature of the substrate at a predetermined temperature and transferring the substrate from/to the processing section; and a plurality of ascending and descending pins which are ascendable and descendable, for receiving and sending the substrate from/to the main transfer section when the pins are raised fully, and receiving and sending the substrate from/to the temperature regulation and transfer section when the pins are lowered fully.

The apparatus of the present invention further comprises a casing surrounding the processing section, the temperature regulation and transfer section, and the ascending and descending pins and having an opening for the delivery of the substrate from/to the main transfer section to/from the ascending and descending pins.

A substrate processing apparatus of the present invention comprises: a main transfer section for transferring a substrate; a first processing section for performing thermal processing for the substrate; a second processing section for performing thermal processing for the substrate; a temperature regulation and transfer section for regulating the temperature of the substrate at a predetermined temperature and transferring the substrate between the first processing section and the second processing section; and a plurality of ascending and descending pins which are ascendable and descendable, for receiving and sending the substrate from/to the main transfer section when the pins are raised fully, and receiving and sending the substrate from/to the temperature regulation and transfer section when the pins are lowered fully, and the first processing section, the second processing section, the temperature regulation and transfer section, and the ascending and descending pins are disposed linearly.

The apparatus of the present invention further comprises a casing surrounding the first processing section, the second processing section, the temperature regulation and transfer section, and the ascending and descending pins and having an opening for the delivery of the substrate from/to the main transfer section to/from the ascending and descending pins.

The apparatus of the present invention further comprises a shutter mechanism for opening and closing the opening.

The apparatus of the present invention further comprises a solution supplying section for supplying a predetermined solution to the substrate, and the main transfer section receives and sends the substrate from/to the solution supplying section.

In the apparatus of the present invention, the casings are vertically disposed in multiple tiers.

In the apparatus of the present invention, the solution supplying sections are vertically disposed in multiple tiers.

In the apparatus of the present invention, the main transfer device comprises an arm for holding the substrate; a forward and backward movement driving mechanism for moving the arm forward and backward; a rotation driving mechanism for rotating the arm; and a vertical transfer mechanism for vertically moving the arm, the forward and backward movement driving mechanism, and the rotation driving mechanism integrally.

A substrate processing apparatus of the present invention comprises: a processing unit having openings for the delivery of a substrate on both sides; and a first and second main transfer sections, disposed to face the respective openings of the processing unit, for carrying the substrate into/out of the processing unit through the openings, and the processing unit comprises: a processing section for performing thermal processing for the substrate; and a temperature regulation and transfer section for regulating the temperature of the substrate at a predetermined temperature and transferring the substrate from/to the first and second transfer sections through the respective openings and from/to the processing section.

A substrate processing apparatus of the present invention comprises: a processing unit having openings for the delivery of a substrate on both sides; and a first and second main transfer sections, disposed to face the respective openings of the processing unit, for carrying the substrate into/out of the processing unit through the openings, and the processing unit comprises: a first processing section for performing thermal processing for the substrate; a second processing section for performing thermal processing for the substrate; and a temperature regulation and transfer section for regulating the temperature of the substrate at a predetermined temperature and transferring the substrate from/to the first and second transfer sections through the respective openings and between the first processing section and the second processing section, and the first processing section, the second processing section, and the temperature regulation and transfer section are disposed linearly.

A substrate processing apparatus of the present invention comprises: a processing unit having openings for the delivery of a substrate on both sides; and a first and second main transfer sections, disposed to face the respective openings of the processing unit, for carrying the substrate into/out of the processing unit through the openings, and the processing unit comprises: a temperature regulating section for receiving and sending the substrate from/to the first and second transfer sections through the openings and regulating the temperature of the substrate at a predetermined temperature; a processing section for performing thermal processing for the substrate; and a sub-transfer section for transferring the substrate between the temperature regulating section and the processing section.

A substrate processing section of the present invention comprises: a processing unit having openings for the delivery of a substrate on both sides; and a first and second main transfer sections, disposed to face the respective openings of the processing unit, for carrying the substrate into/out of the processing unit through the openings, and the processing unit comprises: a temperature regulating section for receiving and sending the substrate from/to the first and second transfer sections through the openings and regulating the temperature of the substrate at a predetermined temperature; a first processing section for performing thermal processing for the substrate; a second processing section for performing thermal processing for the substrate; and a sub-transfer section for transferring the substrate between the temperature regulating section, the first processing section, and the second processing section, and the temperature regulating section, the first processing section, and the second processing section are disposed linearly.

A substrate processing apparatus of the present invention comprises: a processing unit having openings for the delivery of a substrate on both sides; and a first and second main transfer sections, disposed to face the respective openings of the processing unit, for carrying the substrate into/out of the processing unit through the openings, and the processing unit comprises: a processing section for performing thermal processing for the substrate; a temperature regulation and transfer section for regulating the temperature of the substrate at a predetermined temperature and transferring the substrate from/to the processing section; and a plurality of ascending and descending pins which are ascendable and descendable, for receiving and sending the substrate from/to the first and second main transfer sections through the openings when the pins are raised fully, and receiving and sending the substrate from/to the temperature regulation and transfer section when the pins are lowered fully.

A substrate processing apparatus of the present invention comprises: a processing unit having openings for the delivery of a substrate on both sides; and a first and second main transfer sections, disposed to face the respective openings of the processing unit, for carrying the substrate into/out of the processing unit through the openings, and the processing unit comprises: a first processing section for performing thermal processing for the substrate; a second processing section for performing thermal processing for the substrate; a temperature regulation and transfer section for regulating the temperature of the substrate at a predetermined temperature and transferring the substrate between the first processing section and the second processing section; and a plurality of ascending and descending pins which are ascendable and descendable, for receiving and sending the substrate from/to the first and second main transfer sections through the openings when the pins are raised fully, and receiving and sending the substrate from/to the temperature regulation and transfer section when the pins are lowered fully, and the first processing section, the second processing section, the temperature regulation and transfer section, the ascending and descending pins are disposed linearly.

In the apparatus of the present invention, the processing units are vertically disposed in multiple tiers.

The apparatus of the present invention further comprises a solution supplying section, disposed at a position allowing the delivery of the substrate from/to the first or the second main transfer section, for supplying a predetermined solution to the substrate.

In the apparatus of the present invention, the solution supplying sections are vertically disposed in multiple tiers.

The apparatus of the present invention further comprises an inspection section, disposed at a position allowing the delivery of the substrate from/to the first or the second main transfer section, for inspecting the substrate.

In the apparatus of the present invention, the inspection sections are vertically disposed in multiple tiers.

In the apparatus of the present invention, the inspection section performs microscopic inspection for the substrate.

In the apparatus of the present invention, the processing unit is further disposed on the opposite side to a face facing the processing unit of the first main transfer section.

The apparatus of the present invention further comprises a receiving section for temporarily receiving and holding the substrate before and after processing is further disposed on the opposite side to a face facing the first or the second main transfer section of the processing unit.

The apparatus of the present invention further comprises an inspection section, disposed in the receiving section, for inspecting the substrate.

In the apparatus of the present invention, the inspection section performs macroscopic inspection for the substrate.

A substrate processing apparatus of the present invention comprises: a main transfer section for transferring a substrate; a processing unit, disposed around the main transfer section, at least for performing thermal processing for the substrate; a solution supplying unit, disposed around the main transfer section, for supplying a predetermined solution onto the substrate; and means for controlling atmospheric pressure so that the solution supplying unit has more positive pressure than the processing unit and the main transfer section and so that the main transfer section and the processing unit have almost the same atmospheric pressure.

In the apparatus of the present invention, the main transfer section, the processing unit, and the solution supplying unit are disposed in separate casings, each of the casings has an opening for the delivery of the substrate, and a passage connecting adjacent openings of respective casings is surrounded by a surrounding member.

In the apparatus of the present invention, a small gap is provided between the surrounding member and at least one of the casings.

In the apparatus of the present invention, respectively with respect to the main transfer section, the processing unit, and the solution supplying unit, the atmospheric pressure controlling means comprises: a gas supplying section for supplying a gas; a gas exhausting section for exhausting the gas; and an atmospheric pressure measuring section for measuring atmospheric pressure, and controls at least either one of the amount of gas to be supplied by the gas supplying section or the amount of gas to be exhausted by the gas exhausting section based on the measured atmospheric pressure.

In the apparatus of the present invention, the processing units are vertically disposed in multiple tiers, and each of the processing units has the gas supplying section, the gas exhausting section, and the atmospheric pressure measuring section.

In the apparatus of the present invention, at least one of the casings of the main transfer section, the processing unit, and the solution supplying unit is provided with a door capable of opening and closing used for inner maintenance, and the atmospheric pressure controlling means controls atmospheric pressure so that the atmospheric pressure in the casing increases when the door is opened.

The apparatus of the present invention further comprises an outer casing wholly surrounding the casings of the main transfer section, the processing unit, and the solution supplying unit and including a panel capable of opening and closing used for inside maintenance, and the atmospheric pressure controlling means controls atmospheric pressure so that the atmospheric pressure in the outer casing increases when the panel is opened.

In the apparatus of the present invention, a gas supplying section which operates only when the door or the panel is opened is further provided in the casing or the outer casing.

A substrate processing apparatus of the present invention comprises: a main transfer section for transferring a substrate; a solution supplying unit, disposed around the main transfer section, for supplying a predetermined solution onto the substrate; a processing unit, disposed around the main transfer section; and unit temperature regulating means for performing temperature regulation or humidity control in the main transfer section, the solution supplying unit, and the processing unit separately, and the processing unit comprises: a temperature regulating section, disposed to adjoin the main transfer section, for regulating the temperature of the substrate at a predetermined temperature; and a processing section, disposed so that the temperature regulating section is positioned between the main transfer section and the processing section itself, for performing thermal processing for the substrate.

In the apparatus of the present invention, the processing section is covered with a temperature regulating mechanism.

In the apparatus of the present invention, a heat shielding plate capable of opening and closing is disposed between the temperature regulating section and the processing section.

In the apparatus of the present invention, the processing units are vertically disposed in multiple tiers, and the unit temperature regulating means performs temperature regulation or humidity control for the processing units separately.

In the apparatus of the present invention, the solution supplying units are vertically disposed in multiple tiers, and the unit temperature regulating means performs temperature regulation or humidity control for the solution supplying units separately.

The apparatus of the present invention further comprises a solution supplying mechanism for supplying the solution to the solution supplying unit, and the unit temperature regulating means performs temperature regulation or humidity control also for the solution supplying mechanism.

In the apparatus of the present invention, the solution supplying mechanism is disposed under the solution supplying unit.

In the apparatus of the present invention, the solution supplying unit is allowed to be replaced with a solution supplying mechanism for supplying the solution to the solution supplying unit.

A substrate processing apparatus of the present invention comprises: a processing unit group in which processing units each having a processing section for performing thermal processing for a substrate and a temperature regulating section for regulating the temperature of the substrate at a predetermined temperature are vertically disposed in multiple tiers; a first main transfer device which is vertical transfer-type, disposed on one side of the processing unit group and allowed to get access to each of the processing units; a first solution supplying unit, disposed around the first main transfer device, for supplying a predetermined solution onto the substrate; a second main transfer device which is a vertical transfer-type, disposed on the other side of the processing unit group and allowed to get access to each of the processing units and to move in a predetermined plane direction; and a plurality of second solution supplying units, disposed along the direction of plane movement of the second main transfer device, each for supplying a predetermined solution onto the substrate.

In the apparatus of the present invention, the first and second solution supplying units are vertically disposed in multiple tiers.

A substrate processing apparatus of the present invention comprises: a substrate transfer device for transferring a substrate; and processing units disposed on both sides and at the front of the substrate transfer device, the processing units at least on one side are vertically disposed in multiple tiers, and the substrate transfer device is a vertical transfer type capable of receiving and sending the substrate from/to each of the units, in which a supporting member for vertically supporting the substrate transfer device is attached on the side of the processing unit disposed at the front.

A substrate processing apparatus of the present invention, comprises: a first processing unit having a first and second openings for the delivery of a substrate on both sides; a first and second transfer devices, disposed to face the respective openings of the first processing unit, for carrying the substrate into/out of the first processing unit through the respective openings; a first and second shutter members for opening and closing the respective openings; and means for controlling the opening and closing of the shutter members so that the second opening is closed when the first opening is open.

In the apparatus of the present invention, the first processing unit comprises: a thermal processing section for performing thermal processing for the substrate; and a temperature regulating section for regulating the temperature of the substrate at a predetermined temperature.

In the apparatus of the present invention, the first and second transfer devices are each surrounded by a surrounding member and practically blocked off from the outside.

A substrate processing apparatus of the present invention comprises: a transfer device for delivering a substrate; a first and second processing units disposed to adjoin the transfer device, each having a first and second openings for the delivery of the substrate from/to the transfer device on both sides; a first and second shutter members for opening and closing the respective openings; and means for controlling the opening and closing of the shutter members so that the second opening is closed when the first opening is open.

In the apparatus of the present invention, the first processing unit is a unit for regulating the temperature of the substrate or heating the substrate, and the second processing unit is a unit for supplying a predetermined solution to the substrate.

In the apparatus of the present invention, the first and second transfer devices are each surrounded by a surrounding member and practically blocked off from the outside.

A substrate processing apparatus of the present invention comprises: a transfer device for delivering a substrate; a first and second processing units disposed to adjoin the transfer device, each having a first and second openings for the delivery of the substrate from/to the transfer device on both sides; a first and second shutter members for opening and closing the respective openings; and means for controlling the opening and closing of the shutter members so that the second opening is closed when the first opening is open.

A substrate processing apparatus of the present invention comprises: a main transfer device for transferring a substrate; a first processing unit, disposed to adjoin the front face side of the main transfer device, for receiving and sending the substrate from/to the main transfer device and supplying a predetermined solution to the substrate; and a second processing unit, disposed to adjoin one side face of the main transfer device, for receiving and sending the substrate from/to the main transfer device and having a temperature regulating section for regulating the temperature of the substrate at a predetermined temperature and a heating section for performing heat processing for the substrate, and the temperature regulating section of the second processing unit is disposed to adjoin the main transfer device, and the heating section is disposed to adjoin the temperature regulating section and to protrude to the back side of the main transfer device.

A substrate processing method of the present invention comprises the steps of: subjecting a substrate to thermal processing in a processing section; and delivering the substrate subjected to the thermal processing to a main transfer section for transferring the substrate while regulating the temperature of the substrate at a predetermined temperature by a temperature regulation and transfer section.

The method of the present invention further comprises the steps of: delivering the substrate from the main transfer section to the temperature regulation and transfer section; and transferring the substrate to the processing section while regulating the temperature of the substrate at a predetermined temperature by the temperature regulation and transfer section.

A substrate processing method of the present invention comprises the steps of: delivering a substrate from a main transfer section for transferring the substrate to a temperature regulation and transfer section; transferring the substrate to a processing section while regulating the temperature of the substrate at a predetermined temperature by the temperature regulation and transfer section; and subjecting the transferred substrate to thermal processing in the processing section.

The method of the present invention further comprises the step of delivering the substrate from/to the main transfer section to/from the temperature regulation and transfer section via a plurality of ascending and descending pins which are ascendable and descendable, for receiving and sending the substrate from/to the main transfer section when the pins are raised fully, and receiving and sending the substrate from/to the temperature regulation and transfer section when the pins are lowered fully.

In the present invention, the substrate is delivered from the processing section to the main transfer section via the temperature regulation and transfer section, and thus the temperature of the substrate is regulated to a certain extent at this stage. Accordingly, when the substrate is then delivered from the main transfer section to the temperature regulating section, the temperature regulation time in the temperature regulating section is shortened. As a result, the time required for temperature regulation processing of the substrate can be practically reduced.

In the present invention, while being transferred to the processing section for performing thermal processing via the temperature regulation and transfer section, the substrate is subjected to temperature regulation processing in the temperature regulation and transfer section, whereby the temperature of the substrate is regulated at a constant temperature, and thus the substrate with the constant temperature is always carried into the processing section for performing thermal processing. Meanwhile, also while being transferred from the processing section to the main transfer section via the temperature regulation and transfer section, the substrate is subjected to temperature regulation processing in the temperature regulation and transfer section, whereby the temperature of the substrate is regulated at a constant temperature, and thus the substrate with the constant temperature is always carried into the temperature regulating section when the substrate is then delivered from the main transfer section to the temperature regulating section. Hence, thermal processing and temperature regulation processing of the substrate can be performed more precisely.

In the present invention, a casing surrounding the processing section and the temperature regulation and transfer section and having an opening for the delivery of the substrate from/to the main transfer section to/from the temperature regulation and transfer section is provided, whereby the main transfer section no longer receives a thermal influence from the processing section, and thus the substrate is transferred in the state of a desired temperature by the main transfer section. Consequently, thermal processing and temperature regulation processing of the substrate can be performed more precisely, and moreover, solution supplying processing of the substrate can be performed at a desired temperature.

In the present invention, the first processing section, the second processing section, and the temperature regulation and transfer section are disposed linearly, whereby, for example, thermal processing with different temperatures and temperature regulation processing can be efficiently performed continuously, thereby improving throughput.

In the present invention, since the substrate is delivered from/to the main transfer section by the ascending and descending pins when the pins are raised fully, and delivered from/to the temperature regulation and transfer section while the pins are lowered fully, the substrate can be efficiently delivered from/to the main transfer section to/from the temperature regulation and transfer section, making good use of space.

In the present invention, an outflow and inflow of particles and mutual thermal interference between the thermal processing system units and the main transfer section can be held to a minimum by providing the shutter mechanism for opening and closing the opening.

In the present invention, the solution supplying section for supplying a predetermined solution to the substrate is further provided, and the main transfer section receives and sends the substrate from/to the solution supplying section, whereby at least the main transfer section and the temperature regulation and transfer section are positioned between the processing section for performing thermal processing for the substrate and the solution supplying section, which can hold the thermal influence of the processing section on the solution supplying section to a great extent.

In the present invention, the main transfer section has a vertical transfer mechanism for vertically moving the arm, the forward and backward movement driving mechanism, and the rotation driving mechanism integrally, thereby reducing inertia in the direction of rotation and reducing electric power consumption.

In the present invention, an inspection section, disposed at a position allowing the delivery of the substrate from/to the first or the second main transfer section, for inspecting the substrate is further provided, which makes it possible to inspect the substrate efficiently in substrate processing steps.

In the present invention, atmospheric pressure is controlled so that the solution supplying unit has more positive pressure than the processing unit and the main transfer section and so that the main transfer section and the processing unit have almost the same atmospheric pressure, which eliminates the entry of particles and the like into the solution supplying unit, thereby decreasing defects caused by particles and the like in the solution supplying unit.

The pressure control can be efficiently and precisely performed specially by providing structure in which the main transfer section, the processing unit, and the solution supplying unit are disposed in separate casings, each of the casings has an opening for the delivery of the substrate, and in which a passage connecting adjacent openings of respective casings is surrounded by a surrounding member.

A small gap is specially provided between the surrounding member and at least one of the casings, whereby the installation of the unit and the like can be performed efficiently.

Respectively with respect to the main transfer section, the processing unit, and the solution supplying unit, the atmospheric pressure controlling means comprises the gas supplying section for supplying a gas, the gas exhausting section for exhausting the gas, and the atmospheric pressure measuring section for measuring atmospheric pressure, and controls at least either one of the amount of gas to be supplied by the gas supplying section or the amount of gas to be exhausted by the gas exhausting section based on the measured atmospheric pressure, which enables precise atmospheric pressure control in each unit.

In the present invention, at least one of the casings of the main transfer section, the processing unit, and the solution supplying unit is provided with a door capable of opening and closing used for inside maintenance, and the atmospheric pressure controlling means controls atmospheric pressure so that the atmospheric pressure in the casing increases when the door is opened. Alternatively, the outer casing wholly surrounding the casings of the main transfer section, the processing unit, and the solution supplying unit and including a panel capable of opening and closing used for inside maintenance, and the atmospheric pressure controlling means controls atmospheric pressure so that the atmospheric pressure in the outer casing increases when the panel is opened. By the aforesaid structure, the entry of particles and the like into the apparatus at the time of maintenance can be prevented.

In the present invention, the temperature regulating section for regulating the temperature of the substrate at a predetermined temperature is disposed to adjoin the main transfer section, the processing section is disposed so that the temperature regulating section is positioned between the main transfer section and the processing section itself, and temperature regulation or humidity control of the main transfer section, the solution supplying unit, and the processing unit is performed separately, which enables efficient and precise temperature regulation or humidity control in each unit. Specially by the structure in which the processing section is covered with the temperature regulating mechanism, the thermal influence of the processing solution on other portions can be reduced. Moreover, by placing the heat shielding plate capable of opening and closing between the temperature regulating section and the processing section, the thermal influence of the processing section on the temperature regulating section, and in addition on the transfer section and the solution supplying unit can be reduced.

In the present invention, the unit temperature regulating means performs temperature regulation or humidity control also for the solution supplying mechanism, whereby temperature control of the solution and the like in the solution supplying unit can be performed accurately.

In the present invention, the solution supplying unit is allowed to be replaced with the solution supplying mechanism for supplying the solution to the solution supplying unit, whereby space can be used effectively, and the temperature regulation of the solution supplying section can be utilized, thus permitting efficient temperature control of the solution.

In the present invention, the second main transfer device which is a vertical transfer-type, disposed on the other side of the processing unit group and allowed to get access to each of the processing units and to move in a predetermined plane direction is provided, which eliminates useless space and optimizes foot print.

In present invention, the substrate transfer device is a vertical transfer type capable of receiving and sending the substrate to each of the units, in which the supporting member for vertically supporting the substrate transfer device is attached on the side of the processing unit disposed at the front, and thus the maintenance for the substrate transfer device from the opposite side to the processing unit side can be performed easily.

In the present invention, the opening and closing of the shutter members provided in the respective openings are controlled so that the second opening is closed when the first opening is open, and thus the first processing unit functions as a so-called load lock chamber, and the inflow and outflow of particles and the like between the transfer devices placed on both sides of the first processing unit can be avoided to a great extent.

In the present invention, the opening and closing of the shutter members are controlled so that the second opening is closed when the first opening is open, and thus the inflow and outflow of particles and the like between the first processing unit and the second processing unit can be avoided to a great extent.

In the present invention, the first processing unit for supplying a predetermined solution to the substrate is disposed to adjoin the front face side of the main transfer device, and the temperature regulating section of the second processing unit having the temperature regulating section for regulating the temperature of the substrate at a predetermined temperature and the heating section for performing heat processing for the substrate is disposed to adjoin the main transfer device, and the heating section is disposed to adjoin the temperature regulating section and to protrude to the back side of the main transfer device, whereby the main transfer device and the temperature regulating section function as a heat insulating area positioned between the heating section and the first processing unit, and the thermal influence of the heating section on the first processing unit can be avoided to a great extent.

To attain the aforesaid third object, a substrate processing apparatus of the present invention comprises: a first processing unit group in which first processing units each for supplying a predetermined solution onto a substrate to perform solution processing are stacked in multiple tiers; a second processing unit group in which second processing units, in which a heating section for performing heat processing for the substrate and a temperature regulating section for performing temperature regulation processing for the substrate are disposed adjacent to each other and integrated, are stacked in multiple tiers; and a transfer device for transferring the substrate between the first processing units and the second processing units, and the first processing unit group and the second processing unit group are disposed adjacent to each other so that the temperature regulating section out of the heating section and the temperature regulating section in each of the second processing units is positioned on the first processing unit group side.

In the present invention, the first processing unit group for performing solution processing for the substrate about normal temperature and the second processing unit group having the heating section and the temperature regulation section are disposed so that the temperature regulating section is positioned on the first processing unit side, whereby the thermal influence of the second processing unit group on the first processing unit group can be held to a minimum. As a result, temperature control in the first processing unit group for performing processing for the substrate about normal temperature can be performed precisely.

Furthermore, a clean air supplying section for supplying clean air to the first processing unit group is provided, and the clean air supplying section exhausts gas from the bottom of the first processing unit group, circulates the exhausted gas, and lets the gas of which the temperature is regulated out of the top of the first processing unit group, and further has a passage for letting the gas exhausted from the bottom of the first processing unit group to flow to the top thereof so that an area where the first processing unit group is disposed and an area where the second processing unit group is disposed are separated from each other.

According to the aforesaid structure, the passage functions as heat insulating means between the area where the first processing unit group is disposed and the area where the second processing unit group is disposed. Besides, the gas is circulating in the passage as the heat insulating means, and thus heat is not accumulated in the passage, and the passage functions as the very satisfactory heat insulating means. Therefore, the passage structured as above can prevent the thermal influence of the second processing unit group on the first processing unit group, and temperature control in the first processing unit group for performing processing for the substrate about normal temperature can be performed very precisely.

Moreover, a heat insulating wall is provided so that an area where the first processing unit group is disposed and an area where the second processing unit group is disposed are separated from each other.

According to the aforesaid structure, the heat insulating wall prevents the thermal influence of the second processing unit group on the first processing unit group, whereby temperature control in the first processing unit group for performing processing for the substrate about normal temperature can be performed very precisely.

A substrate processing apparatus of the present invention comprises: a first processing unit group in which first processing units each for supplying a predetermined solution onto a substrate to perform solution processing are stacked in multiple tiers; a processing solution supplying section, disposed adjacent to the first processing unit group, for supplying the predetermined solution to each of the first processing units; a second processing unit group in which second processing units, in which a heating section for performing heat processing for the substrate and a temperature regulating section for performing temperature regulation processing for the substrate are disposed adjacent to each other and integrated, are stacked in multiple tiers; and a transfer device for transferring the substrate between the first processing units and the second processing units, and the processing solution supplying section and the second processing unit group are disposed adjacent to each other so that the temperature regulating section out of the heating section and the temperature regulating section in each of the second processing units is positioned on the processing solution supplying section side.

In the present invention, the processing solution supplying section is disposed between the first processing unit group for performing solution processing for the substrate about normal temperature and the second processing unit group having the heating section and the temperature regulating section, and the temperature regulating section is disposed on the processing solution supplying section side. Namely, the temperature regulation processing unit and the processing solution supplying section are positioned between the first processing unit group and the heating section, whereby the thermal influence of the second processing unit group on the first processing unit group and the processing solution supplying section can be held to a great extent. As a result, temperature control in the first processing unit group for performing processing for the substrate about normal temperature can be performed precisely, and temperature control of the processing solution to be supplied to the first processing unit group can be performed easily.

Moreover, a clean air supplying section for supplying clean air to the first processing unit group is provided, and the clean air supplying section exhausts gas from the bottom of the first processing unit group, circulates the exhausted gas, and lets the gas of which the temperature is regulated out of the top of the first processing unit group, and further has a passage for letting the gas exhausted from the bottom of the first processing unit group to flow to the top thereof so that an area where the processing solution supplying section is disposed and an area where the second processing unit group is disposed are separated from each other.

According to the aforesaid structure, the passage functions as heat insulating means between the area where the processing solution supplying section is disposed and the area where the second processing unit group is disposed. Besides, the gas is circulating in the passage as the heat insulating means, and thus heat is not accumulated in the passage, and the passage functions as the very satisfactory heat insulating means. Therefore, the passage structured as above can prevent the thermal influence of the second processing unit group on the first processing unit group and the processing solution supplying section, temperature control in the first processing unit group for performing processing for the substrate about normal temperature can be performed very precisely, and temperature control of the processing solution can be performed easily.

A heat insulating wall is provided so that an area where the processing solution supplying section is disposed and an area where the second processing unit group is disposed are separated from each other.

According to the aforesaid structure, the heat insulating wall prevents the thermal influence of the second processing unit group on the first processing unit group and the processing solution supplying section, whereby temperature control in the first processing unit group for performing processing for the substrate about normal temperature can be performed very precisely, and temperature control of the processing solution can be performed easily.

A substrate processing apparatus of the present invention comprises: a first processing unit group in which first processing units each for supplying a predetermined solution onto a substrate to perform solution processing are stacked in multiple tiers; a second processing unit group in which second processing units, in which a heating section for performing heat processing for the substrate and a temperature regulating section for performing temperature regulation processing for the substrate are disposed adjacent to each other and integrated, are stacked in multiple tiers; and an exposure unit for performing exposure processing for the substrate which has undergone the solution processing, and the substrate is kept waiting in the temperature regulating section of the second processing unit before being carried into the exposure unit.

In the present invention, the temperature regulating section of the second processing unit can have a function as a waiting section for making the wafer wait before exposure in addition to the function of performing temperature regulation processing, and thus it becomes unnecessary to provide a cassette for holding the substrate before exposure.

These objects and still other objects and advantages of the present invention will become apparent upon reading the following specification when taken in conjunction with the accompanying drawings.

DETAILED DESCRIPTION OF THE PREFERRED EMBODIMENT

Preferred embodiments of the present invention will be explained below with reference to the drawings.

Figure 1:
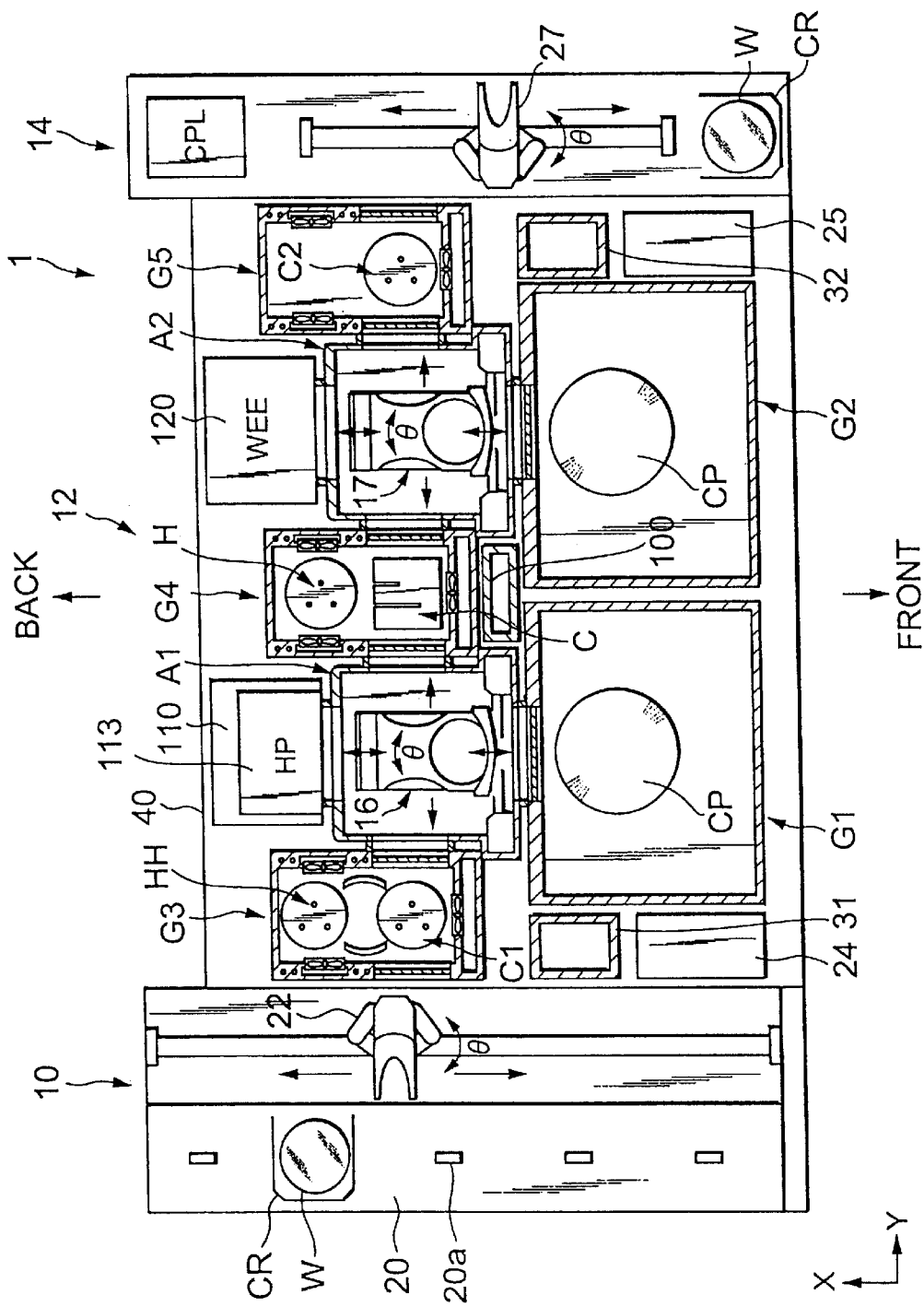
FIG. 1 is a plan view showing the entire structure of a substrate processing apparatus according to a first embodiment of the present invention.
Figure 2:
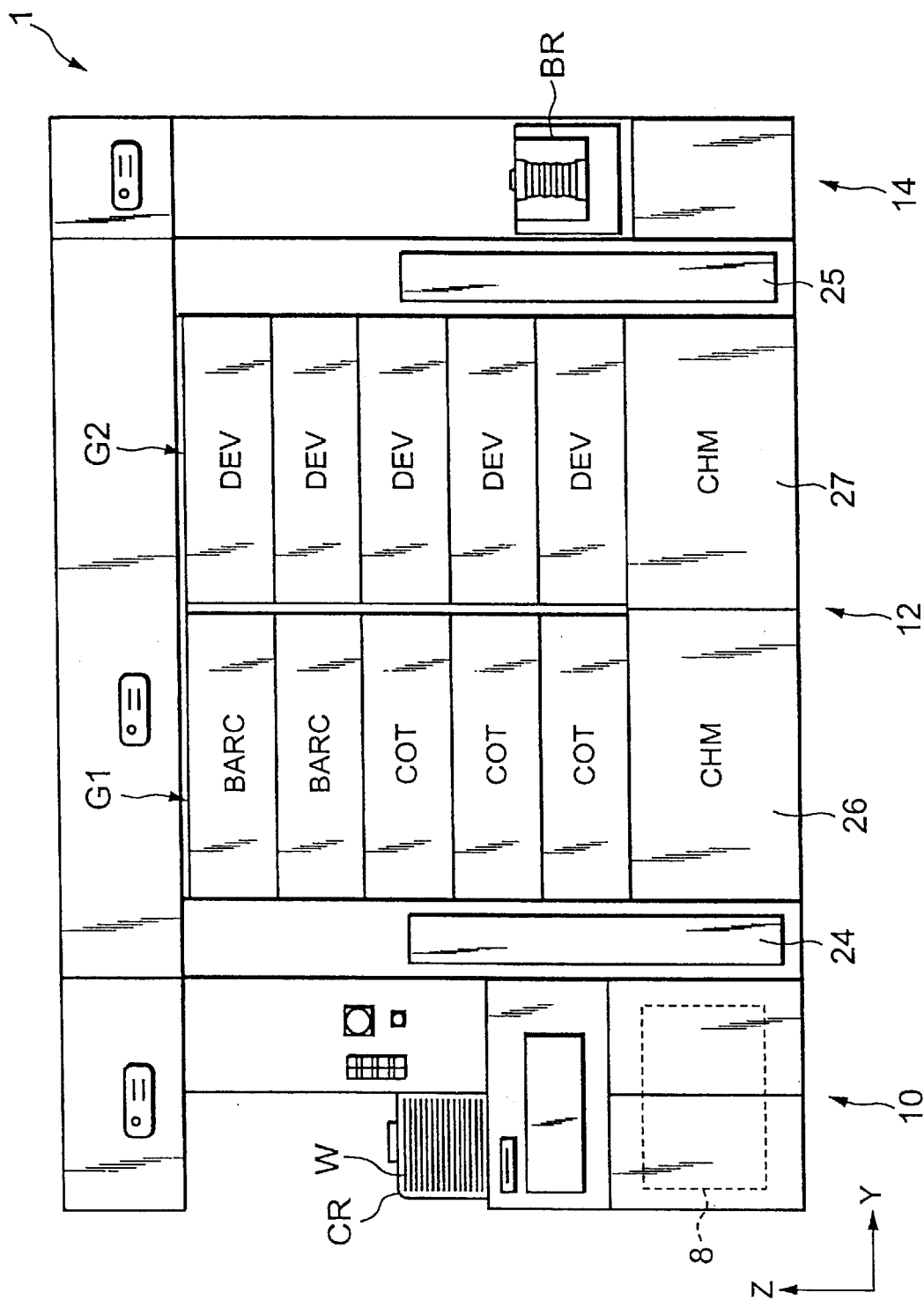
FIG. 2 is a front view showing the entire structure of the substrate processing apparatus.
Figure 3:
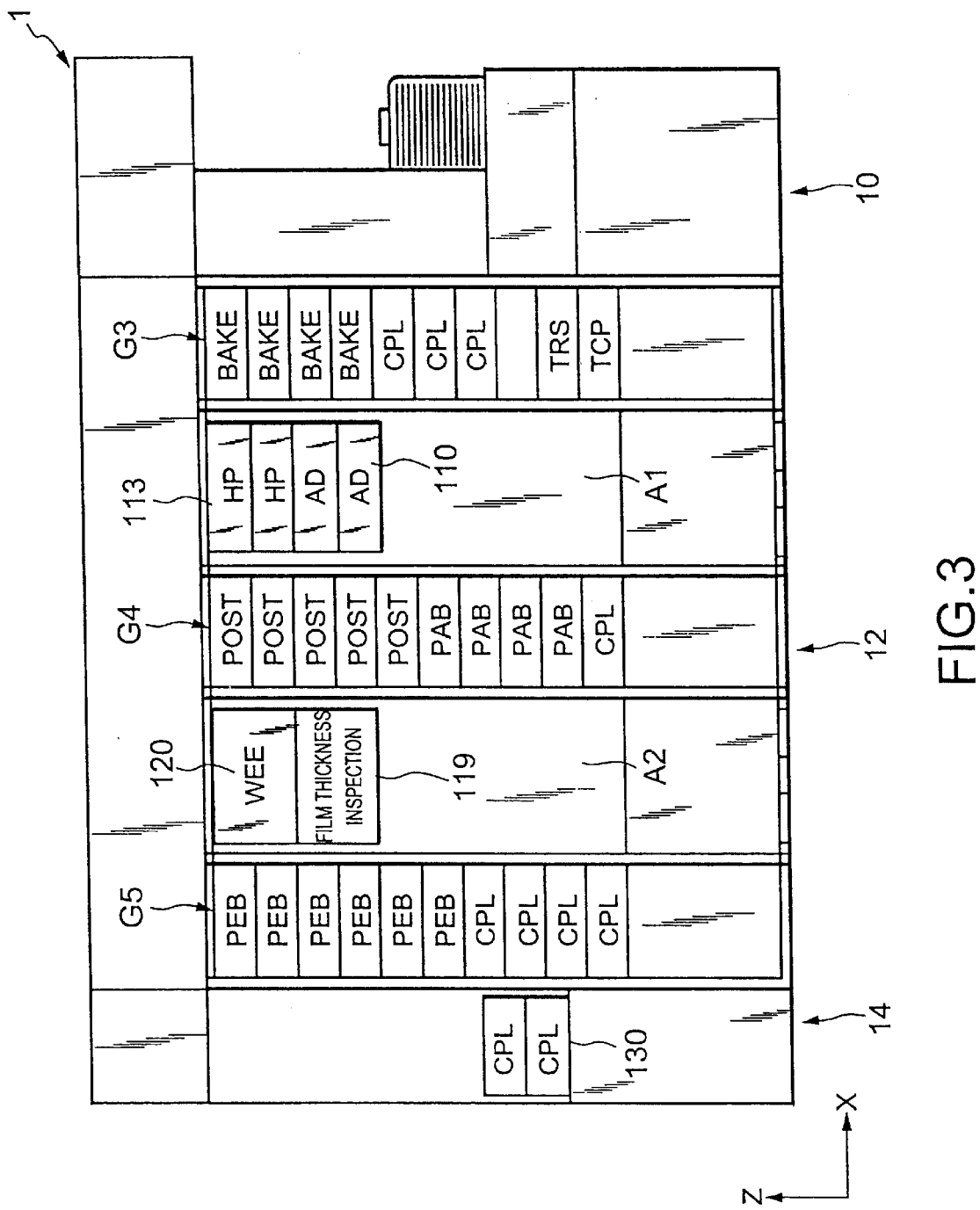
FIG. 3 is a rear view showing the entire structure of the substrate processing apparatus.

FIG. 1 to FIG. 3 are diagrams showing the entire structure of a substrate processing apparatus according to an embodiment of the present invention. FIG. 1 is a plan view, FIG. 2 is a front view, and FIG. 3 is a rear view.

This substrate processing apparatus 1 has structure in which a cassette station 10 as a receiving section for transferring a plurality of, for example, 25 semiconductor wafers W as substrates to be processed per wafer cassette CR, as a unit, from/to the outside into/from the apparatus and carrying the semiconductor wafer W into/out of the wafer cassette CR, a processing station 12 in which various kinds of processing units each for performing predetermined processing for the semiconductor wafers W one by one in coating and developing processing steps are multi-tiered, and an interface section 14 for receiving and sending the semiconductor wafer W from/to an aligner (not illustrated) provided adjacent to the processing station 12 are integrally connected.

In the cassette station 10, a plurality of, for example, 5 wafer cassettes CR are mounted in a line in an X-direction at the positions of projections 20a on a cassette mounting table 20 with respective wafer transfer ports facing the processing station 12 side. A wafer transfer body 22 movable in the direction of arrangement of cassettes (the X-direction) and in the direction of arrangement of the wafers housed in the wafer cassette CR (a Z-direction) selectively gets access to each of the wafer cassettes CR. Moreover, this wafer transfer body 22 is also structured to be able to rotate in a θ-direction so as to get access to thermal processing system units included in a third processing unit section G3 structured in multiple tiers which will be described later as shown in FIG. 3.

As shown in FIG. 1, in the processing station 12, the third processing unit section G3, a fourth processing unit section G4, and a fifth processing unit section G5 are arranged from the cassette station 10 side at the back of the apparatus (the upper side in FIG. 1), and a first main wafer transfer section A1 as a first main transfer section is provided between the third processing unit section G3 and the fourth processing unit section G4. As will be described later, the first main wafer transfer section A1 is placed so that a first main wafer transfer body 16 can selectively get access to a first processing unit section G1, the third processing unit section G3, the fourth processing unit section G4, or the like. A second main wafer transfer section A2 as a second main transfer section is provided between the fourth processing unit section G4 and the fifth processing unit section G5, and the second main wafer transfer section A2 is placed so that a second main wafer transfer body 17 can selectively get access to a second processing unit section G2, the fourth processing unit section G4, the fifth processing unit section G5, or the like.

Moreover, thermal processing units are placed at the back of the first main wafer transfer section A1, and adhesion units (AD) 110 for performing hydrophobic processing or the wafer W and heating units (HP) 113 for heating the wafer W, for example, are mounted as shown in FIG. 3. To facilitate the maintenance of the interior of the system, for example, the maintenance of the main wafer transfer section A1, these adhesion units (AD) 110 and the heating unit (HP) 113 has drawer-type structure so as to be removable. The adhesion unit (AD) may be structured to further include a mechanism for regulating the temperature of the wafer W. A peripheral aligner (WEE) 120 for selectively exposing only an edge portion of the wafer W and an inspection device 119 as an inspection section for inspecting the thickness of a resist film applied on the wafer W are placed at the back of the second main wafer transfer section A2. The peripheral aligner (WEE) 120 and the inspection device 119 may be disposed in multiple tiers. In some cases, thermal processing units are arranged at the back of the second main wafer transfer section A2 similarly to the back of the first main wafer transfer section A1.

As shown in FIG. 3, in the third processing unit section G3, oven-type processing units each for performing predetermined processing while the wafer W is placed on a mounting table, for example, high-temperature thermal processing units (BAKE) each being a first thermal processing unit for performing predetermined heat processing for the wafer W, high-precision temperature regulating units (CPL) each for performing heat processing for the wafer W under precise temperature control, a transition unit (TRS) being a delivery section of the wafer W from the wafer transfer body 22 to the main wafer transfer body 16, and a temperature regulating unit (TCP) are, for example, ten-tiered from the top in order. Incidentally, a unit at the third tier from the bottom is provided as a spare space. Also, in the fourth processing unit section G4, for example, post-baking units (POST) each as a fourth thermal processing unit, pre-baking units (PAB) each being a second thermal processing unit for performing heat processing for the wafer W which has undergone resist coating, and a high-precision temperature regulating unit (CPL) are, for example, ten-tiered from the top in order. Furthermore, in the fifth processing unit section G5, for example, post-exposure baking units (PEB) each as a third thermal processing unit for performing heat processing for the wafer W which has undergone exposure, and high-precision temperature regulating units (CPL) are, for example, ten tiered from the top in order.

In FIG. 1, the first processing unit section G1 and the second processing unit section G2 are disposed side by side in the Y-direction at the front of the apparatus (the lower side in FIG. 1) in the processing station 12. Solution temperature regulating pumps 24 and 25 used for regulating the temperature of a processing solution to be supplied to the processing unit sections G1 and G2 are provided respectively between the first processing unit section G1 and the cassette station 10, and between the second processing unit section G2 and the interface section 14. Moreover, ducts 31 and 32 for supplying clean air from an air regulator which is not illustrated but provided outside this processing apparatus into each of the processing unit sections G1 to G5.

As shown in FIG. 2, in the first processing unit section G1, five spinner-type processing units as solution supplying units each for performing predetermined processing while the wafer W is placed on a spin chuck in a cup CP, for example, three resist coating units (COT) and two bottom coating units (BARC) each for forming an antireflection film in order to prevent reflection of light at the time of exposure are five-tiered from the bottom in order. Also, in the second processing unit section G2, five spinner-type processing units, for example, developing units (DEV) are five-tiered from the bottom in order. Since the drainage of a resist solution is troublesome in terms of both mechanism and maintenance in the resist coating unit (COT), it is desirable to place the resist coating unit at the lower tier, but it is possible to place it at the upper tier as necessary.

The aforesaid first to fifth processing unit sections G1 to G5, the adhesion unit (AD) 110, the heating unit (HP) 113, the peripheral aligner (WEE) 120, the inspection device 119 can be removed for maintenance, and in addition, a panel 40 (See FIG. 1) at the back of the processing station 12 is attached to be removable or to be able to open and close.

At the lowest tiers of the first and second processing unit sections G1 and G2, chemical chambers (CHM) 26 and 27 as solution supplying mechanisms for supplying the aforesaid processing solution to the processing unit sections G1 and G2 are provided respectively.

Incidentally, an integrated control section 8 for controlling the whole system of the substrate processing apparatus 1 is provided at the lower portion of the cassette station 10.

A fixed type buffer cassette BR is disposed at the front of the interface section 14, and a wafer transfer body 27 is provided at the center thereof. The wafer transfer body 27 moves in the X- and the Z-direction to get access to the cassette BR. The wafer transfer body 27 is also structured to be rotatable in the θ-direction so as to get access to the fifth processing unit section G5. Furthermore, as shown in FIG. 1, a plurality of high-precision temperature regulating units (CPL) are positioned at the back of the interface section 14, and, for example, they are vertically two-tiered. The wafer transfer body 27 can also get access to these temperature regulating units (CPL).

Next, the structure of the first main wafer transfer section A1 as the main transfer section will be explained with reference to FIG. 4 to FIG. 10. Incidentally, the second main wafer transfer section A2 is the same as the first main wafer transfer section A1, and thus the explanation thereof is omitted.

Figure 4:
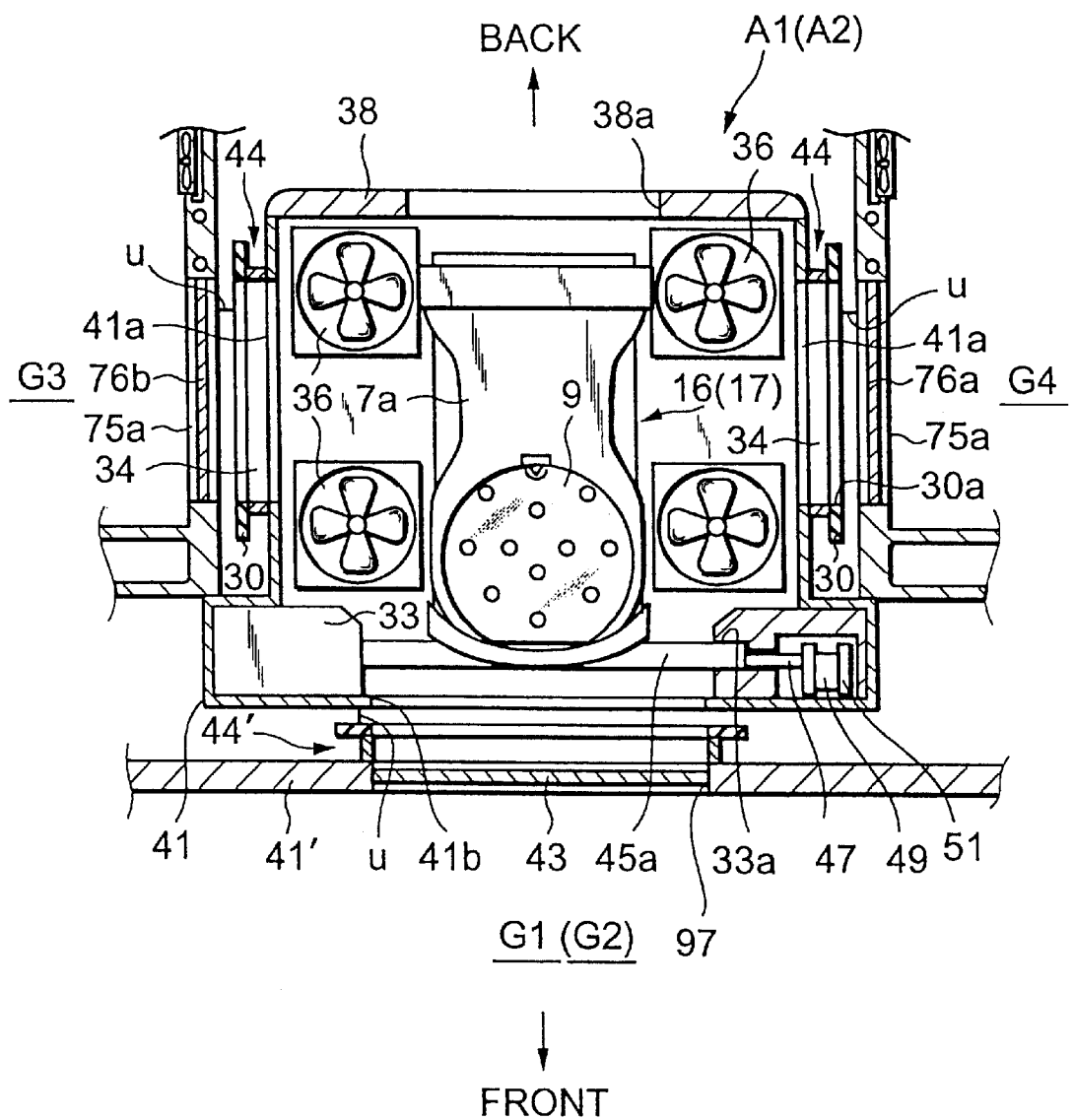
FIG. 4 is a sectional view of a main wafer transfer section according to the first embodiment of the present invention.
Figure 5:
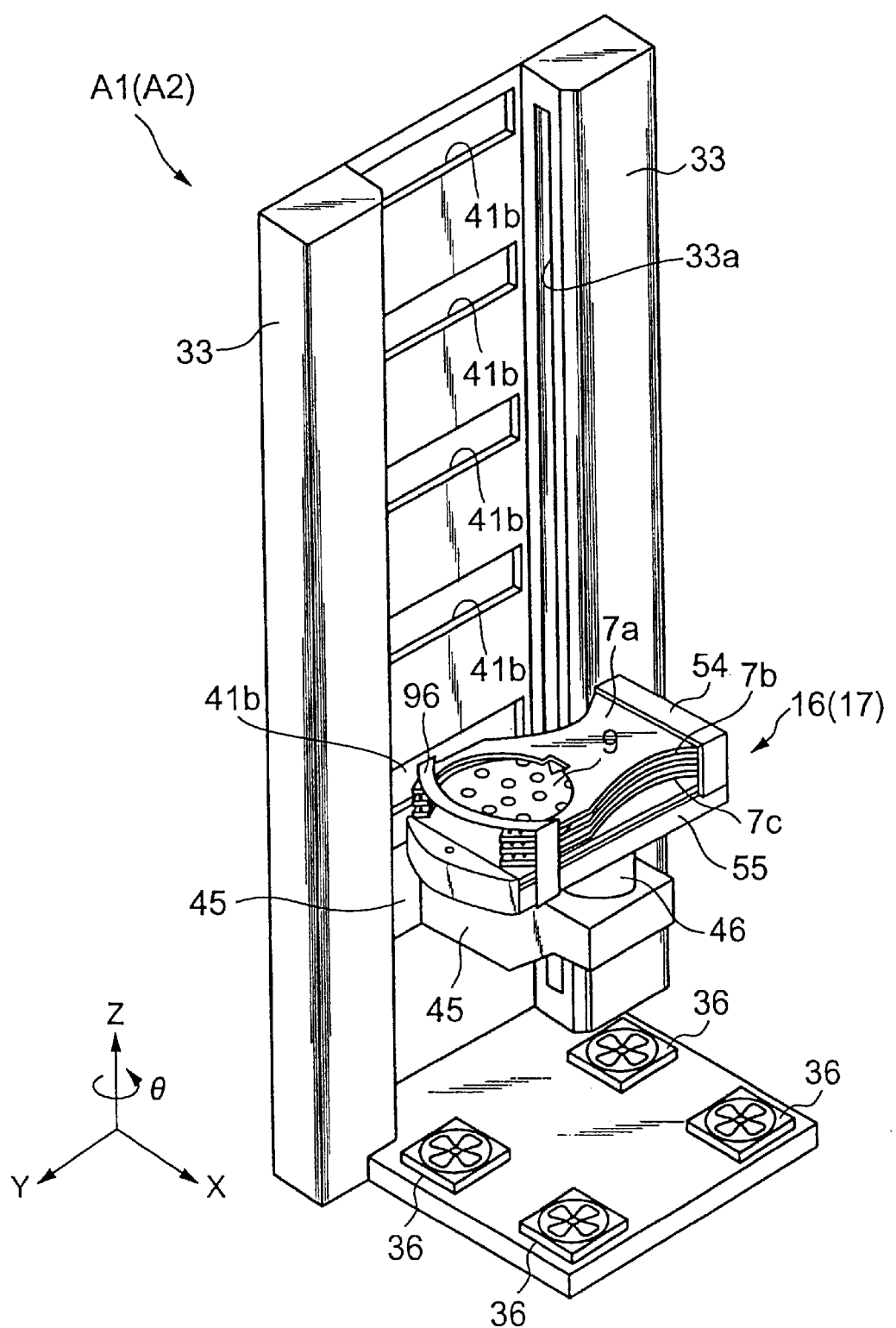
FIG. 5 is a perspective view showing a principal portion of the main wafer transfer section.
Figure 6:
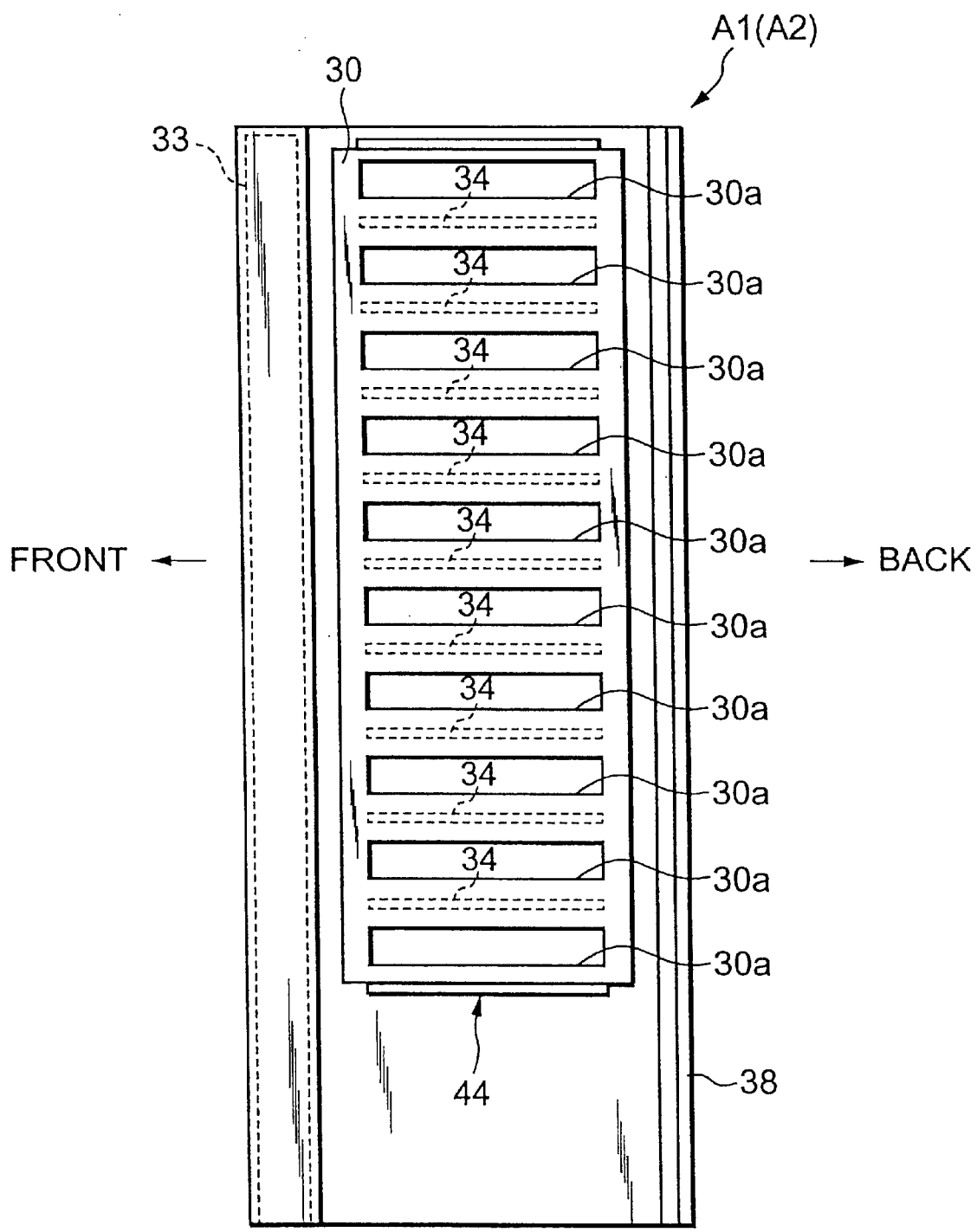
FIG. 6 is a side view of the main wafer transfer section.

In FIG. 4, the main wafer transfer section A1 is surrounded by a casing 41 and a door 38 attached to be able to open and close on the back side of the casing 41, and the illustration of the casing 41 and the door 38 are omitted in FIG. 5 for making the explanation clearly understandable. A window 38a is formed in the door 38 so that access to the adhesion unit (AD) 110, or access to the peripheral aligner 120 and the inspection device 119 in the case of the second main wafer transfer section A2 can be obtained. Windows 41b and 41a are provided respectively at the front face and each side face in the casing 41 so that access to the outside can be obtained. The front windows 41b are provided at five positions so that the wafer W is delivered from/to the first processing unit section G1 with five tiers (See FIG. 5), whereas the side windows 41a are provided at ten positions so that wafer W is delivered from/to the third or the fourth processing unit section G3 or G4 with ten tiers as shown in FIG. 6. It is possible to increase or decrease the number of the windows as required. Attached at each of the side faces of the casing 41 is a surrounding member 44 for connecting the casing 41 and the third or the fourth processing unit section G3 or G4 with a small gap u between the casing 41 and the processing unit section G3 or G4. The gap u has a distance capable of preventing the occurrence and entry of particles, for example, a distance of 0.5 mm. An impact absorbent packing 30 is provided on each of the Processing unit sections G3 and G4 sides of the surrounding members 44, and as shown in FIG. 6, corresponding windows 30a are also formed in the packing 30. In the surrounding member, partition plates 34 are provided to separate respective windows 30a.

In FIG. 4, a surrounding member 44' having the same structure as the surrounding member 44 is attached at a position corresponding to five openings 97 provided in a casing 41' on the first or the second processing section G1 or G2 side with a small gap u (for example, 0.5 mm) from the main wafer transfer section A1 (A2).

At the bottom of the first main wafer transfer section A1, four fans 36 for controlling the inside pressure, temperature, and humidity are placed. The operation of these fans 36 is controlled by the integrated control section 8 (See FIG. 2).

Figure 7:
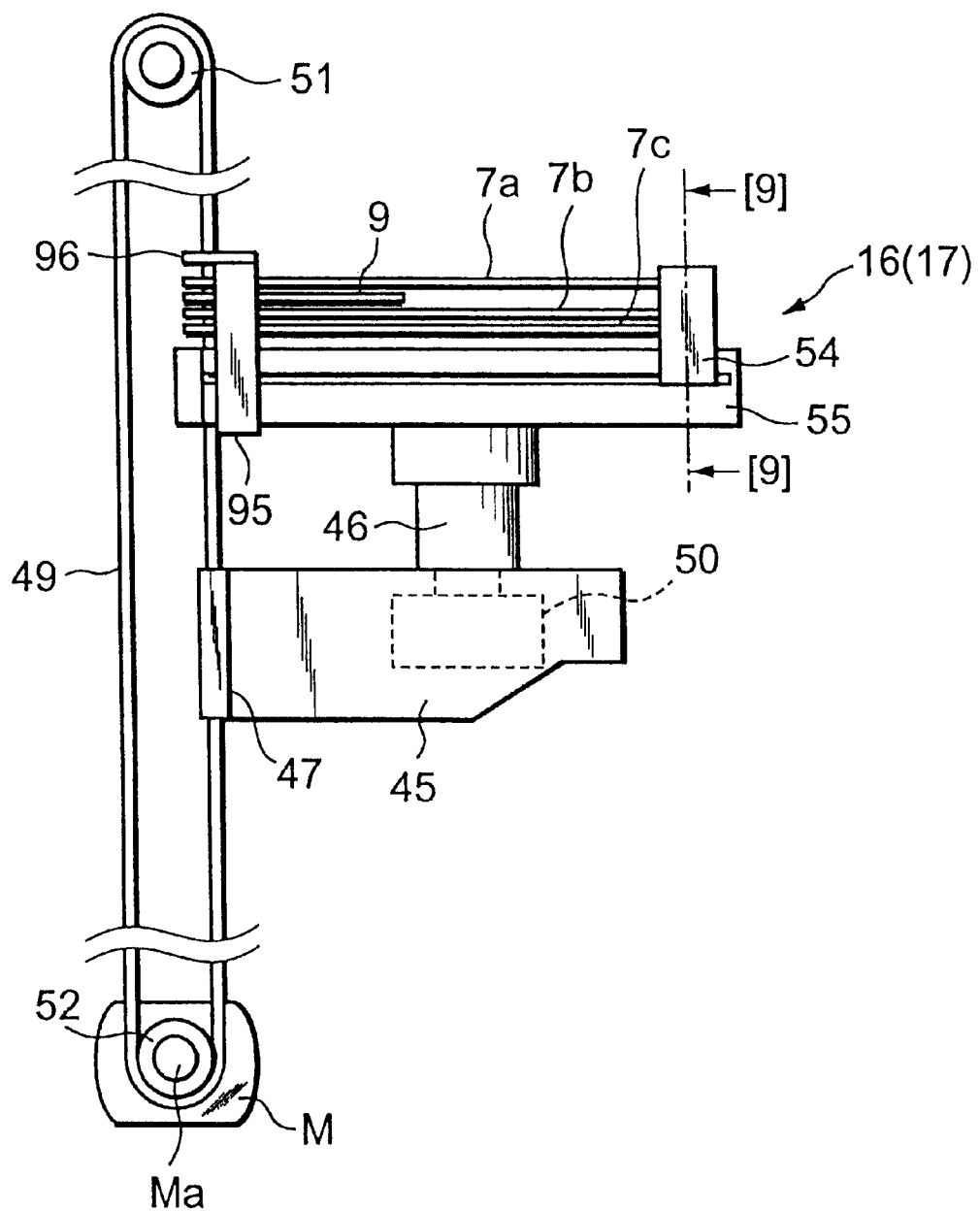
FIG. 7 is a side view showing a drive mechanism of a main wafer transfer body in the main wafer transfer section.

As shown in FIG. 4 and FIG. 5, vertical poles 33 are placed on each of the first or the second processing unit section G1 and G2 inside the casing 44. Inside one of the poles 33, a pair of pulleys 51 and 52 are attached respectively at the upper end portion and the lower end portion as shown in FIG. 7, and an endless belt 49 being a vertical drive means is stretched between the pulleys 51 and 52. A support portion 45 of the first main wafer transfer body 16 is connected to the vertical drive belt 49 with a belt clamp 47 between them. Furthermore, as shown in FIG. 4 and FIG. 5, a flange portion 45a is provided at the support portion 45, and the flange portion 45a is slidably engaged with sleeves 33a formed in both the poles 33. The lower pulley 52 is connected to a rotating shaft Ma of a drive motor M fixed to the bottom of the pole 33 to compose a drive pulley. The aforesaid vertical belt drive mechanism and vertical slide mechanism enables the main wafer transfer body 16 to ascend and descend in a vertical direction by driving force of the drive motor M.

The aforesaid ascending and descending mechanism is placed similarly in the other pole 33, but the drive motor M can be omitted in the other pole 33.

The main wafer transfer body 16 contains a motor 50 in the support portion 45. A rotating rod 46 which is rotatable in the θ-direction is connected to the motor 50 (See FIG. 5), and an arm base end portion 55 being a base end of three arms 7a, 7b, and 7c is fixed to the upper end of the rotating rod 46.

Figure 8:
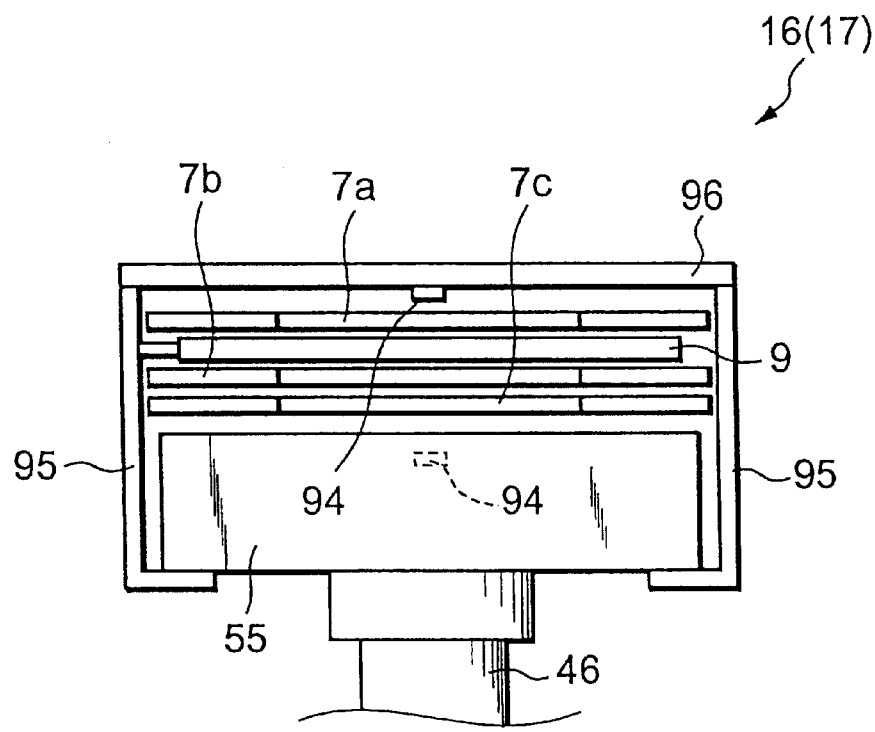
FIG. 8 is a front view of the main wafer transfer body.

FIG. 8 is a front view of the main wafer transfer body 16 in the state of FIG. 4. Vertical members 95 are attached on both sides of a forward end portion of the arm base end portion 55, and attached to the vertical members 95 are a shielding plate 9 for blocking off radiation heat from the upper arm 7a and the middle arm 7a between both the arms and an attaching member 96 to be laid between these vertical members 95. A pair of optical sensors 94 are provided at the center of the attaching member 96 and the forward end of the arm base end portion 55, whereby the presence or absence of the wafer W on each arm and the misalignment of the wafer W are confirmed.

Figure 9:
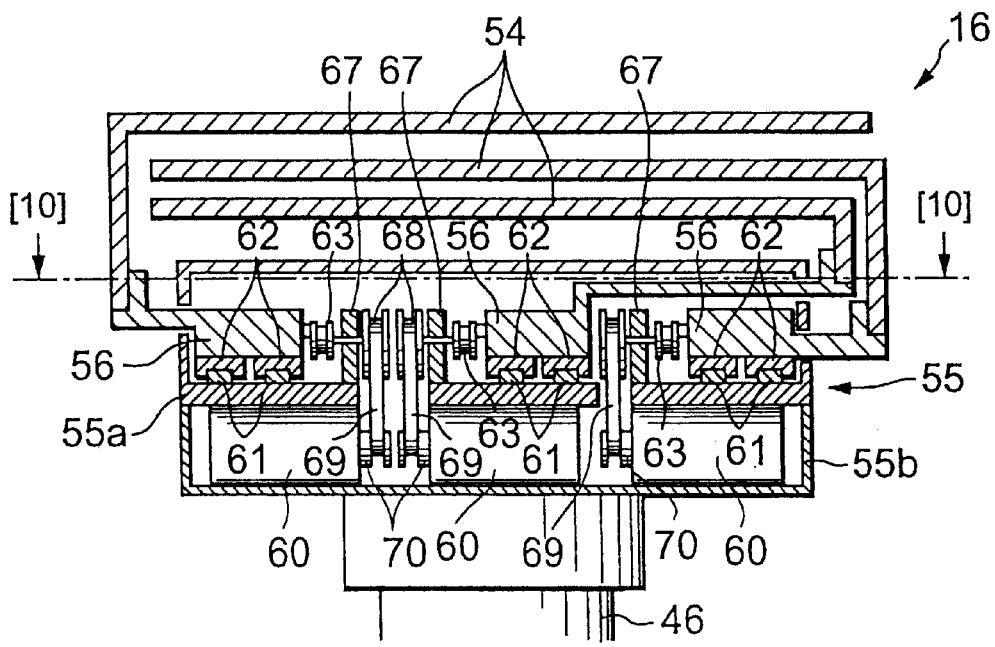
FIG. 9 is a sectional view of the main wafer transfer body.
Figure 10:
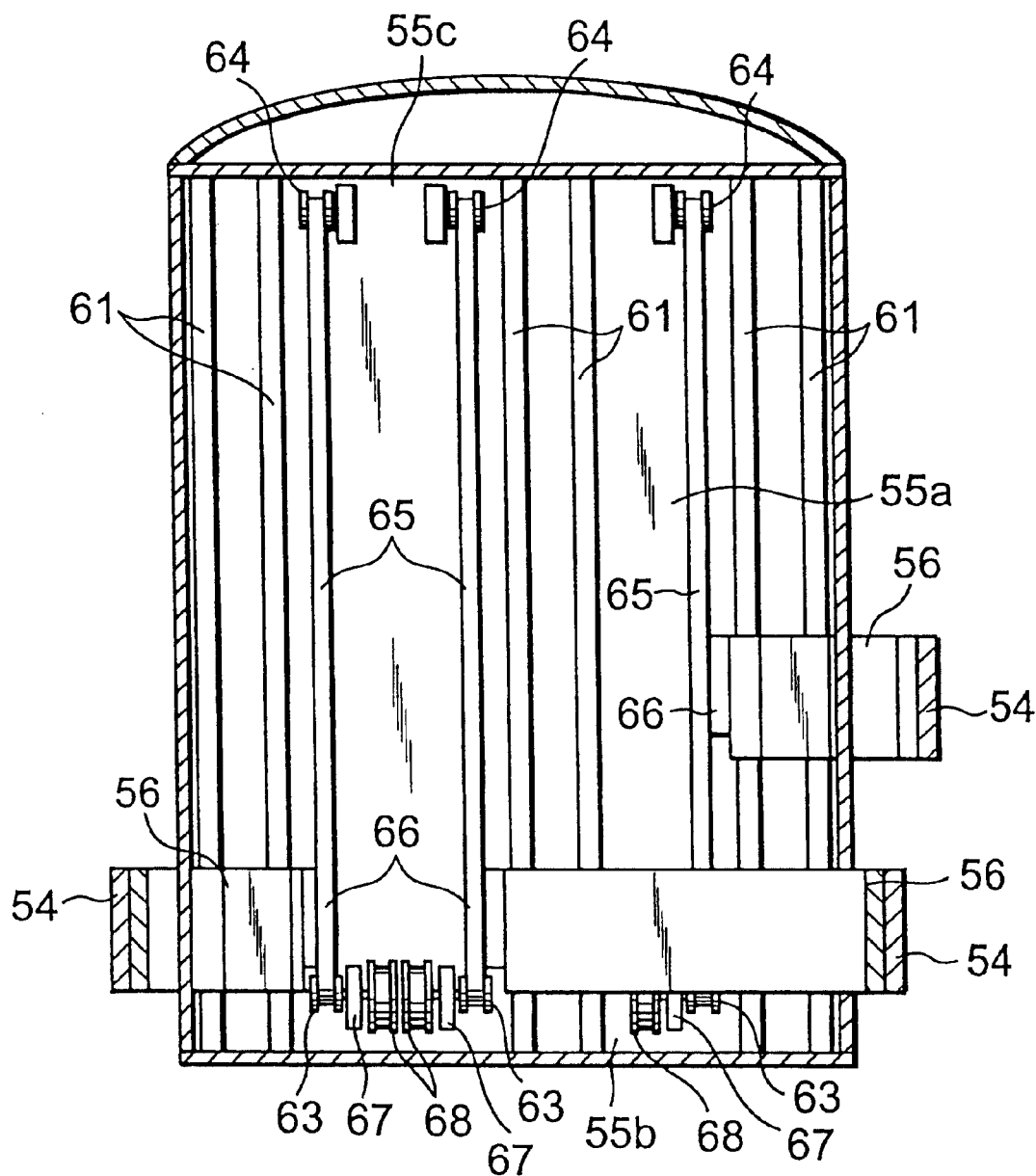
FIG. 10 is a sectional view taken along the line [10]—[10] in FIG. 9.

FIG. 9 is a sectional view showing the structure of the base end portion 55 of the main wafer transfer body 16, and FIG. 10 is a sectional view taken along the line [10]—[10] in FIG. 9. An arm supporting plate 54 is fixed to each of the arm base end portions of the arms 7a to 7c. Each of the arm supporting plates 54 is formed into a sectional L-shape, and an arm carriage 56 movable along rails 61 laid on a base 55a of the base end portion 55 in the longitudinal direction of the arm is fixedly attached to each of the arm supporting plates 54.

Guides 62 slidably engaged with the rails 61 are provided at the lower portion of each of the arm carriages 56. The inner face of the arm carriage 56 is fixed to a drive belt 65 stretched between a pulley 63 placed near an arm original position (a base end portion 55b of the base 55) and a pulley 64 placed near an arm forward movement end position (a forward end portion 55c of the base 55) with a belt clamp 66 between them. The pulleys 63 are coaxially connected to pulleys 68 with bearings 67 respectively, these pulleys 68 are connected to pulleys 70 with drive belts 69 respectively, and the pulleys 70 are fixed to rotating shafts of drive motors 60 respectively.

When the rotating shaft of each of the motors 60 rotates, each of the pulleys 63 rotates via the pulley 70, the drive belt 69, and the pulley 63, each of the drive belts 65 is driven by the rotational drive of each of the pulleys 63, and each of the arm carriages 56 moves on the rails 61 with each of the drive belts 65. The direction of movement is decided by the direction of rotation of each of the motors 60. The motors are naturally driven independently of each other, and the arms 7a to 7c can be moved independently of each other.

The aforesaid structure of the main wafer transfer body 16 allows each of the arms 7a to 7c to rotate in the θ-direction and move in the X-, the Y-, and the Z-direction so as to be able to get access to the processing unit sections G1, G3, and G4 as described above.

Next, with reference to FIG. 11 to FIG. 13, the pre-baking unit (PAB), the post-exposure baking unit (PEB), and the post-baking unit (POST) out of ten-tiered units included in the fourth processing unit section G4 and the fifth processing unit section G5 will be explained. These baking units are different only in processing temperature.

Figure 11:
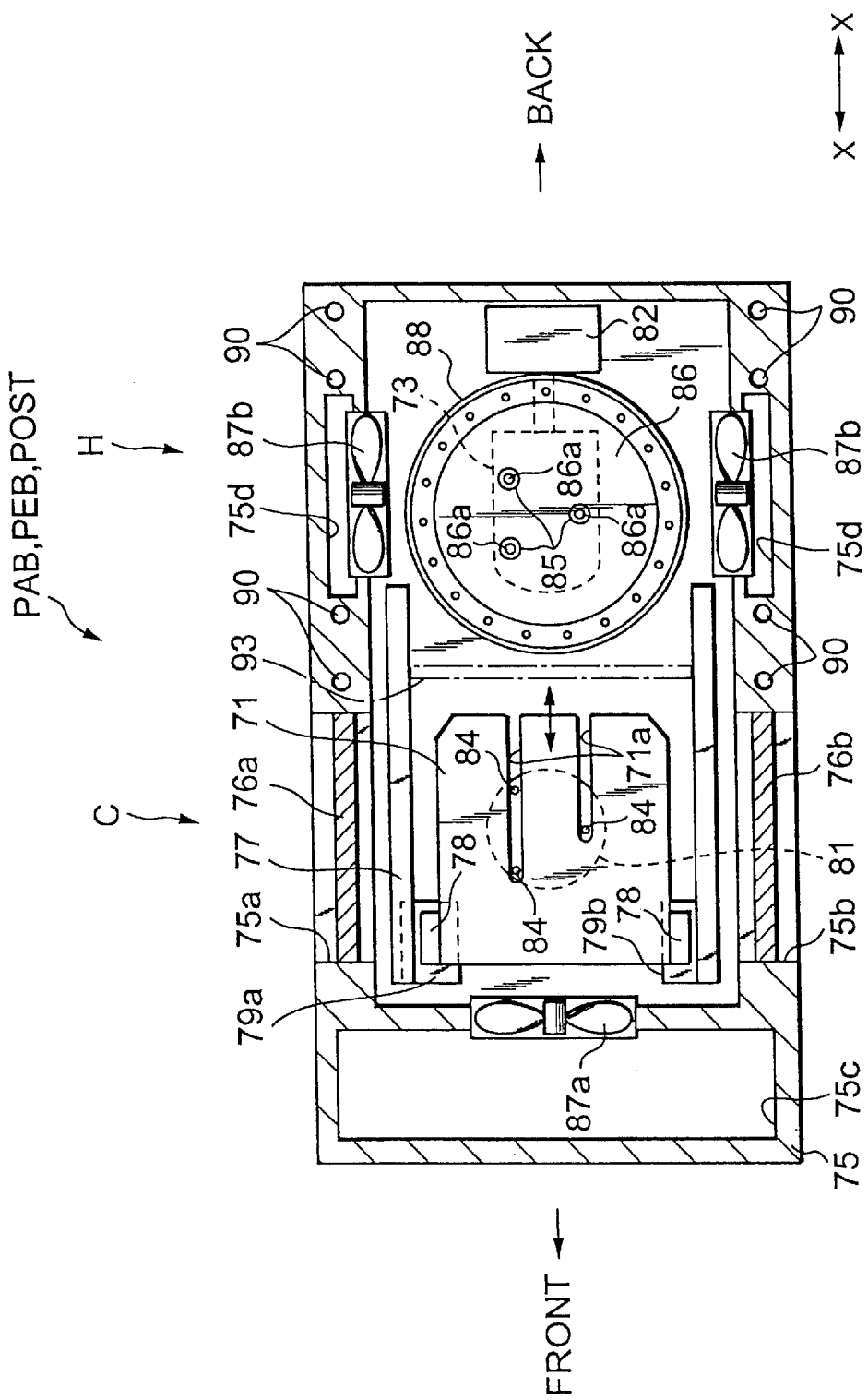
FIG. 11 is a horizontal sectional view of a pre-baking unit (PAB), a post-exposure baking unit (PEB), or an post-baking unit (POST) according to the first embodiment of the present invention.

As shown in FIG. 11, such a thermal processing unit has a thermal processing device H at the back of the apparatus and a temperature regulation and transfer device C at the front thereof in a casing 75. In the thermal processing device H, a hot plate 86 being heated by a heating wire 86b with a proper heat insulating material provided in a cylindrical supporting body 88 is placed. Under the supporting body 88, three pins 85 for delivering the wafer W are placed to be ascendable and descendable by a drive device 82. The three pins 85 are placed while being retracted into through-holes 86a formed in the hot plate 86.

Meanwhile, in the temperature regulation and transfer device C, sliders 79a and 79b movable along two guide rails 77 laid in the X-direction are provided, and a temperature regulation and transfer plate 71 is fixed to the sliders 79a and 79b with connecting members 78 and 78. Under the temperature regulation and transfer plate 71, ascending and descending pins 84 for delivering the wafer W are placed to be ascendable and descendable by a drive device. Slots 71a are formed in the temperature regulation and transfer plate 71 so that the ascending and descending pins 84 embedded thereunder can ascend. As this temperature regulating mechanism, temperature control is performed by regulating the temperature of the wafer W at a predetermined temperature, for example, about 40° C. by using cooling water, for example. The drive device not illustrated, for example, the drive device by means of air, a motor, or the like is provided in one slider 79a, and a sensor not illustrated for recognizing an operation position is provided in the other slider 79b.

An air flow path 75c for controlling atmospheric pressure which will be described later is formed at the front of the casing 75 (on the left side of FIG. 11), and the flow path 75c communicates with the temperature regulation and transfer device C side via a fan 87a.

Further, the flow path 75c leads from the uppermost tier to the lowermost tier in the vertical direction (the Z-direction) although not illustrated. Furthermore, fans 87b are placed at both the side faces of the casing 75 on the thermal processing device H side, and exhaust ports 75d are respectively formed therein and lead from the uppermost tier to the lowermost tier similarly.

Concerning the fourth processing unit section G4, for example, an opening 75a is provided to receive and send the wafer W from/to the first main wafer transfer section A1 in one side face on the temperature regulation and transfer device C side of the casing 75, and an opening 75b is provided to face the window 41a of the second main wafer transfer section A2 at the other side face. Shutters 76a and 76b which can freely open and close are provided in the openings 75a and 75b. The opening and closing operation of the shutters 76a and 76b is performed by a drive section not illustrated under the integrated control section 8.

Figure 13:
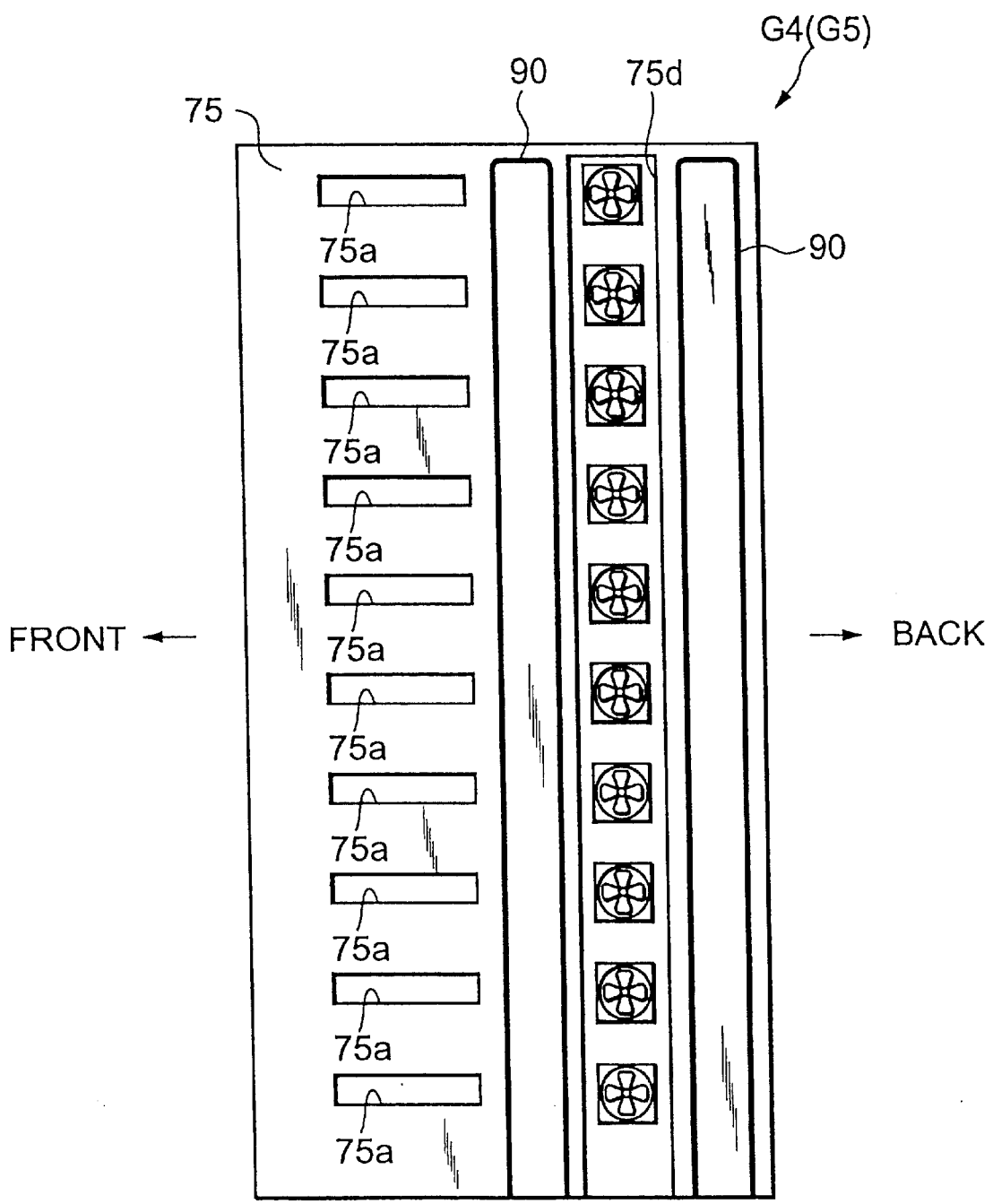
FIG. 13 is a schematic view showing a temperature regulating mechanism of a casing in the thermal processing unit.

FIG. 13 is a side sectional view of the entire fourth processing unit section G4 (the entire fifth processing unit section G5). As illustrated, a temperature regulating pipe 90 for letting cooling water flow in order to inhibit thermal diffusion to the outside of the fourth processing unit section G4 (the fifth processing unit section G5) and inhibit an increase in the temperature of an atmosphere in the apparatus is provided from the uppermost tier to the lowermost tier, and connected to a pump which is not illustrated but provided under the processing unit section G4 (G5) in each side face portion on the thermal processing device H side.

Figure 14:
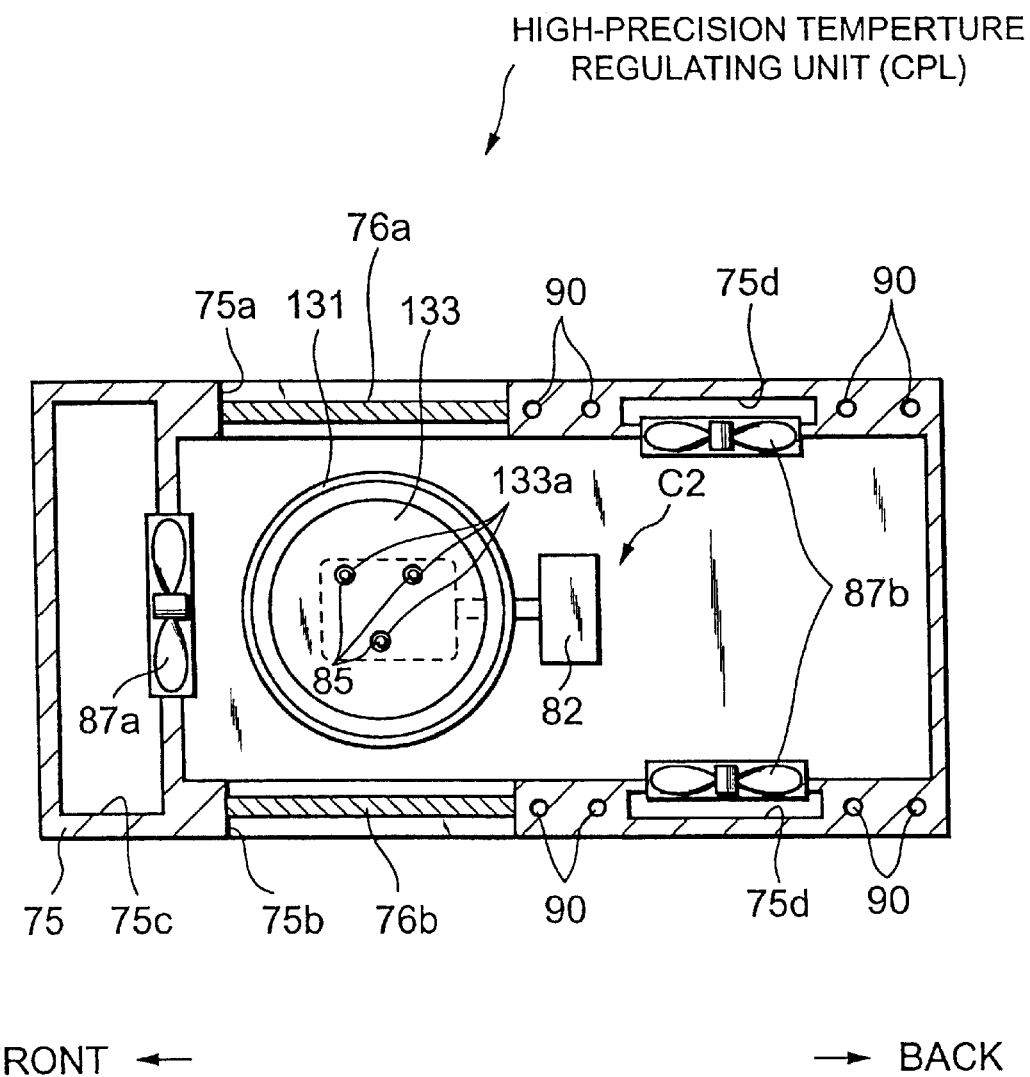
FIG. 14 is a horizontal sectional view of a high-precision temperature regulating unit (CPL)according to the first embodiment of the present invention.

Next, the high-precision temperature regulating unit (CPL) as a temperature regulating section which is included in all the thermal processing system unit sections (the third to fifth processing unit sections G3 to G5) will be explained with reference to FIG. 14. The aforesaid temperature regulation and transfer device C in the pre-baking unit (PAB) or the like is replaced with a high-precision temperature regulating device C2, and the thermal processing device H is eliminated, and hence the same numerals and symbols will be used to designate the same components as those in the pre-baking unit (PAB) or the like, so that the explanation will be omitted.

The high-precision temperature regulating device C2 is provided with a high-precision temperature regulating plate 133 in a cylindrical supporting body 131. In this high-precision temperature regulating plate 133, although not illustrated, Peltier elements, for example, are used, and the temperature of the wafer W is regulated at a predetermined temperature, for example, 23° C. by feedback control, whereby precise temperature control can be performed. Under the supporting body 133, the three pins 85 for delivering the wafer W are placed to be ascendable and descendable by the drive device 82. The three pins 85 are placed while being retracted into through-holes 133a formed in the high-precision temperature regulating plate 133.

Next, the structure of a high-temperature thermal processing unit (BAKE) included in the third processing unit section G3 will be explained with reference to FIG. 15. Incidentally, the same numerals and symbols will be used to designate the same components as those in the pre-baking unit (PAB) or the like, so that the explanation will be omitted.

A temperature regulating device C1 as a temperature regulating section is disposed on the front side of the apparatus in the casing 75. The temperature regulating device C1 is provided with a temperature regulating plate 163 in a cylindrical supporting body 161. The temperature of the temperature regulating plate 163 is controlled by using cooling water or the like similarly to the aforesaid pre-baking unit (PAB) or the like. Meanwhile, a high-temperature thermal processing device HH for performing heat processing at a temperature higher than the thermal processing device H in the pre-baking unit (PAB) or the like is disposed on the back side. In the high-temperature thermal processing device HH, likewise with the thermal processing device H, a high-temperature hot plate 112 is placed with a proper heat insulating material provided in the cylindrical supporting body 88. Under the supporting body 88, the three pins 85 for delivering the wafer W are placed to be ascendable and descendable by the drive device 82. The three pins 85 are placed while being retracted into through-holes 112a formed in the hot plate 112.

The distance between the temperature regulating device C1 and the high-temperature thermal processing device HH is set to be larger than the distance between the temperature regulation and transfer device C and the thermal processing device H in the pre-baking unit (PAB) or the like so as to prevent thermal processing at a high temperature in the high-temperature thermal processing device HH from exerting on a bad influence on temperature regulation processing in the temperature regulating device C1.

On both sides of the temperature regulating device C1 and the high-temperature thermal processing device HH, guide rails 118 are laid in the X-direction, and a sub-arm 115 as a sub-transfer section for transferring the wafer W so as to be movable along the guide rails 118 by a drive device not illustrated is provided. The sub-arm 115 has a pair of hands 115a and 115a.

Although the detailed structure of the temperature regulating unit (TCP) included in the lowest tier of the third processing units G3 is not illustrated, the temperature regulating unit (TCP) has the same structure as the aforesaid high-precision temperature regulating unit (CPL), and as a temperature regulating mechanism of the temperature regulating unit (TCP), temperature control is given by using cooling water, Peltier elements, or the like. For example, the number of Peltier elements in this case is less than that in the case of the high-precision temperature regulating plate 133.

Figure 16:
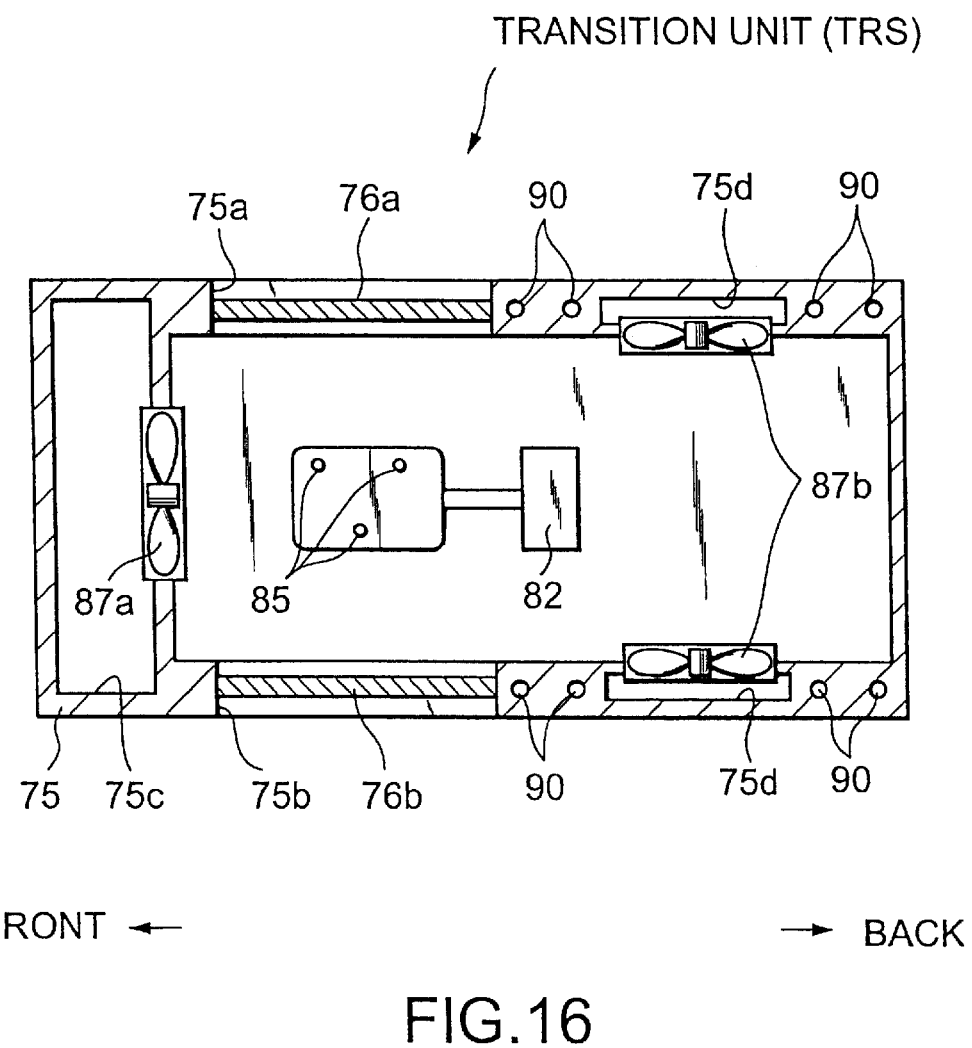
FIG. 16 is a horizontal sectional view of a transition unit (TRS) according to the first embodiment of the present invention.

FIG. 16 shows the transition unit (TRS) included in the third processing unit section G3. Different from other thermal processing units, this has no thermal processing system device (for example, the temperature regulating device C1) and has only the ascending and descending pins 85 and a drive device for vertically moving them. Other components in the transition unit (TRS) are the same as those in the high-precision temperature regulating unit (CPL) or the like. Although not illustrated, the aforesaid spare space included in the third processing unit section G3 has only ascending and descending pins and a drive device for vertically moving them for receiving and sending the wafer W from/to other processing units, similarly to the transition unit (TRS).

Next, the structure of a resist coating unit (COT) shown in FIG. 17 and FIG. 18 will be explained.

In this unit, a fan filter unit F for air control which will be described later is mounted at the upper portion of a casing 41', and at the lower portion thereof, an annular cup CP is placed near the center of a unit base plate 151 smaller than the width of the casing 41' in the Y-direction, and a spin chuck 142 is placed therein. The spin chuck 142 is structured to rotate by rotational driving force of a drive motor 143 while the wafer W is fixedly held by vacuum suction. Inside the cup CP, pins 148 for delivering the wafer W are provided to be ascendable and descendable by a drive device 147, and a drain port 145 for drainage is provided. A drain tube 141 is connected to this drain port and leads to an under drain port not illustrated by using a space between the unit base plate 151 and the casing 41'. Drain tubes 141a are connected respectively to a plurality of resist coating units (COT), and thus arranged in a line as illustrated in this processing unit section.

Meanwhile, an air flow path for atmospheric pressure control which will be described later is formed by a space L between the casing 41' and the unit base plate on the opposite side (the right side of FIG. 17), and a fan filter unit F of another resist coating unit (COT) at a tier lower than this resist coating unit (COT) can be seen.

A nozzle 135 for supplying a resist to the front face of the wafer W is connected to a solution supplying mechanism (not illustrated) in the chemical chamber (CHM) 26 (See FIG. 2) by a supply pipe 134. The nozzle 135 is removably attached to a forward end portion of a nozzle scan arm 136 at a nozzle waiting section 146 placed outside the cup CP and moved to a predetermined resist discharge position set above the spin chuck 142. The nozzle scan arm 136 is attached to an upper end portion of a vertical supporting member 149 which is horizontally movable on guide rails 144 laid in one direction (the Y-direction) on a unit base plate 151, and moves in the Y-direction integrally with the vertical supporting member 149 by a Y-directional drive mechanism not illustrated.

The nozzle scan arm 136 is movable also in the X-direction orthogonal to the Y-direction in order that the nozzle 135 is selectively attached thereto depending on the type of resist at the nozzle waiting section 146, and moves in the X-direction by an X-directional drive mechanism not illustrated.

A drain cup 138 is provided between the cup CP and the nozzle waiting section 146, and the nozzle 135 is cleaned at this position prior to the supply of the resist to the wafer W.

A vertical supporting member movable in the Y-direction for supporting a rinse nozzle scan arm 139 as well as the vertical supporting member 149 for supporting the nozzle scan arm 136 is provided on the guide rails 144. A rinse nozzle 140 for side rinse is attached to a forward end portion of the rinse nozzle scan arm 139. The rinse nozzle scan arm 139 and the rinse nozzle 140 move translationally or rectilinearly between a nozzle waiting position (position shown by a full line) set by the side of the cup CP and a rinse solution discharge position (position shown by a dotted line) set immediately above the peripheral edge portion of the wafer W mounted on the spin chuck 142.

Figure 19:
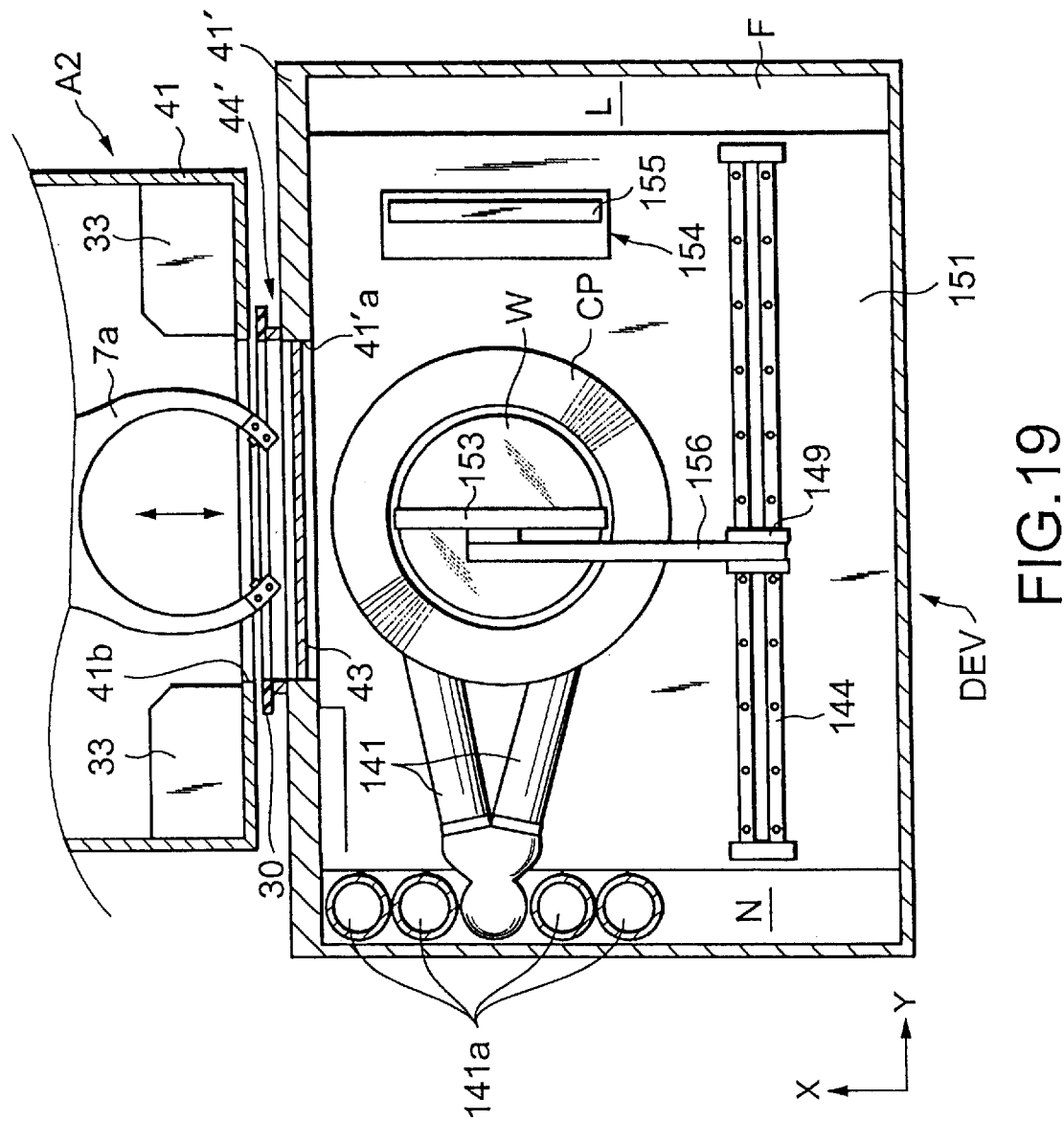
FIG. 19 is a plan view showing a developing unit according to the first embodiment of the present invention.
Figure 20:
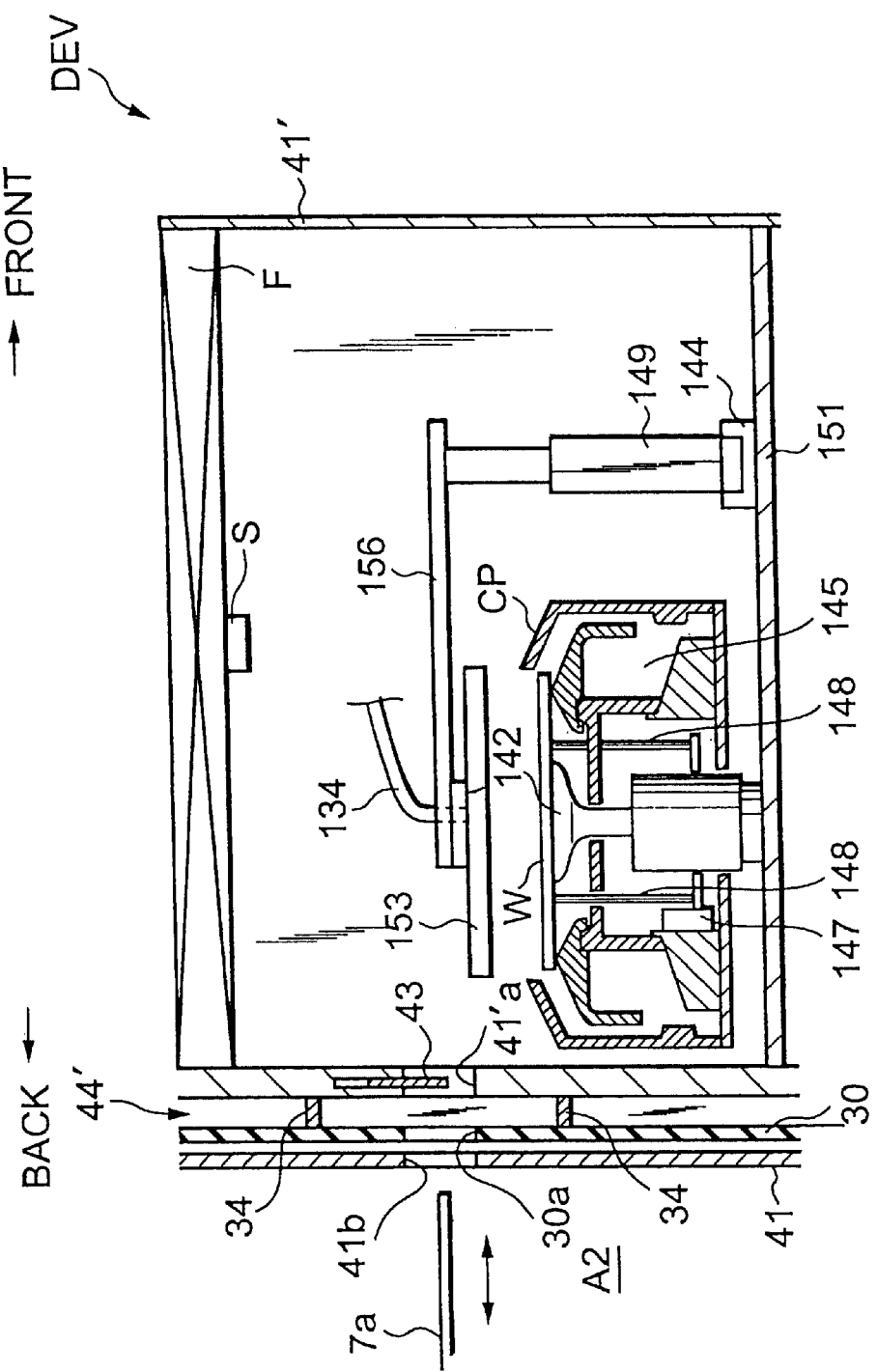
FIG. 20 is a vertical sectional view of the developing unit.

Next, the structure of the developing unit (DEV) shown in FIG. 19 and FIG. 20 will be explained. In this developing unit (DEV), the same numerals and symbols will be used to designate the same components as those in the resist coating unit (COT), so that the explanation thereof will be omitted.

In a nozzle 153 for supplying a developing solution to the front face of the wafer W, a plurality of holes not illustrated with a diameter longer than that of the wafer W for discharging the developing solution are formed. A nozzle waiting section 154 is provided by the side of a cup CP, and a rinse nozzle 155 for supplying a rinse solution for rinsing the developing solution on the front face of the wafer W is provided there. The rinse nozzle 155 has the same structure as the nozzle 153. In this nozzle waiting section 154, pre-dispense is performed regularly or as required in order to dispose of the developing solution which has dried and deteriorated at the forward end of the nozzle 153.

Although the nozzle scan arm 136 in the resist coating unit (COT) can move in the X-direction, a nozzle scan arm in this developing unit (DEV) moves only in the Y-direction along the guide rails 144.

As for the bottom coating unit (BARC), only a coating solution in the resist coating unit (COT) is replaced with an antireflection film material, so that the explanation of the structure thereof is omitted.

Figure 21:
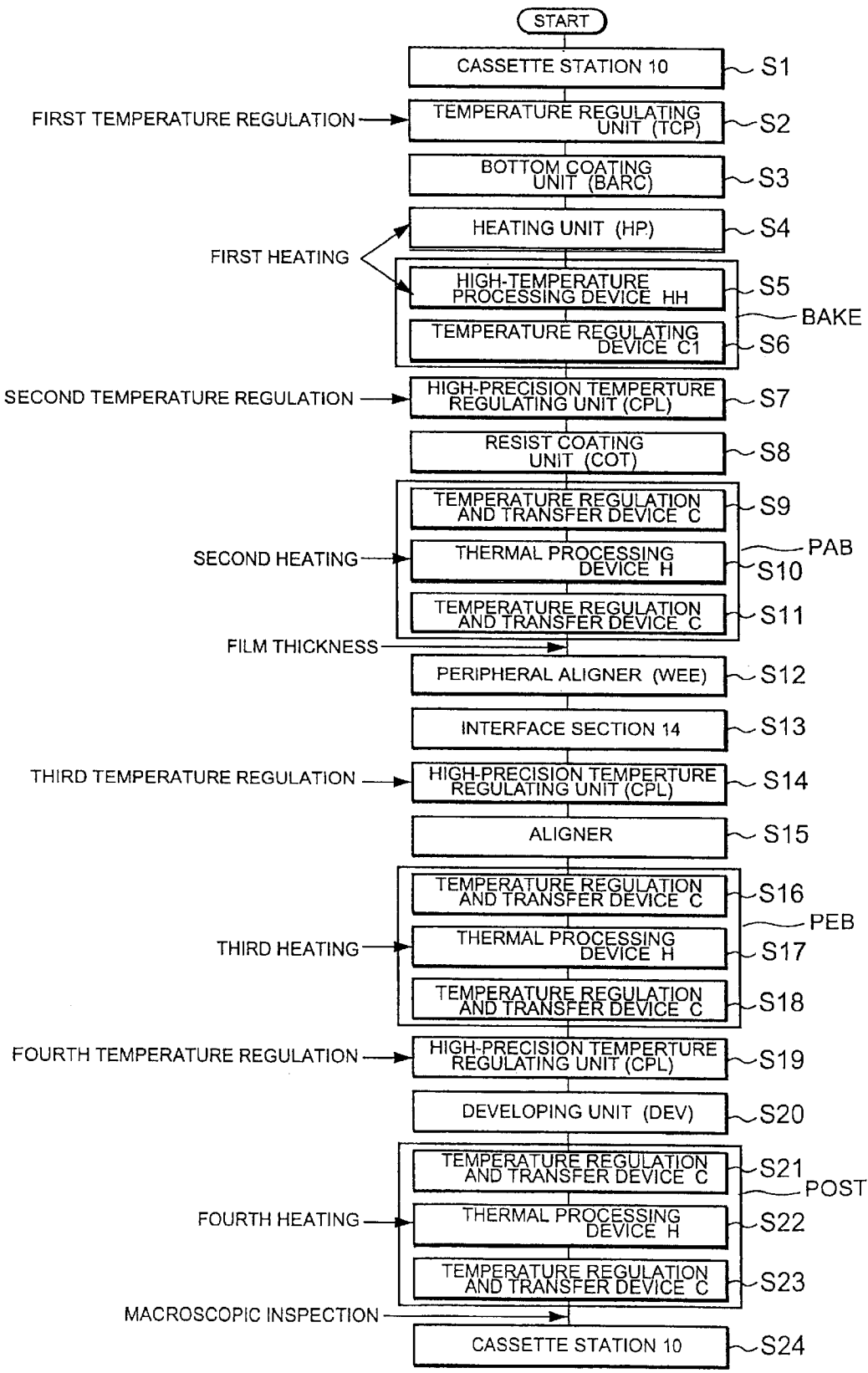
FIG. 21 is a flowchart showing a series of operations of the substrate processing apparatus according to the first embodiment of the present invention.

Next, a series of operations in the substrate processing apparatus 1 explained above will be explained with reference to the flow chart shown in FIG. 21.

In the cassette station 10, the wafer transfer body 22 first gets access to the cassette CR housing unprocessed wafers on the cassette mounting table 20 and takes one semiconductor wafer W out of the cassette CR (S1). After taking the wafer W out of the cassette CR, the wafer transfer body 22 rotates 180° in the θ-direction, the shutter 76a (See FIG. 11 and FIG. 12) of the opening 75a of the temperature regulating unit (TCP) in the third processing unit section G3 opens, a hand of the wafer transfer body 22 is inserted into the casing 75 from the opening 75a, and the wafer W is mounted on the temperature regulating plate. Then, predetermined temperature regulation processing (first temperature regulation) is performed (S2).

After temperature regulation processing is completed in the temperature regulating unit (TCP), the opening 75b on the opposite side opens, the upper arm 7a of the first main wafer transfer body 16 is inserted therefrom, and the wafer W is delivered to the arm 7a. The main wafer transfer body 16 rotates 90° counterclockwise in FIG. 4, a shutter 43 of the bottom coating unit (BARC) included in the first processing unit section G1 opens, the upper arm 7a is inserted into the casing, the wafer W is mounted at a predetermined position, and an antireflection film is formed (S3). As described above, the transfer of the wafer W from the temperature regulation system processing units to the coating system processing units (G1 and G2) is performed only by the upper arm 7a, and the transfer of the wafer W after heat processing which will be described later is performed by the middle arm 7b or the lower arm 7c, whereby a thermal influence on the wafer W can be held to a minimum.

When the predetermined coating processing in the bottom coating unit (BARC) is completed, the shutter 43 opens, the middle arm 7b (or the lower arm 7c) is inserted to receive the wafer W and put back in its original position (inside the casing 41). The wafer W is transferred to the heating unit (HP) 113 to undergo first pre-stage heat processing (S4). The heating temperature in this case is, for example, 120° C.

Figure 15:
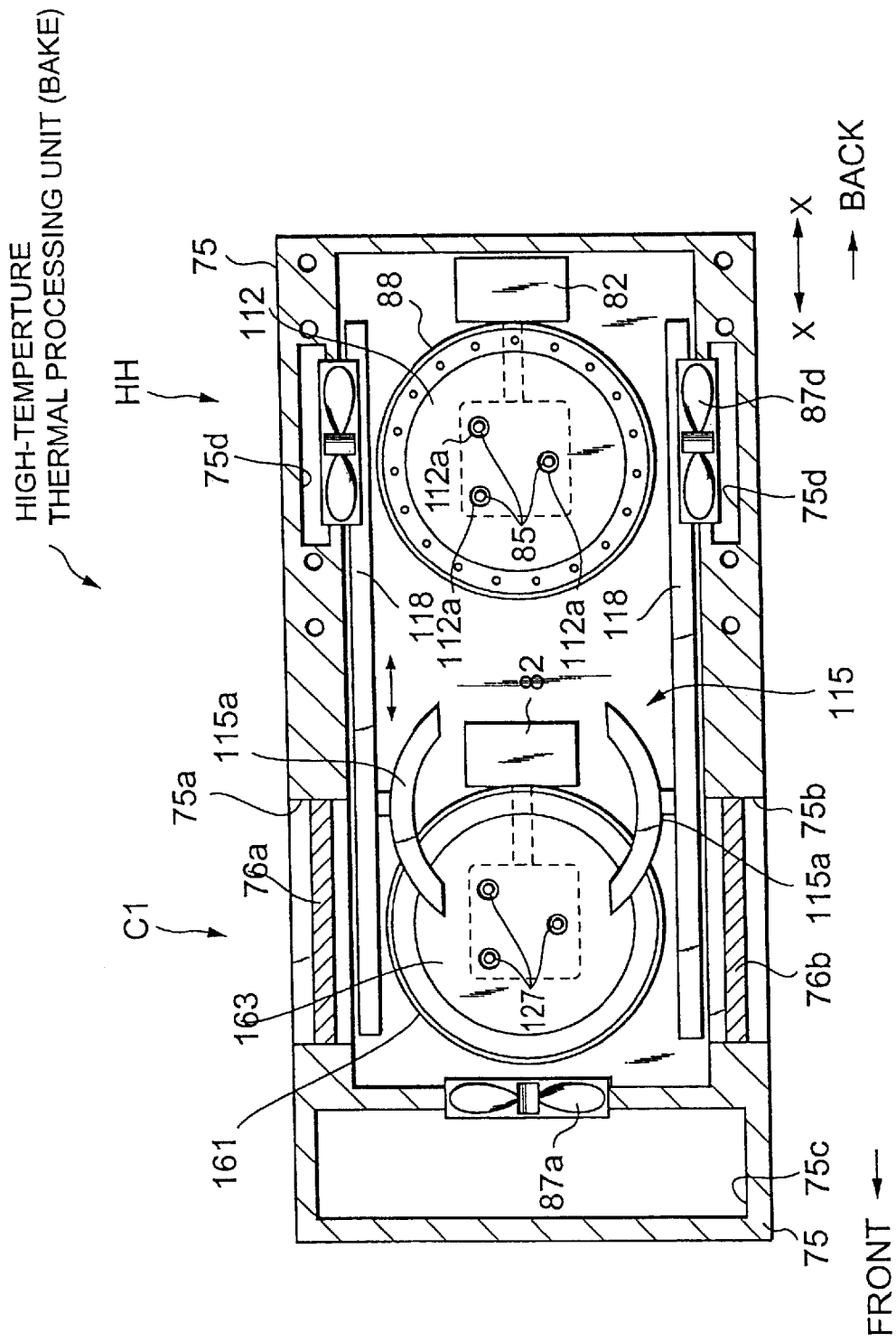
FIG. 15 is a horizontal sectional view of a high-temperature thermal processing unit (BAKE) according to the first embodiment of the present invention.

Thereafter, in the high-temperature thermal processing unit (BAKE) shown in FIG. 15, the shutter 76 shown in FIG. 15 opens, and the middle arm 7b (or the lower arm 7c) of the first main wafer transfer body A1 on which the wafer W is mounted moves in the Y-direction to a position immediately above the temperature regulating device C1. Ascending and descending pins 127 in the temperature regulating device C1 ascend, and the wafer W is mounted on the pins 127 at a position higher than the sub-arm 115. Thereafter, the middle arm 7b is put back in its original position, and the shutter 76 closes. At this time, the sub-arm 115 is waiting in the vicinity of the center of the unit so as not to hinder the movement of the main wafer transfer body 16. The sub-arm 115 on standby moves to a position above the temperature regulating device C1. The ascending and descending pins 127 descend while the wafer W is mounted thereon, and the wafer W is delivered to the sub-arm 115.

The sub-arm 115 which has received the wafer W moves in the X-direction to the back side, and the wafer W is mounted on the hot plate 112 of the high-temperature thermal processing device HH for the next step by the movement of the ascending and descending pins to undergo predetermined first post-stage heat processing (S5). In this heat processing, the wafer W is heated, for example, at 230° C. for a predetermined period of time.

After the predetermined thermal processing by the high-temperature thermal processing device HH is completed, the wafer W is moved to the temperature regulating device C1 by the sub-arm 115 and mounted on the temperature regulating plate 163 by the ascending and descending pins 127, and the temperature of the wafer w is regulated at a predetermined temperature there (S6).

The wafer W is then transferred from the high-temperature thermal processing unit (BAKE) to the first main wafer transfer section A1 by the first main wafer transfer body 16, and transferred to the high-precision temperature regulating unit (CPL) included in the fourth processing unit section G4 therefrom by the same operation. Predetermined temperature regulation processing at 23° C., for example, is performed there (second temperature regulation) (S7).

Figure 17:
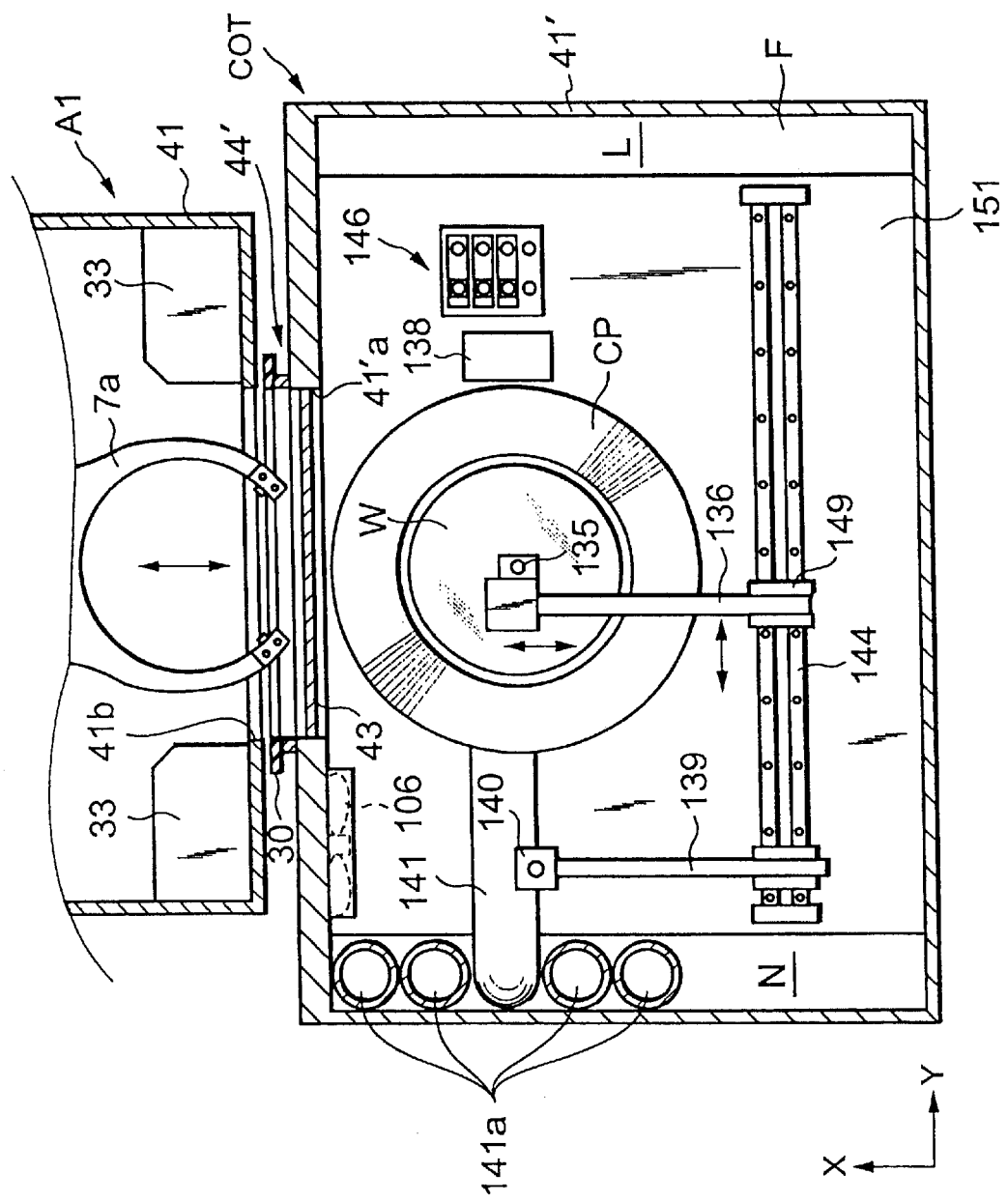
FIG. 17 is a plan view showing a resist coating unit according to the first embodiment of the present invention.
Figure 18:
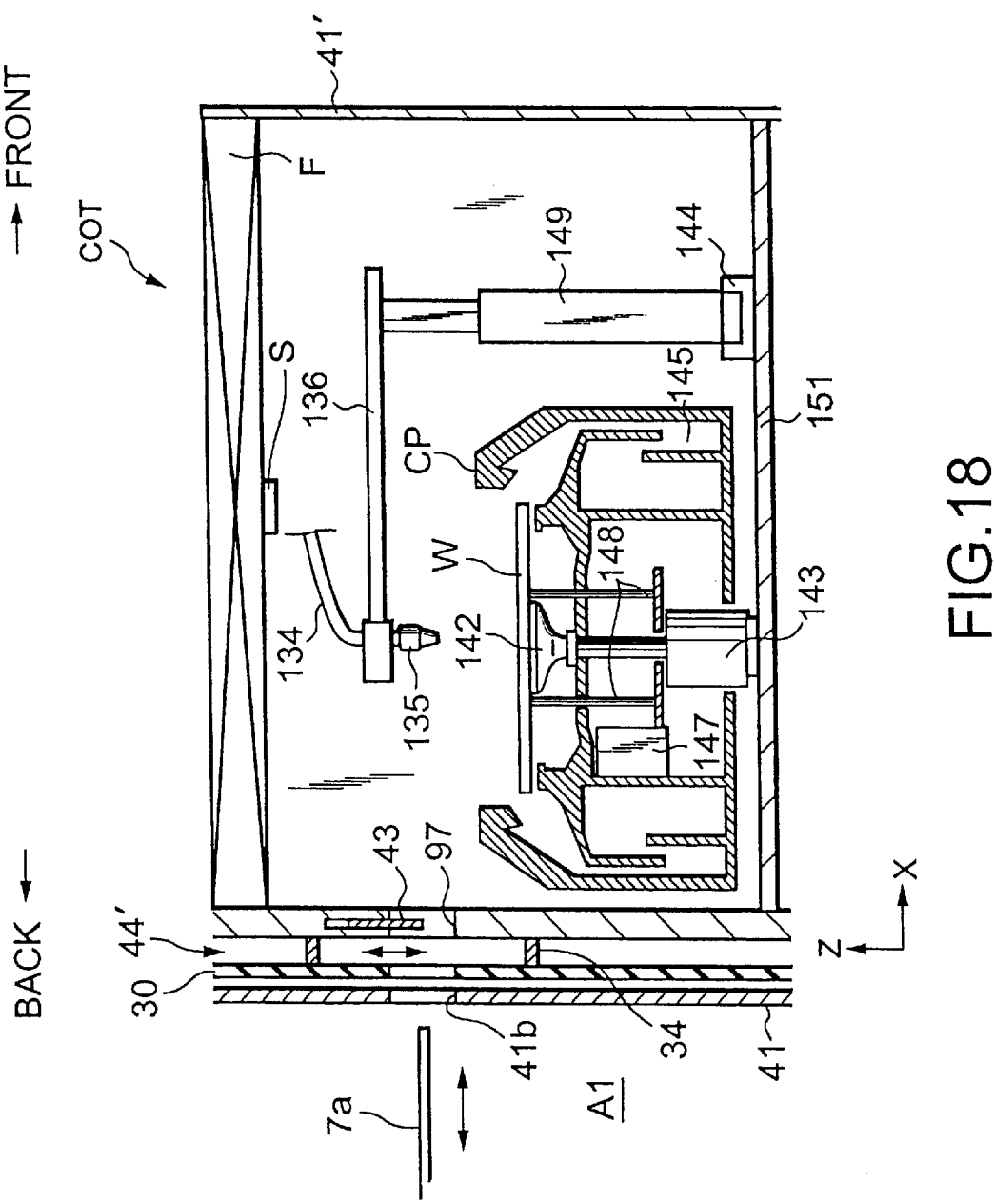
FIG. 18 is a vertical sectional view of the resist coating unit.

When the temperature regulation processing is completed, the shutter 43 shown in FIG. 17 opens, and the wafer W is transferred to the resist coating unit (COT) included in the first processing unit section G1 to undergo resist solution coating processing (S8).

In the resist coating unit (COT), when the wafer W is transferred to a position immediately above the cup CP, the pins 148 first ascend and then descend after receiving the wafer W, and the wafer W is mounted on the spin chuck 142 and vacuum-sucked. The nozzle 135 which has been waiting at the nozzle waiting section moves to a position above the center of the wafer W shown in FIG. 17 by the mechanisms of the nozzle scan arm 136 and the guide rails 144. After the predetermined resist solution is applied to the center of the wafer W, the wafer W is rotated at 100 rpm to 300 rpm by the drive motor 143, and the coating of the resist solution is completed by spreading the resist solution over the entire face of the wafer W by centrifugal force.

Figure 22A:
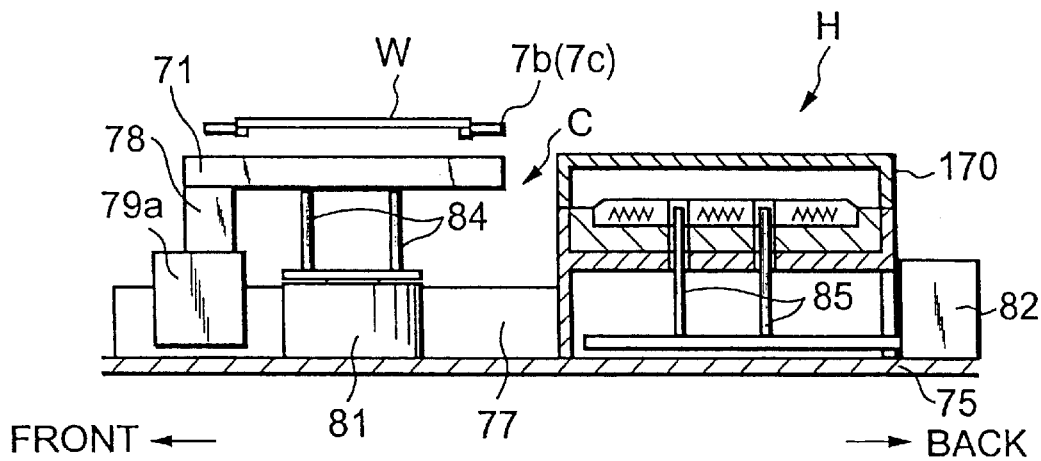
FIG. 22A to FIG. 22C are diagrams for explaining the delivery operation of a substrate in the thermal processing unit.
Figure 22B:
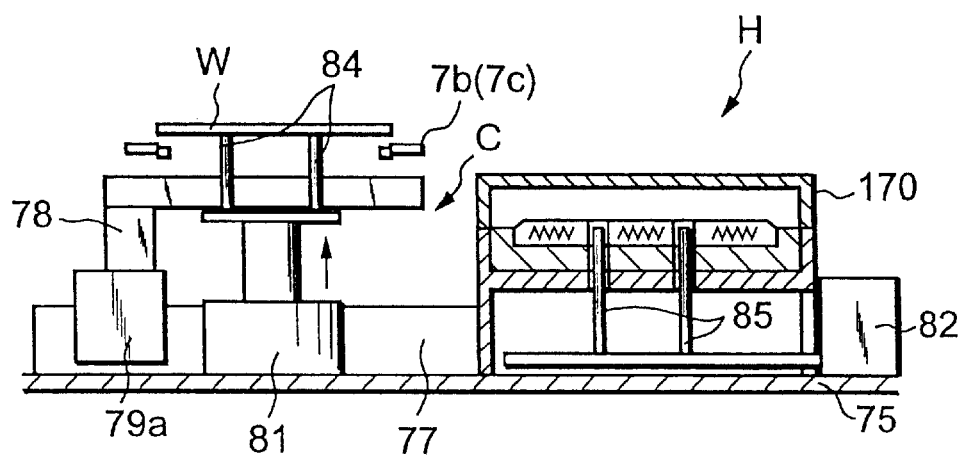

Subsequently, the shutter 76b of the pre-baking unit (PAB) in the fourth processing unit section G4 opens, and the middle arm 7b on which the wafer W is mounted moves in the Y-direction to a position immediately above the temperature regulation and transfer plate 71 as shown in FIG. 22A. Thereafter, as shown in FIG. 22B, the ascending and descending pins 84 ascend, and the wafer W is mounted on the pins. The middle arm 7b is then put back in its original position, the shutter 76b closes, and as shown in FIG. 22C, the ascending and descending pins 84 descend, whereby the wafer W is mounted on the temperature regulation and transfer plate 71 (S9).

Figure 23A:
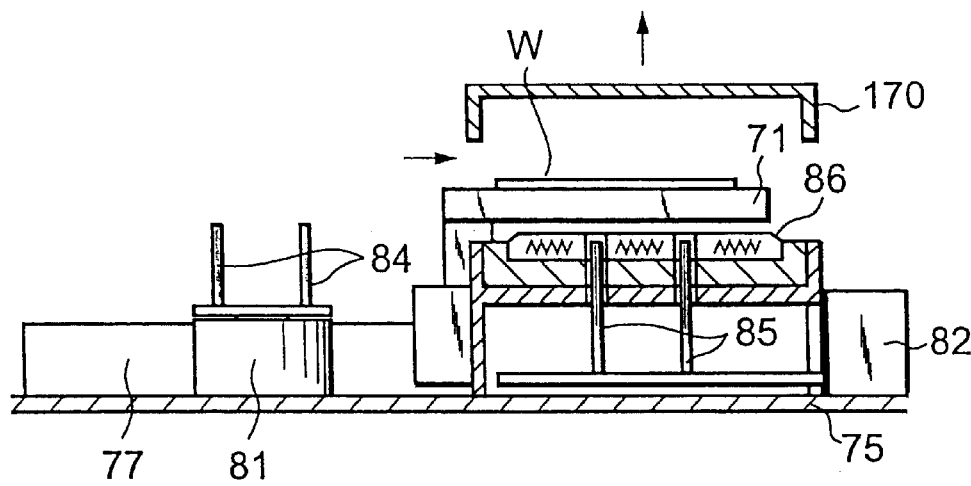
FIG. 23A to FIG. 23C are operational diagrams of the thermal processing unit.
Figure 23B:
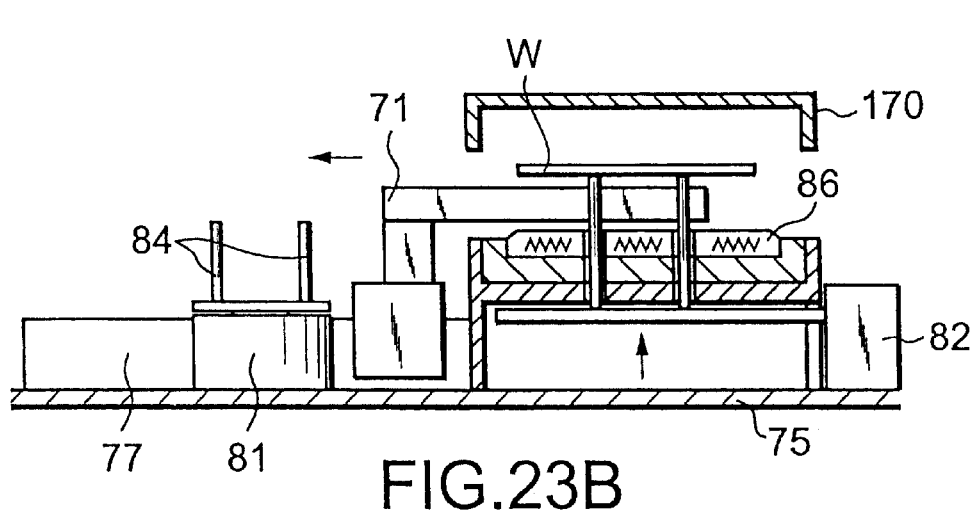
Figure 23C:
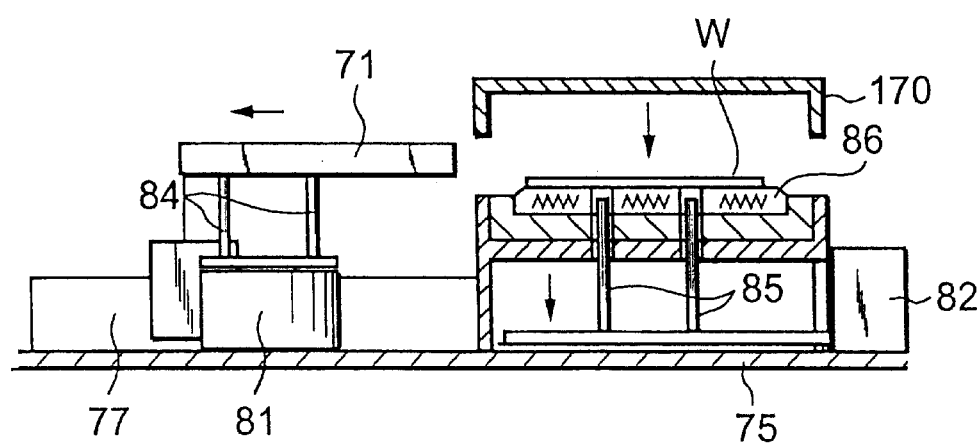

As shown in FIG. 23A, the temperature regulation and transfer plate 71 on which the wafer W is mounted moves to the back side to a position directly above the hot plate 86. Thereafter, as shown in FIG. 23B, the pins 85 ascend, the wafer W is mounted on the pins. Subsequently, the temperature regulation and transfer plate 71 is put back in its original position, and as shown in FIG. 23C, the pins 85 descend, whereby the wafer W is mounted on the hot plate 86 to undergo predetermined second heat processing (PAB)(S10). As a result, a remaining solvent is removed from the coating film on the wafer W by evaporating.

After the predetermined heat processing by the heat processing device H is completed, operations reverse to the operations shown by FIG. 23A to FIG. 23C are performed. Specifically, the wafer W is returned to the front side while mounted onto the temperature regulation and transfer plate 71 from the hot plate 86 by the temperature regulation and transfer device C. At this time, the temperature regulation and transfer device C moves to the front side while regulating the temperature of the heated wafer W, for example, at about 40° C. (temperature-regulating the wafer W) (S11) Consequently, a processing period of time from heat processing to temperature regulation processing can be reduced, thereby improving throughput.

Figure 22C:
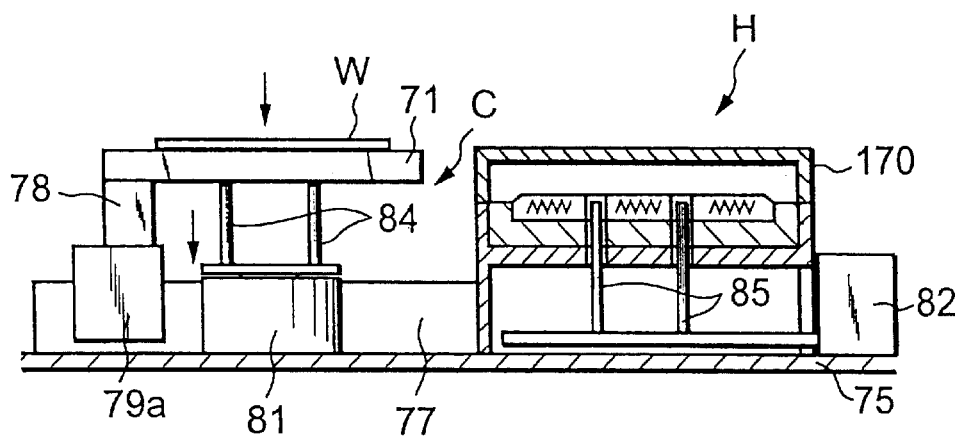

The wafer W is then taken out of the temperature regulation and transfer device C by the second main wafer transfer body 17 by operations reverse to the operations explained by means of FIG. 22A to 22C, and transferred to the film thickness inspection device 119 and the peripheral aligner 120 through the window 38a of the door 38 shown in FIG. 4. After predetermined film thickness inspection and substrate edge exposure processing are performed there (S12), the wafer W is delivered to the ascending and descending pins 84 of the temperature regulation and transfer device C in the fifth processing unit section G5 by the second main transfer body 17 and then transferred from the interface section 14 (S13) to the aligner not illustrated (S15) by the wafer transfer body 27. In this case, the wafer W is sometimes stored in the buffer cassette BR temporarily before being delivering to the aligner. Thereafter, predetermined temperature regulation processing is performed by the high-precision temperature regulating unit (CPL) 130 in the interface section 14 (S14). The aforesaid film thickness inspection device is a unit to perform not only inspection by the naked eye but also microscopic inspection by means of inspection equipment, and performs contamination inspection for particles and the like, surface inspection, and the like, in addition to film thickness inspection. In this respect, inspection may be performed suitably instead of being performed for all the wafers W.

After exposure processing is completed, the wafer W is transferred to the post-exposure baking unit (PEB) included in the fifth processing unit section G5 through the interface section 14 by the wafer transfer body 27. Also in this case, by operations similar to the operations explained in S9 to S11, the wafer W is transferred from the wafer transfer body 27 to the temperature regulation and transfer device C (S16), then transferred from the temperature regulation and transfer device C to the thermal processing device H while the temperature of the wafer W is being regulated to undergo heat processing by the thermal processing device H (third heating) (S17). The wafer W is transferred while being regulated at a predetermined temperature by the temperature regulation and transfer device C (S18), and taken out by the second main wafer transfer body 17 in the second main wafer transfer section A2.

Subsequently, the wafer W is subjected to predetermined temperature regulation processing, for example, at 23° C. in the high-precision temperature regulating unit (CPL) included in the fifth processing unit section G5 (fourth temperature regulation) (S19), and then transferred to the developing unit (DEV) included in the second processing unit section G2 by the main wafer transfer body 17 to undergo coating processing of the developing solution (S20).

In this developing unit (DEV), when the wafer W is transferred to a position immediately above the cup CP, the pins 148 first ascend and then descend after receiving the wafer W, and the wafer W is mounted on the spin chuck 142 and vacuum-sucked. The nozzle 135 which has been waiting at the nozzle waiting section moves to a position above the periphery of the wafer W by the mechanisms of the nozzle scan arm 136 and the guide rails 144. While the wafer W is being rotated, for example, at 10 rpm to 100 rpm by the drive motor 143 and the nozzle 135 moves from the periphery of the wafer W in the Y-direction, coating of the predetermined developing solution is performed by the centrifugal force of rotation.

The wafer W is then transferred to the post-baking unit (POST) included in the fourth processing unit section G4. Also in this case, by operations similar to the operations explained in S9 to S11 and S16 to S18, the wafer W is transferred from the main wafer transfer body 17 to the temperature regulation and transfer device C (S21), then transferred from the temperature regulation and transfer device C to the thermal processing device H to undergo heat processing by the thermal processing device H (fourth heating) (S22). The wafer W is transferred while the temperature of the wafer W is being regulated at a predetermined temperature, for example, 40° C. by the temperature regulation and transfer device C (S23), and this time taken out by the first main wafer transfer body 16 in the first main wafer transfer section A1. In this heat processing, the wafer W is heated, for example, at 100° C. for a predetermined period of time. As a result, the resist swelled due to developing is cured, and chemical resistance is improved.

The wafer W is then transferred to the spare space in the third processing unit section G3 by the main wafer transfer body 16 and returned to the cassette CR of the cassette station 10 by the wafer transfer body 22 (S24). In this case, processing ununiformity and the like on the wafer W are sometimes inspected macroscopically by the naked eye by means of a macroscopic inspection device which is not illustrated but provided on the back side of the cassette station 10 before the wafer W is returned to the cassette CR of the cassette station 10. In addition to the aforesaid macroscopic inspection, pattern defects after developing, line width, registration/overlay accuracy, and the like may be inspected. Such a macroscopic inspection device may be placed outside so as to protrude from the back side of the cassette station 10, or may be placed inside the cassette station 10.

As explained above, the wafer W is transferred while the temperature of the wafer W is regulated immediately after the first heating (S5), the second heating (S10), the third heating (S17), and the fourth heating (S22), whereby the temperature regulation processing time in the second temperature regulation (S7), the third temperature regulation (S14), and the fourth temperature regulation (S19) as the following steps can be reduced, thus improving throughput.

The thermal processing unit sections G3 to G5 each have ten-tiered structure, the coating processing unit sections G1 and G2 each have five-tiered structure, and moreover, the processing unit sections G1 to G5 are arranged to surround the first main wafer transfer section A1 and the second main wafer transfer section A2, which enables to a large number of substrates to be processed quickly and enables to the main wafer transfer bodies 16 and 17 to get access to respective units efficiently, leading to contribution to an increase in throughput.

Heat processing is performed by the thermal processing device H via the temperature regulation and transfer device C from the main wafer transfer bodies 16 and 17. In other words, the temperature of the wafer W is always maintained at a predetermined temperature by the temperature regulation and transfer device C before the performance of heat processing. Hence, a difference in processing state does not occur even if the heat processing time is fixed, and the thermal budget of the wafer W in the whole substrate processing can be fixed.

As shown in FIG. 1, the temperature regulation system devices C1, C2, and C are placed between the heating devices H, HH, and the like in the thermal processing system processing unit sections G3 to G5 and the coating system processing unit sections G1 and G2, whereby the thermal influence of the heating devices H, HH, and the like on the coating system processing unit sections G1 and G2 can be held to a minimum.

Meanwhile, the portions between the main wafer transfer sections A1 and A2 and the processing unit sections G1 to G5 are surrounded by the surrounding members 44 and 44', whereby the entry of particles to the processing units and the transfer sections can be prevented.

As for these surrounding members 44 and 44', as shown in FIG. 4, the gap U is provided between each of the surrounding members 44 of the first and second main wafer transfer sections A1 and A2, and each of the processing units, whereby vibration caused by the transfer of the main wafer transfer sections A1 and A2 is not transmitted to the processing units, resulting in certain performance of thermal processing and coating processing.

Figure 25:
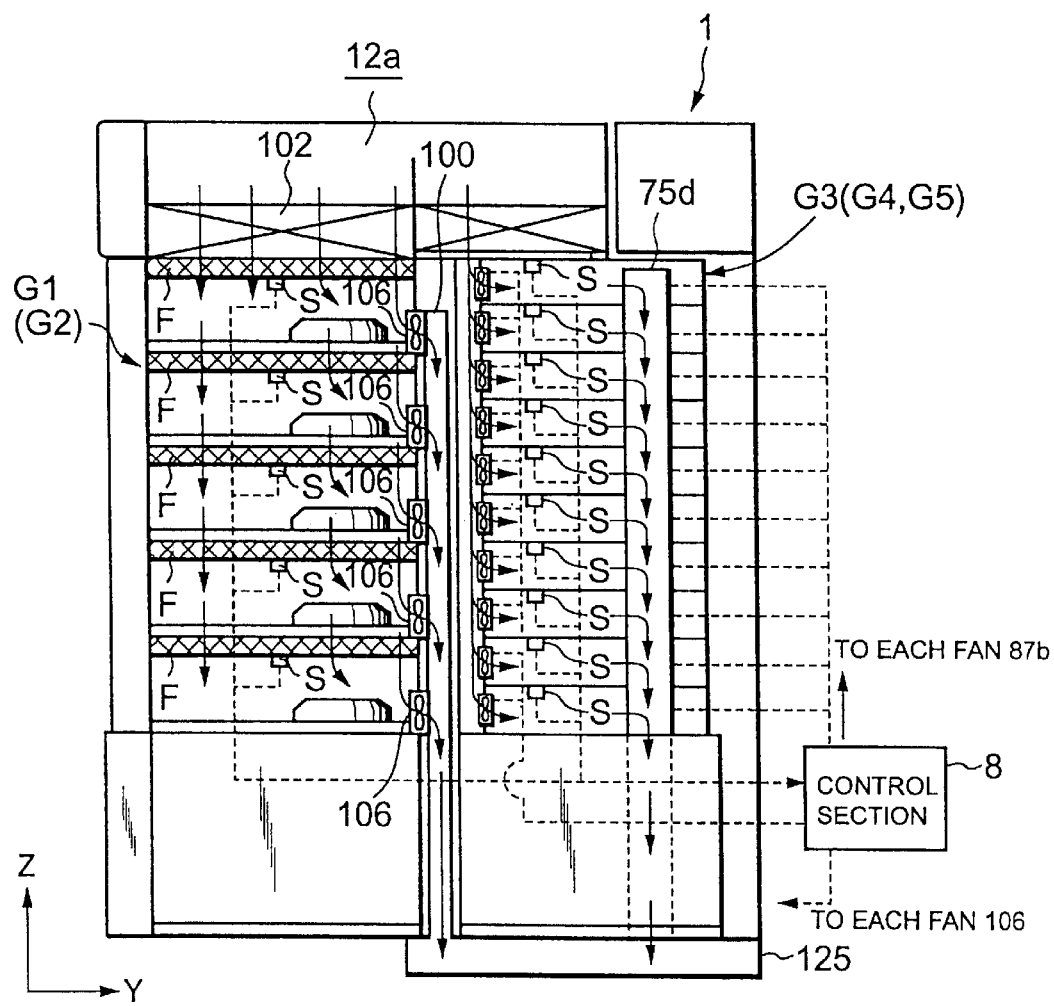
FIG. 25 is a schematic side view showing the flow of the clean air.
Figure 26:
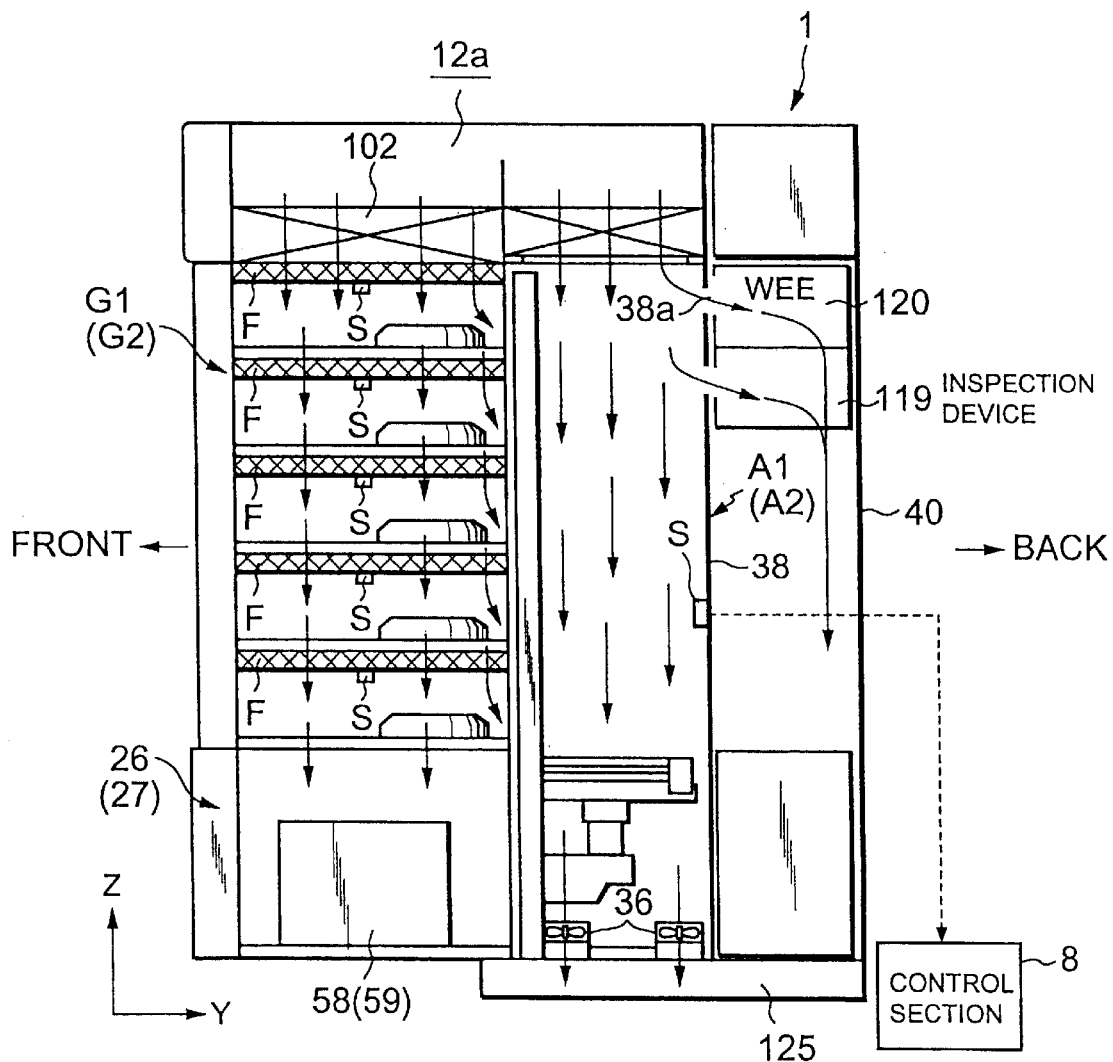
FIG. 26 is a schematic side view showing the flow of the clean air.

Next, atmospheric pressure, temperature, and humidity control in the substrate processing apparatus 1 will be explained with reference to FIG. 24 to FIG. 26.

Figure 24:
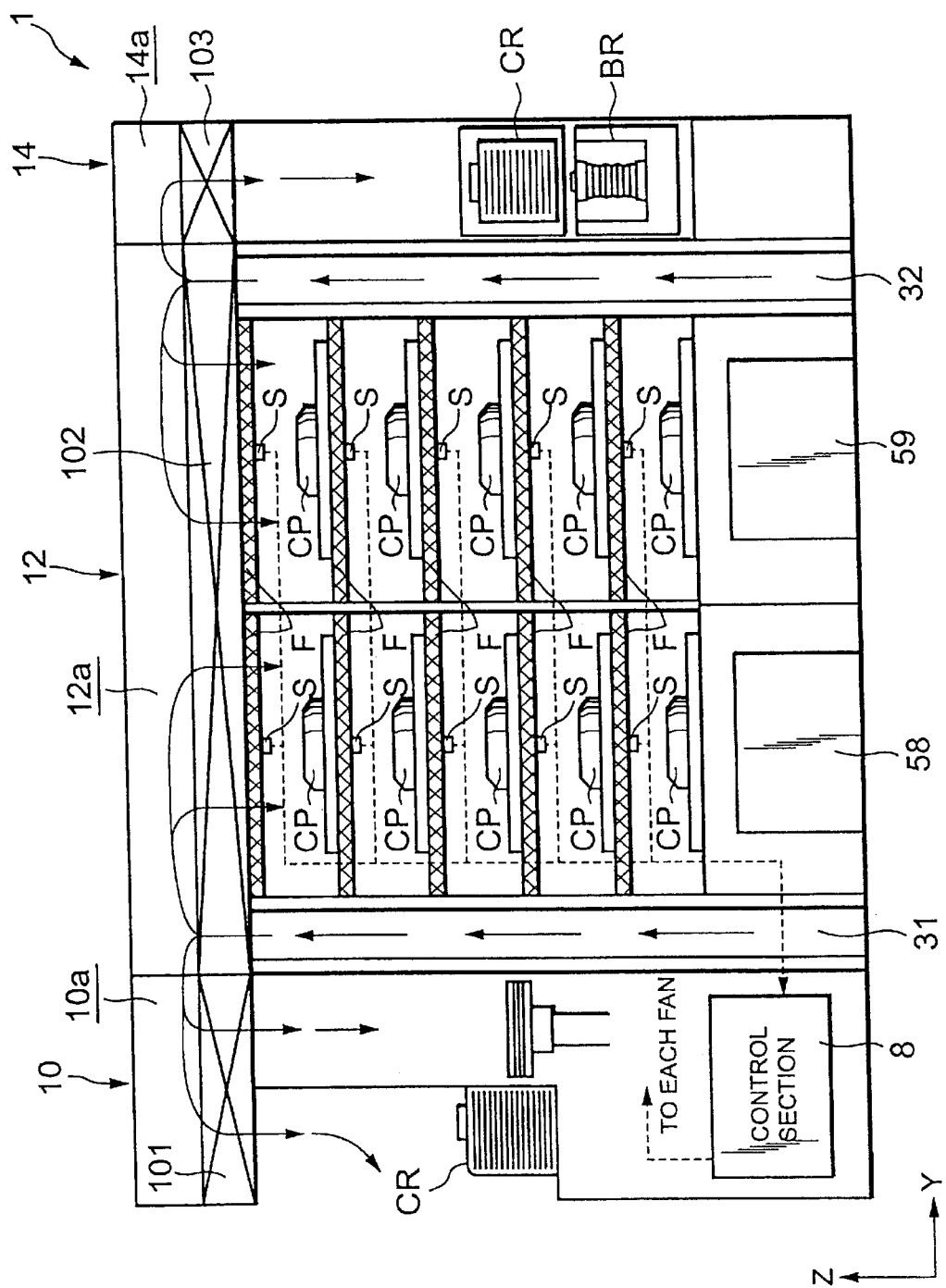
FIG. 24 is a schematic front view showing the flow of clean air in the substrate processing apparatus according to the first embodiment of the present invention.

In FIG. 24, air supply chambers 10a, 12a, and 14a are provided at the upper portions of the cassette station 10, the processing station 12, and the interface section 14 respectively, and filters with a dust proof function, for example, ULPA filters 101, 102, and 103 are attached to the lower faces of the air supply chambers 10a, 12a, and 14a. Down flowing clean air is supplied from the ULPA filters 101, 102, and 103 of the air supply chambers to the sections 10, 12, and 14, and flows down from these air supply chambers to respective processing units as shown in FIG. 24 and FIG. 25. This down flowing air is supplied from the aforesaid ducts 31 and 32 in the direction of the arrows (upward). In the first and second processing unit sections G1 and G2, air is exhausted from an exhaust duct 100 (See FIG. 25) to an under exhaust port 125 through fans 106 provided at the back side thereof. In the third to fifth processing unit sections G3 to G5, air is exhausted from the exhaust port 75d to the under exhaust port 125 through the flow path 75c and the fans 87a and 87b (See FIG. 11). As shown in FIG. 26, in the first and second main wafer transfer sections A1 and A2, air is exhausted from the under exhaust port 125 through the fans 36, led to the peripheral aligner 120 and the inspection device 119 through the window 38a of the door 38, and exhausted to the exhaust port 125. The rotation speed of all the aforesaid fans 106, 87a, 87b, and 36 is controlled by the control section 8 individually at each unit.

In each unit of the coating system unit sections (G1 and G2), the fan filter unit F is attached on the top thereof, and a sensor S for measuring the atmospheric pressure, temperature, and humidity is provided. The fan filter unit F has, for example, a ULPA filter and a small-sized fan. Meanwhile, in each unit of the third to fifth processing unit sections G3 to G5, the same sensor S is provided, and also in each of the first and second main wafer transfer sections A1 and A2, the sensor s is provided similarly. Detection results by the aforesaid sensors S are sent to the control section 8.

According to the aforesaid structure, concerning atmospheric pressure control, the atmospheric pressure in the first and second processing unit sections G1 and G2 is controlled to be higher than that in the first and second main wafer transfer sections A1 and A2 and the third to fifth processing unit sections G3 to G5, for example, by 0.3 (Pa) to 0.4 (Pa). By controlling the atmospheric pressure in the coating system unit sections G1 and G2 higher than that in the thermal processing system and the transfer system, that is, by performing positive pressure control as above, coating processing in the coating system units which need limitation on particles most can be performed certainly and precisely.

According to the aforesaid structure, the atmospheric pressure, temperature, and humidity in each unit in the first to fifth processing unit sections G1 to G5, and the first and second main wafer transfer sections A1 and A2 are PID-controlled individually, whereby each processing can be performed in the optimum environment suitable to processing in each unit.

Moreover, when the door 38 is opened at the time of maintenance of the first and second main wafer transfer sections A1 and A2, the amount of clean air to be supplied into all the unit sections G1 to G5 and all the main wafer transfer sections A1 and A2 is increased based on a command from the control section 8, thereby increasing the atmospheric pressure. As a result, the occurrence of particles at the time of maintenance can be inhibited. In addition to this atmospheric pressure control, the atmospheric pressure in the entire system (the substrate processing apparatus 1) may be increased when the panel 40 at the back in FIG. 1 is removed or opened and closed, in which case a fan which operates only at the time of maintenance may be provided separately to thereby increase the atmospheric pressure in the entire system (the substrate processing apparatus 1).

Furthermore, as shown in FIG. 1, the temperature regulation system devices C1, C2, and C are placed between the heating devices H, HH, and the like in the thermal processing system processing unit sections G3 to G5 and the coating system processing unit sections G1 and G2, whereby the thermal influence of the heating devices H, HH, and the like on the coating system processing units G1 and G2 can be held to a minimum. Therefore, temperature control in the coating system processing unit sections G1 and G2 can be performed precisely.

Figure 27:
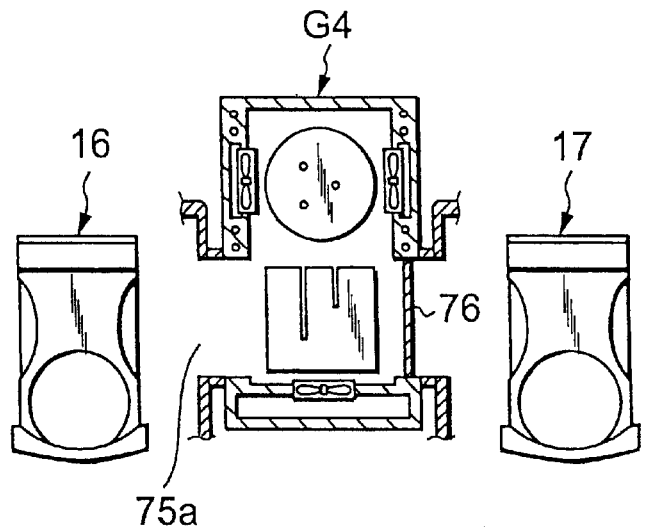
FIG. 27 is a diagram for explaining the opening and closing operation (a first operation) of shutters according to the present invention.

In the substrate processing apparatus 1, as shown in FIG. 27, in each unit in the thermal processing system unit sections G3 to G5, opening and closing control is performed so that when one opening 75a is opened by the shutter 76a, another opening 75b is closed by the shutter 76b. Thus, each unit functions as a so-called load lock chamber, environment on both sides across each unit can be effectively shut off, and processing environment can be maintained satisfactorily.

Figure 28:
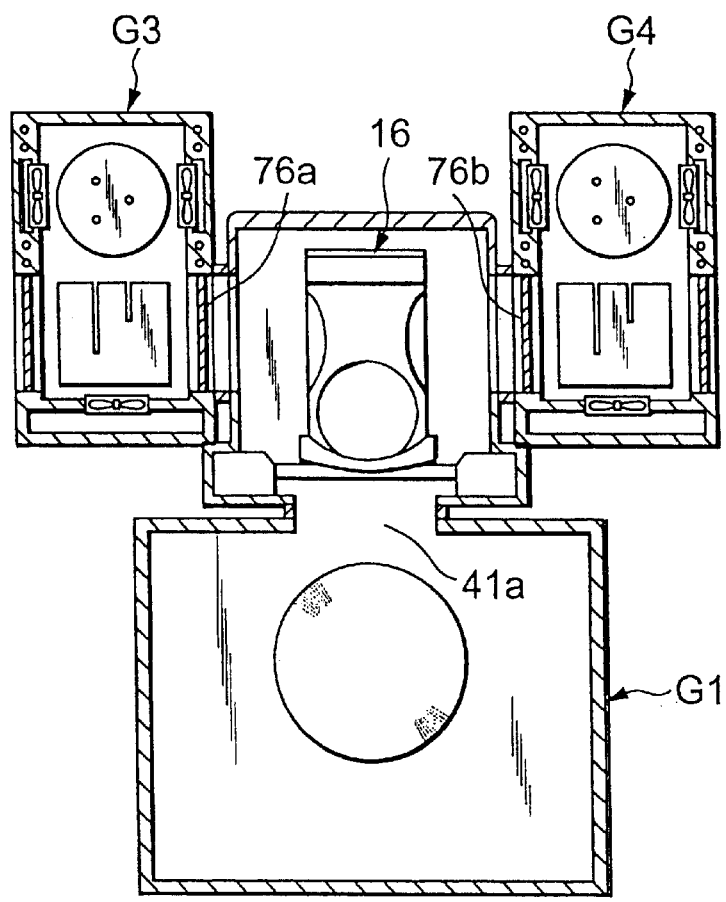
FIG. 28 is a diagram for explaining the opening and closing operation (a second operation) of the shutters according to the present invention.

Moreover, in the substrate processing apparatus 1, as shown in FIG. 28, opening and closing control is performed so that when the opening 97 of each unit in the solution supply system unit sections G1 and G2 is opened by the shutter 43, the openings 75a and 75b of each unit in the thermal processing system unit sections G3 to G5 on both sides of the unit sections G1 and G2 are closed by the shutters 76a and 76b. Consequently, an atmosphere which exerts a bad influence on processing no longer flows into the thermal processing system unit from the solution supply system unit.

Furthermore, this system allows the temperature in solution supply devices 58 and 59 inside the chemical chambers (CHM) 26 and 27 to be regulated, thereby maintaining the temperature of the processing solution to be supplied to the coating system processing units G1 and G2 in a suitable state. It should be noted that the chamber used as the coating system processing unit can be substituted for the chemical chamber.

Figure 12:
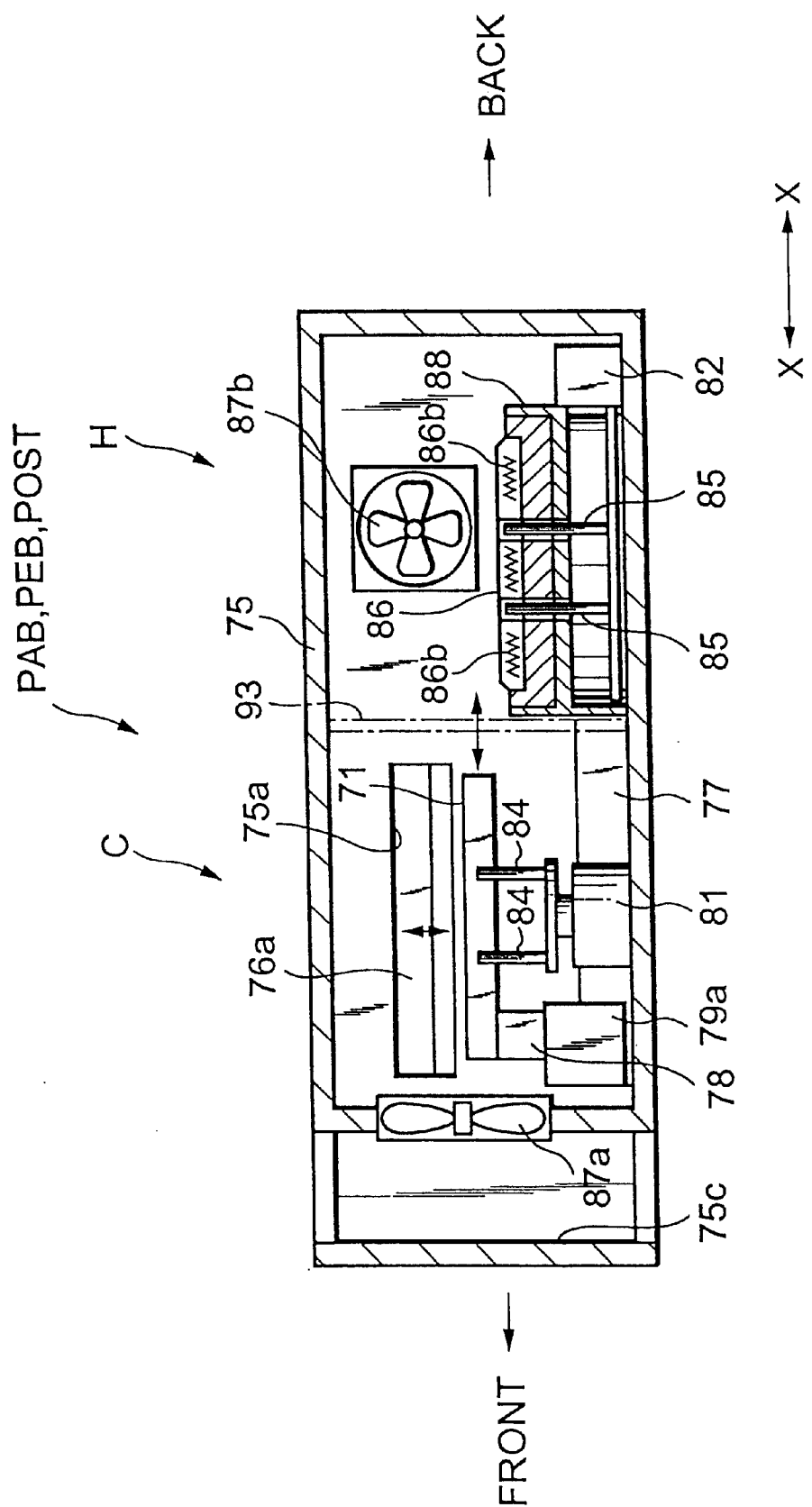
FIG. 12 is a vertical sectional view of the aforesaid thermal processing unit.
Figure 29:
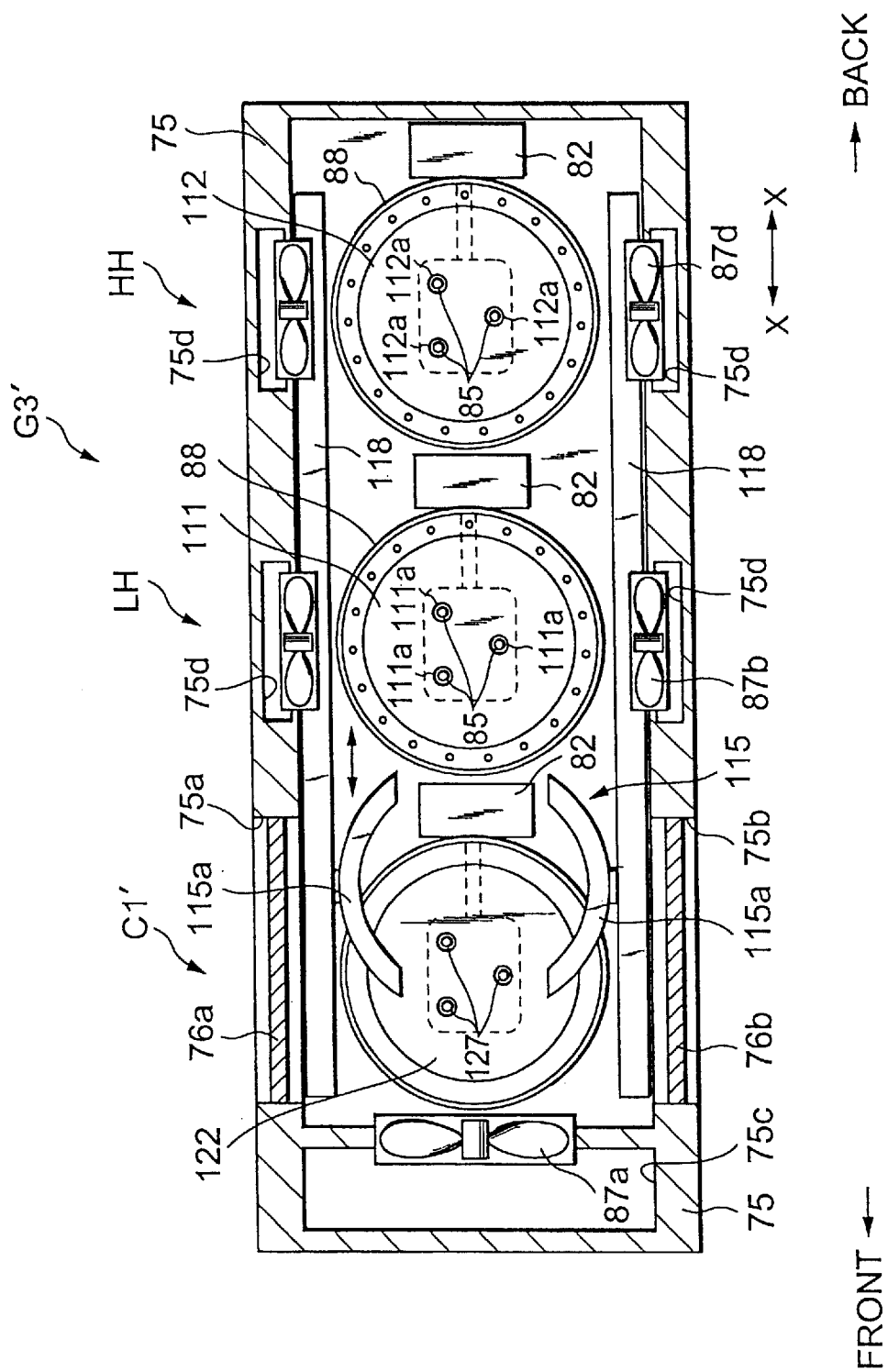
FIG. 29 is a horizontal sectional view of a thermal processing unit according to a second embodiment of the present invention.

FIG. 29 shows a thermal processing unit according to a second embodiment of the present invention, and the explanation of the same components as those in FIG. 11 and FIG. 12 will be omitted.

In this thermal processing unit G3', a temperature regulating device C1', a low-temperature thermal processing device LH, and the high-temperature thermal processing device HH are disposed, for example, linearly from the front side (the left side in FIG. 29) in order inside the casing 75. These thermal processing devices LH and HH are different only in heating temperature. As for the structure thereof, similarly to the thermal processing device H of the first embodiment, a low-temperature hot plate 111 is provided in the low-temperature thermal processing device LH and the high-temperature hot plate 112 is provided in the high-temperature thermal processing device HH respectively, with a proper heat insulating material provided in the cylindrical supporting body 88. Under the supporting body 88, the three pins 85 for delivering the wafer W are placed to be ascendable and descendable by the drive device 82. The three pins 85 are placed while being retracted into through-holes 111a and 112b formed in the hot plate 111 and 112 respectively. Meanwhile, the temperature regulating device C1' is the same as the temperature regulating device in the temperature regulating unit (TCP) of the first embodiment, for example, and Peltier elements or cooling water is used as a temperature regulating mechanism.

On both sides of the temperature regulating device C1', the low-temperature thermal processing device LH, and the high-temperature thermal processing device HH, the guide rails 118 are laid in the X-direction, and the sub-arm 115 is provided so as to be movable along the guide rails 118 by a drive device not illustrated. The sub-arm 115 has a pair of hands 115a and 115a.

The thermal processing unit G3' is arranged in the same manner as the processing unit sections G3 to G5 in the first embodiment. In this case, the panel 40 at the back of the processing station 12 in FIG. 1 is moved to the back side so as to fit the size of the thermal processing unit G3'.

As concerns the operation of this thermal processing unit G3', the shutter 76 opens, and the middle arm 7b (or the lower arm 7c) of the first or the second main wafer transfer body A1 or A2 moves in the Y-direction to a position immediately above the temperature regulating device C1'. The ascending and descending pins 127 in the temperature regulating device C1' ascend, and the wafer W is mounted on the pins 127 at a position higher than the sub-arm 115. Thereafter, the middle arm 7b is put back in its original position, and the shutter 76 closes. At this time, the sub-arm 115 is positioned on the low-temperature thermal processing device LH side so as not to hinder the movement of the main wafer transfer body 16. The sub-arm 115 positioned on the low-temperature thermal processing device LH side moves to a position above the temperature regulating device C1'. The ascending and descending pins 127 descend while the wafer W is mounted thereon, and the wafer W is delivered to the sub-arm 115.

The sub-arm 115 which has received the wafer W moves to the back side in the X-direction. Similarly, the wafer W is mounted on the hot plates 111 and 112 of the low-temperature thermal processing device LH in the next step and the high-temperature thermal processing device HH in the step after next by the movement of the ascending and descending pins to undergo predetermined heat processing.

After the predetermined thermal processing by the high-temperature thermal processing device HH is completed, the wafer W is moved to the temperature regulating device C1' by the sub-arm 115 and mounted on a temperature regulating plate 122 to undergo predetermined temperature regulation processing.

In this embodiment, specially, thermal processing with different temperatures and temperature regulation processing can be performed continuously, thereby raising throughput.

If the temperature regulating device C1', the low-temperature thermal processing device LH, and the high-temperature thermal processing device HH are properly partitioned by shielding plates, temperature control in each device can be performed more precisely.

Figure 30:
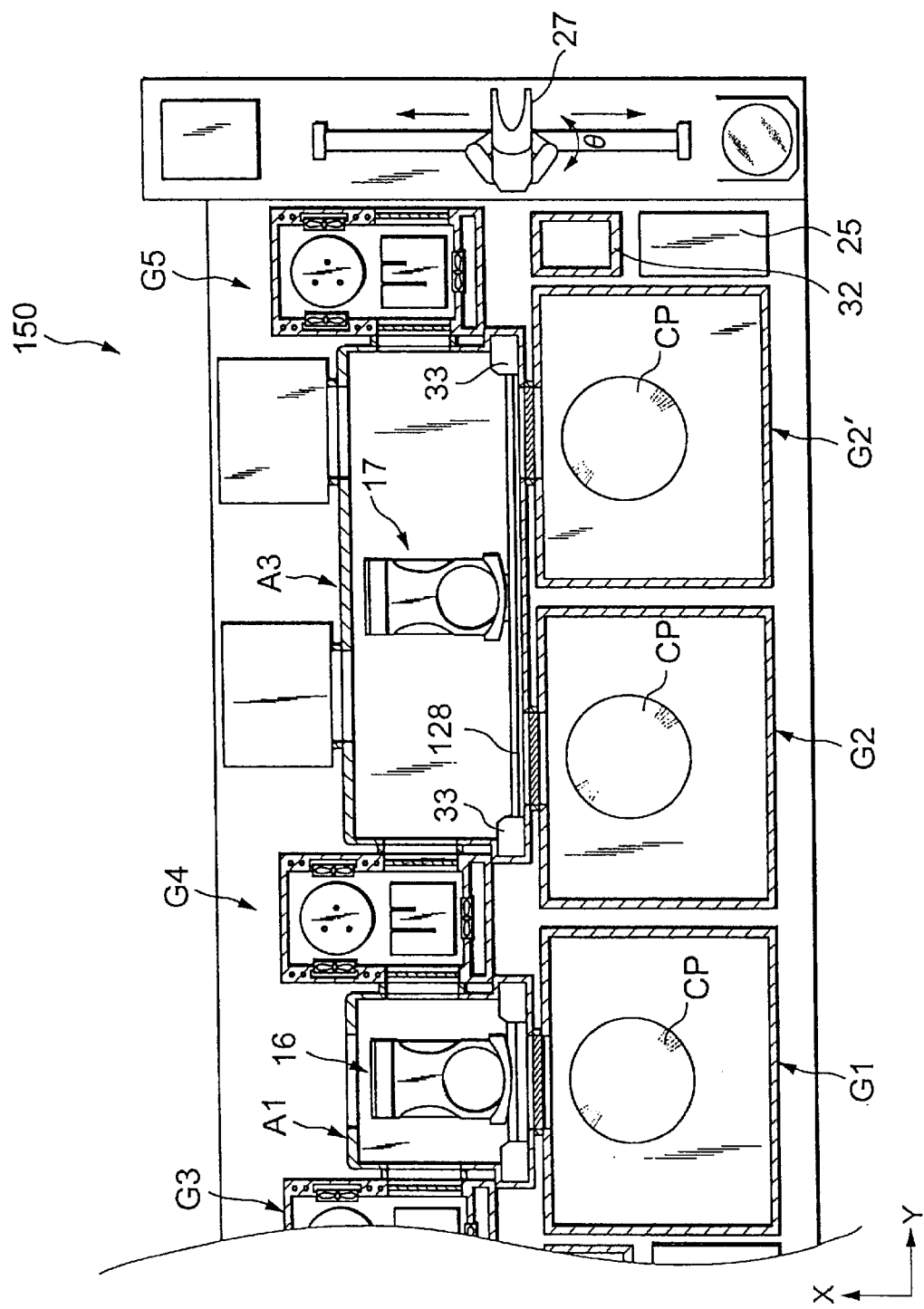
FIG. 30 is a partial plan view of a substrate processing apparatus according to a third embodiment of the present invention.

FIG. 30 shows a substrate processing apparatus according to a third embodiment of the present invention. In this substrate processing apparatus 150, the second main wafer transfer section A2 in the first embodiment is modified, and a coating system processing unit section G2' is added. Except this point, the structure is the same as in the first embodiment. The processing unit section G2' has a resist coating unit (COT) and a developing unit (DEV).

Although the main wafer transfer body 16 (17) itself in the main wafer transfer section A1 (A2) according to the first embodiment does not move in the Y-direction, in a third main transfer section A3 according to the third embodiment, a Y-axis pole 128 is provided so as to permit Y-directional movement. This Y-axis pole 128 is movable along the pole 33 in the vertical direction, and the main wafer transfer body 17 is attached to be movable along the Y-axis pole.

This makes it possible to transfer substrates which can not be processed in the first and second coating system processing unit sections G1 and G2 to the processing unit section G2' by the main wafer transfer body 17 in the third main wafer transfer section A3 to subject the substrates to predetermined coating processing, after substrates are processed in the fourth and fifth processing unit sections G4 and G5. As a result, throughput is improved.

Figure 31:
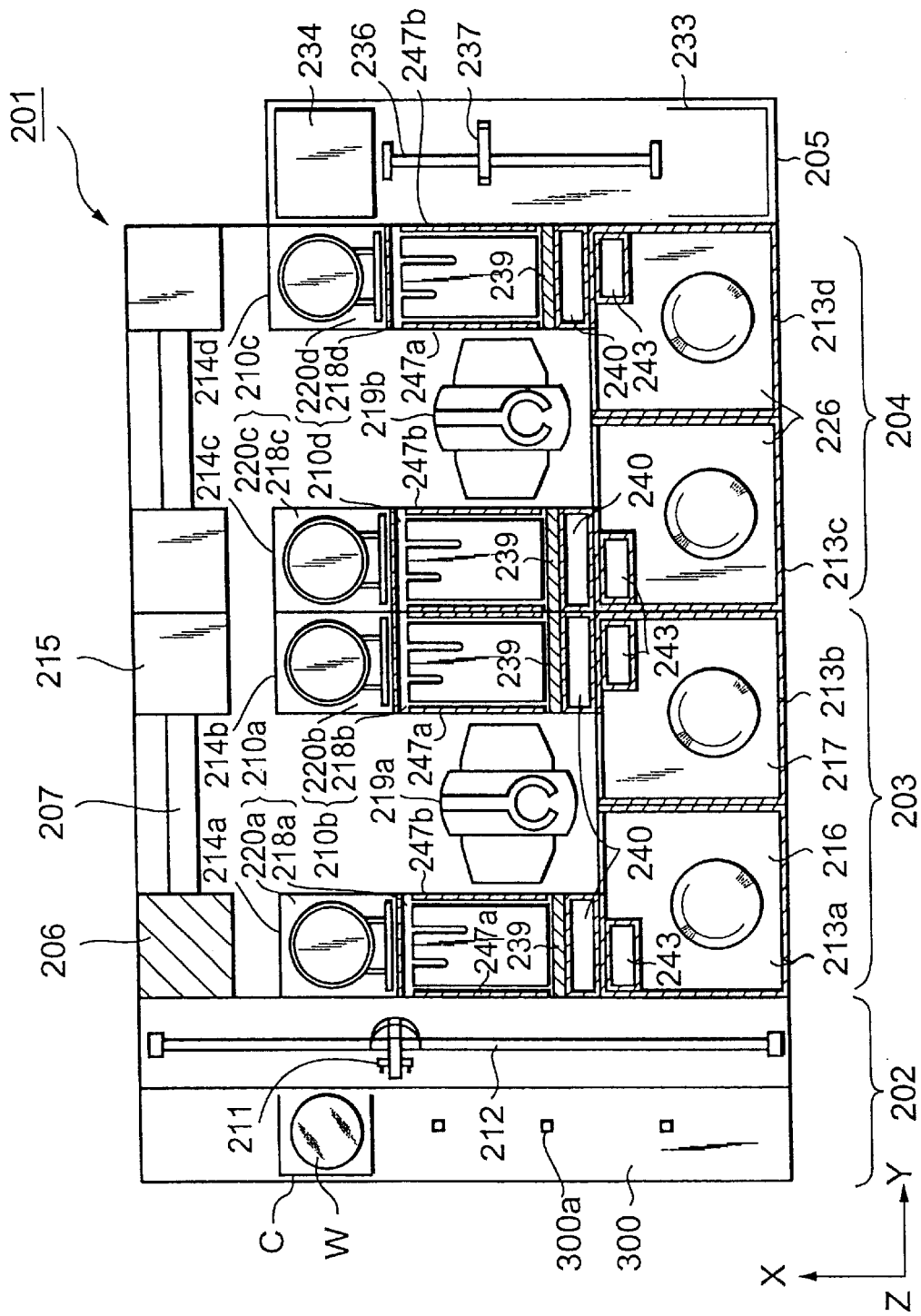
FIG. 31 is a plan view showing a coating and developing processing system according to a fourth embodiment of the present invention.
Figure 32:
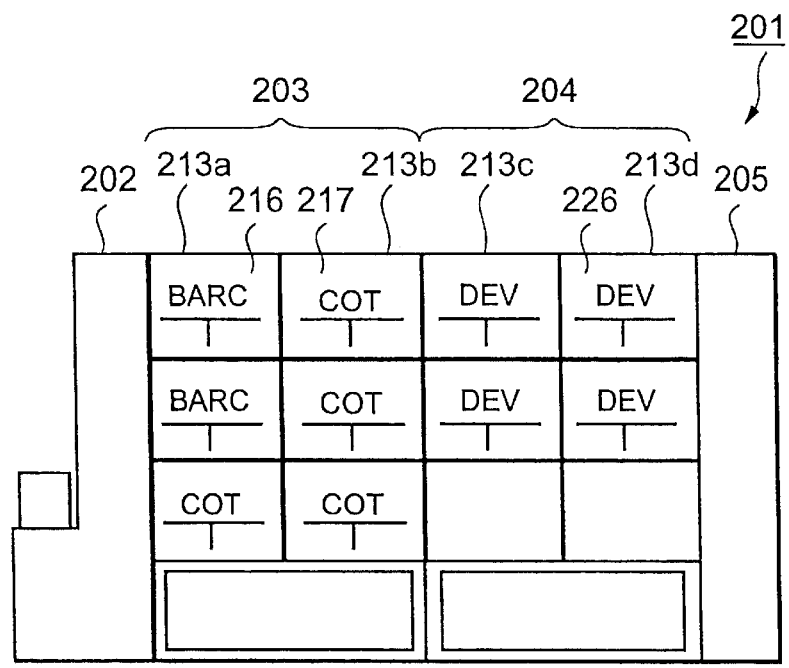
FIG. 32 is a front view of the coating and developing processing system shown in FIG. 31.
Figure 33:
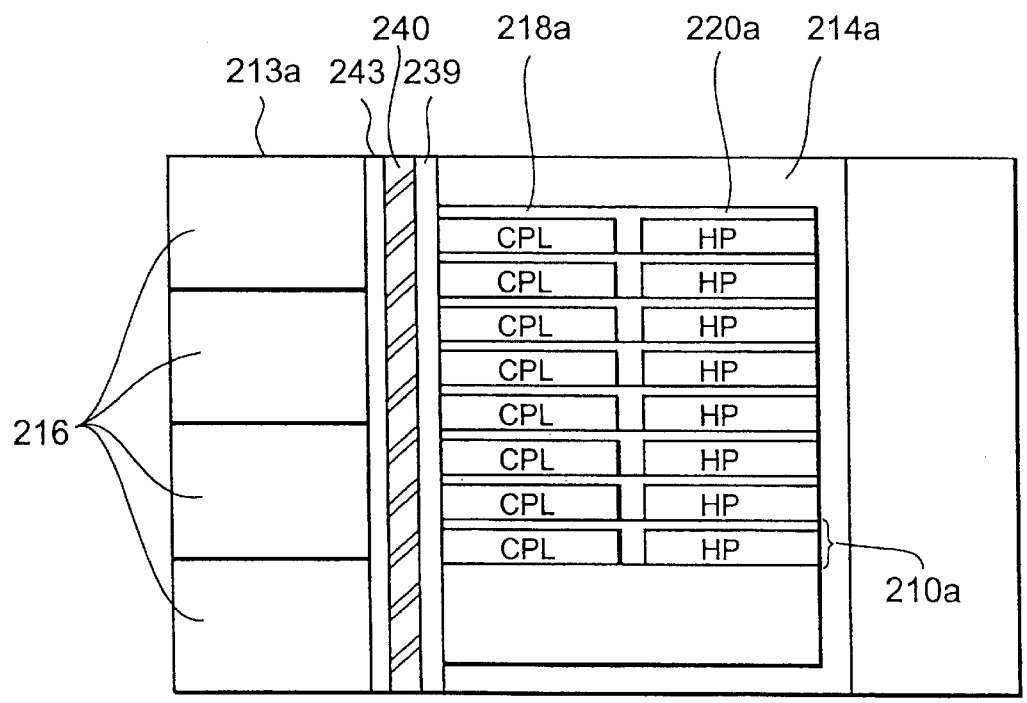
FIG. 33 is a sectional view when an area having a temperature regulation and heat processing unit group in FIG. 31 is sectioned along an X-direction.
Figure 34:
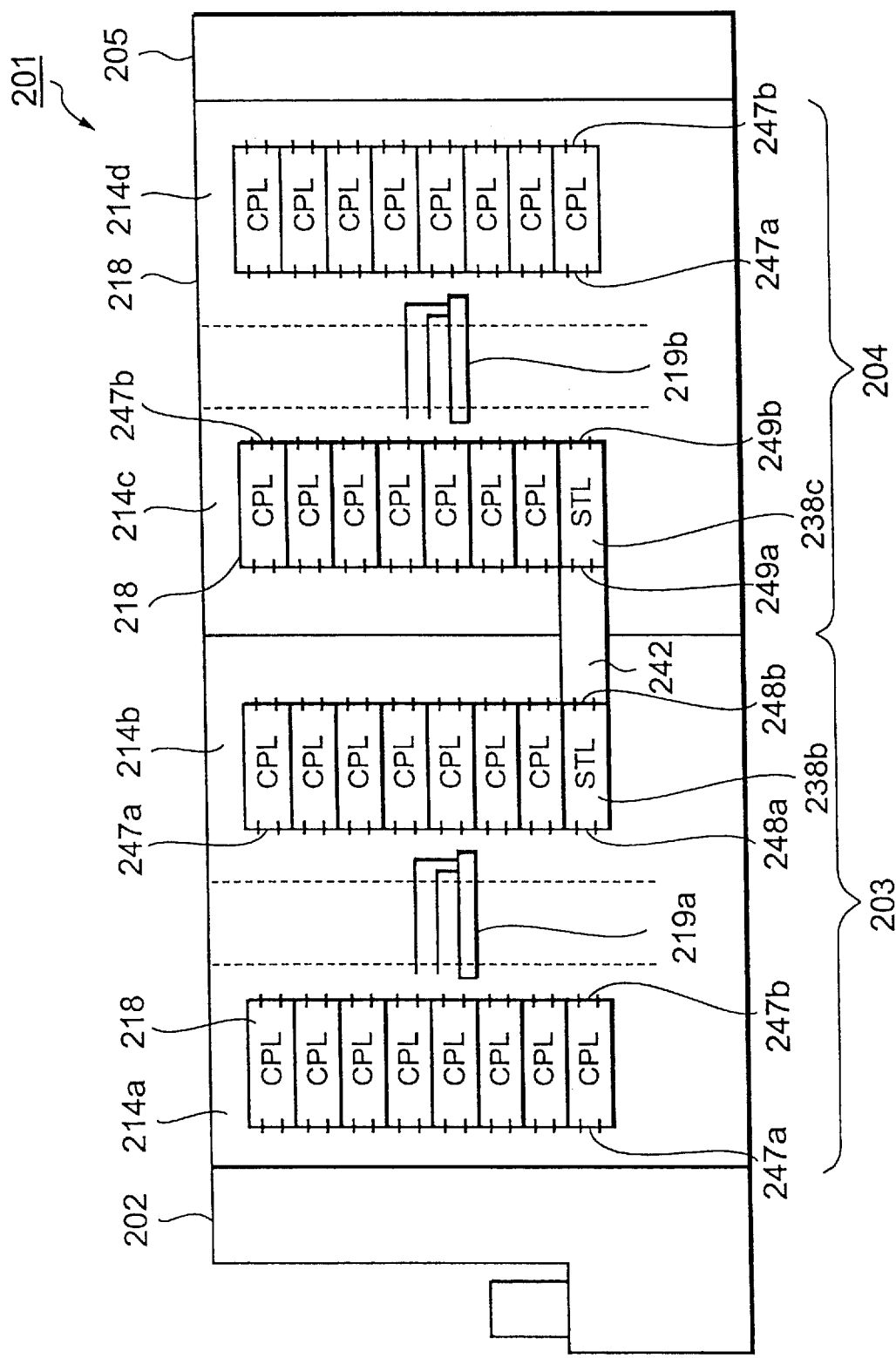
FIG. 34 is a sectional view when an area having temperature regulation processing units in FIG. 31 is sectioned along a Y-direction.

Next, a fourth embodiment of the present invention will be explained with reference to FIG. 31 to FIG. 38. FIG. 31 to FIG. 34 are diagrams showing a coating and developing processing system according to an embodiment of the present invention, FIG. 31 is a plan view, and FIG. 32 is a front view. FIG. 33 is a sectional view taken along the X-direction in FIG. 31, and FIG. 34 is a sectional view when an area having temperature regulation processing units 218 in FIG. 31 is sectioned along the Y-direction in FIG. 31.

As shown in FIG. 31, this coating and developing processing system 201 has structure in which a cassette station 202 for transferring a plurality of, for example, 25 wafers W per cassette C, as a unit, from/to the outside into/from the coating and developing processing system 201 and carrying the wafer W into/out of the cassette C, a first processing station 203 in which various kinds of processing units each for performing predetermined processing for the wafers W one by one in coating and developing processing steps are multi-tiered, a second processing station 204 disposed adjacent to the first processing station and having almost the same structure as the first station, and an interface section 205 for transferring the wafer W from/to an aligner (not illustrated) disposed adjacent to the second processing station 204 are integrally connected. Coating processing of applying an antireflection film and a resist film on the wafer W is mainly performed in the first processing station 203, and developing processing of the exposed resist film is performed in the second processing station 204.

In the cassette station 202, a plurality of cassettes C are mounted in a line in the X-direction (the top-bottom direction in FIG. 31) at the positions of projections 300a on a cassette mounting table 300 with respective transfer ports for the wafer W facing the processing station 203 side. A wafer transfer body 211 movable in the direction of arrangement of the cassettes C (the X-direction) and in the direction of arrangement of the wafers W housed in the wafer cassette CR (the Z-direction; vertical direction) can freely move along a transfer path 212 and selectively get access to each of the cassettes C.

This wafer transfer body 211 is also structured to be able to rotate in the θ-direction so as to get access to a temperature regulation processing unit (CPL) 218a of each of first heating and temperature regulation processing units 210a of the first heating and temperature regulation processing unit group 214a as a second processing unit group in the first processing station 203 which will be described later.

As shown in FIG. 31 and FIG. 32, in the first processing station 203, as first processing unit groups for performing solution processing, an antireflection film coating unit (BARC) group 213a and a resist film coating unit (CT) group 213b are provided at the front. In the antireflection film coating unit (BARC) group 213a, antireflection film coating units (BARC) 216 for performing coating processing for the wafer W about normal temperature are stacked in three tiers in a Z-axis direction. In the resist film coating unit (CT) group 213b, resist film coating units (CT) 217 for performing coating processing for the wafer W about normal temperature are stacked in three tiers in the Z-axis direction.

In the center of the first processing station 203, a first heating and temperature regulation processing unit group 214a and a second heating and temperature regulation processing unit group 214b are arranged as second processing unit groups with a transfer device 219a between them. In the first heating and temperature regulation processing unit group 214a, the first heating and temperature regulation processing units 210a are stacked in eight tiers in the Z-axis direction. In the second heating and temperature regulation processing unit group 214b, second heating and temperature regulation processing units 210b are stacked in seven tiers in the Z-axis direction. In addition, in the lower tier thereof, a transfer unit (STL) is disposed. In the first and second heating and temperature regulation processing units 210a and 210b, temperature regulation processing units (CPL) 218a and 218b each for performing temperature regulation processing for the wafer W and heat processing units (HP) 220a and 220b are disposed adjacent to each other and integrated respectively.

As shown in FIG. 31 and FIG. 33, the first heating and temperature regulation processing unit group 214a is structured by stacking the first heating and temperature regulation processing units 210a, for example, in eight tiers, and the first heating and temperature regulation processing unit group 214a and the antireflection film coating unit (BARC) group 213a are disposed so that the temperature regulation processing unit (CPL) 218a is positioned on the antireflection film coating unit (BARC) group 213a side in each of the first heating and temperature regulation processing units 210a. Incidentally, FIG. 33 is a sectional view taken along the X-direction in FIG. 31 and shows the positional relationship between the first processing unit group 213a and the second processing unit group 214a along the X-direction. The second heating and temperature regulation processing unit group 214b is also structured by stacking the second heating and temperature regulation processing units 210b in multiple tiers, the temperature regulation processing unit (CPL) 218b is positioned on the resist film coating unit (CT) group 213b side in each of the second heating and temperature regulation processing units 210b.

Around a vertical transfer-type transfer device 219a, the antireflection film coating unit (BARC) group 213a, the resist film coating unit (CT) group 213b, the first and second heating and temperature regulation processing unit groups 214a and 214b are arranged. The transfer of the wafer W between the first heating and temperature regulation processing unit group 214a and the antireflection film coating unit (BARC) group 213a and the transfer of the wafer W between the second heating and temperature regulation processing unit group 214b and the resist film coating unit (CT) group 213b are performed by the transfer device 219a. Shutter members 247a and 247b capable of opening and closing are provided at both side faces of the temperature regulation processing unit (CPL) 218a of the first heating and temperature regulation processing unit 210a. The wafer W is delivered from/to the first heating and temperature regulation processing unit 210a to/from the wafer transfer body 211, and from/to the first heating and temperature regulation processing unit 210a to/from the transfer device 219a respectively via the shutter members 247a and 247b. The shutter member 247a capable of opening and closing is provided at one side face on the transfer device side of the temperature regulation processing unit (CPL) 218b of the second heating and temperature regulation processing unit 210b. The wafer W is delivered to/from the transfer device 219a from/to the temperature regulation processing unit (CPL) 218b via the shutter member 247a.

Meanwhile, as shown in FIG. 31 and FIG. 32, in the second processing station 204, similarly to the first processing station 203, as the first processing unit groups for performing solution processing for the wafer W about normal temperature, a first developing processing unit group 213c and a second developing processing unit group 213d are provided at the front. In the first developing processing unit group 213c, developing processing units (DEV) 226 are stacked in two tiers in the Z-axis direction. Also in the second developing processing unit group 213d, developing processing units (DEV) 226 are stacked in two tiers in the Z-axis direction.

In the center of the second processing station 204, a third heating and temperature regulation processing unit group 214c and a fourth heating and temperature regulation processing unit group 214d as the second processing unit groups are arranged with a transfer device 219b between them. In the third heating and temperature regulation processing unit group 214c, third heating and temperature regulation processing units 210c are stacked in seven tiers in the Z-axis direction, and the transfer unit (STL)which will be described later is disposed thereunder. In the fourth heating and temperature regulation processing unit group 214d, fourth heating and temperature regulation processing units 210d are stacked in eight tiers in the Z-axis direction.

In the third and fourth heating and temperature regulation processing units 210c and 210d, temperature regulation processing units (CPL) 218c and 218d each for performing temperature regulation processing for the wafer W and heat processing units (HP) 220c and 220d are disposed adjacent to each other and integrated respectively. As shown in FIG. 31, the third heating and temperature regulation processing unit group 214c and the first developing processing unit (DEV) group 213c are disposed so that the temperature regulation processing unit (CPL) 218c out of the temperature regulation processing unit (CPL) 218c and the heat processing unit (HP) 220c of each of all the stacked third heating and temperature regulation processing units 210c is positioned on the first developing processing unit (DEV) group 213c side. Furthermore, the fourth heating and temperature regulation processing unit group 214d and the second developing processing unit (DEV) group 213d are disposed so that the temperature regulation processing unit (CPL) 218d out of the temperature regulation processing unit (CPL) 218d and the heat processing unit (HP) 220d of each of all the stacked fourth heating and temperature regulation processing units 210d is positioned on the second developing processing unit (DEV) group 213d side.

Around a vertical transfer-type transfer device 219b, the first developing processing unit group 213c, the second developing processing unit group 213d, and the third and fourth heating and temperature regulation processing unit groups 214c and 214d are arranged. The transfer of the wafer W between the third heating and temperature regulation processing unit group 214c and the first developing processing unit (DEV) group 213c and the transfer of the wafer W between the fourth heating and temperature regulation processing unit group 214d and the second developing processing unit (DEV) group 213d are performed by the transfer device 219b. The shutter members 247a and 247b capable of opening and closing are provided at both side faces of the temperature regulation processing unit (CPL) 218d of the fourth heating and temperature regulation processing unit 210d. The wafer W is delivered from/to the fourth heating and temperature regulation processing unit 210d to/from the transfer device 219b, and from/to the fourth heating and temperature regulation processing unit 210d to/from a wafer transfer body 237 respectively via the shutter members 247a and 247b. The shutter member 247b capable opening and closing is provided at one side face on the transfer device side of the temperature regulation processing unit 218c of the third heating and temperature regulation processing unit 210c. The wafer W is delivered to/from the transfer device 219b from/to the temperature regulation processing unit 218c via the shutter member 247b.

As shown in FIG. 31, a container shelf for housing a chemical tower 215 for storing a processing solution to be used in an inspection machine 206 and the first processing unit group 213a is provided at the back of each of the first processing station 203 and the second processing station 204. This container shelf is movable along the Y-direction in FIG. 31 by a rail 207. The container shelf has such structure as a door which can open and close at the back side, for example, and containers can be housed in the door, whereby exchange of containers, maintenance, and inspection can be easily performed. The inspection machine 206 inspects the thickness of a coating film of the wafer W which has undergone exposure and developing processing, and it is placed as required. As the processing solution, for example, there are an antireflection film resist material to be supplied to the antireflection film coating units (BARC) 216, a resist film material to be supplied to the resist film coating units (CT) 217, a developing solution to be supplied to the developing processing units 226. A processing solution stored in the chemical tower 215 disposed at the back may be used as a main processing solution source. Alternatively, it is suitable that the chemical tower 215 disposed at the back is used as a spare, and that another chemical tower is disposed in another area as a main processing solution source.

In the interface section 205, a buffer cassette 233, for example, with the same structure as the cassette C for the wafers W for temporarily holding the unexposed wafer W is disposed at the front thereof, and a peripheral aligner 234 is disposed at the back thereof. The wafer transfer body 237 which is ascendable and descendable in the vertical direction and rotatable in the θ-direction is movable along a transfer path 236 between the buffer cassette 233 and the peripheral aligner 234. The wafer transfer body 237 can get access to the temperature regulation processing units (CPL) 218d of the fourth heating and temperature regulation processing unit 210d, the buffer cassette 233, the peripheral aligner 234, and a pre-exposure temperature regulating unit (not illustrated).

As shown in FIG. 31 and FIG. 33, in the coating and developing processing system 201, heat insulating walls 239 and passages 240 allowing gas exhausted from the bottoms of the first processing unit group 213 to flow to the tops thereof, which will be described later, are disposed between the first processing unit groups 213 (the antireflection film coating unit (BARC) group 213a and the resist film coating unit (CT) group 213b) and the second processing unit groups 214 (the first and second heating and temperature regulation processing unit groups 214a and 214b ) in the first processing station 203, and between the first processing unit groups 213 (the first and second developing processing unit groups 213c and 213d ) and the second processing unit groups 214 (the third and fourth heating and temperature regulation processing unit groups 214c and 214d ) in the second processing station 204. Namely, the heat insulating walls 239 and the passages 240 are disposed so as to divide the first processing unit groups 213 and the second processing unit groups 214.

As shown in FIG. 32, in the aforesaid antireflection film coating unit (BARC) group 213a, the antireflection film coating units (BARC) 216 each for performing antireflection film coating processing for the wafer W by coating the wafer W with an antireflection film while the wafer W is mounted on a spin chuck in a cup are stacked in three tiers.

In the resist film coating unit group 213b, the resist film coating units (CT) each for performing resist coating processing for the wafer W by coating the wafer W with a resist solution while the wafer W is mounted on a spin chuck in a cup are stacked in three tiers.

In the first developing processing unit group 213c, the developing processing units (DEV) 226 each for performing developing processing for the wafer W by supplying a developing solution while the wafer W is mounted on a spin chuck in a cup are stacked in the upper two tiers.

In the second developing processing unit group 213d, the developing processing units (DEV) 226 each for performing developing processing for the wafer W by supplying a developing solution while the wafer W is mounted on a spin chuck in a cup are stacked in the upper two tiers.

In the second and third heating and temperature regulation processing unit groups 214b and 214c, the heating and temperature regulation processing units 210 are stacked in seven tiers respectively, and the transfer units (STL) 238b and 238c are disposed under the stacked units as shown in FIG. 34. The wafer W is transferred between the fist and second processing stations 203 and 204 via a communicating path 242 allowing the two transfer units (STL) 238b and 238c to communicate with each other. As shown in FIG. 34, openings are provided respectively in the transfer units (STL) 238b and 238c, and shutter members 248a, 248b, 249a, and 249b each capable of opening and closing are provided corresponding to the openings. By opening and closing the shutter members 248a and 249b, the wafer W is delivered from/to the transfer units (STL) 238b and 238c to/from the corresponding transfer devices 219a and 219b. Moreover, by opening and closing the shutter members 248b and 249a, the wafer W is transferred between the transfer units (STL) 238b and 238c, that is, between the first and second stations via the communicating path 242.

Next, the aforesaid transfer devices 219a and 219b will be explained by means of FIG. 35 being a perspective view. The aforesaid transfer devices 219a and 219b have the same structure, so that they will be explained by using the numeral 219 in FIG. 35.

Figure 35:
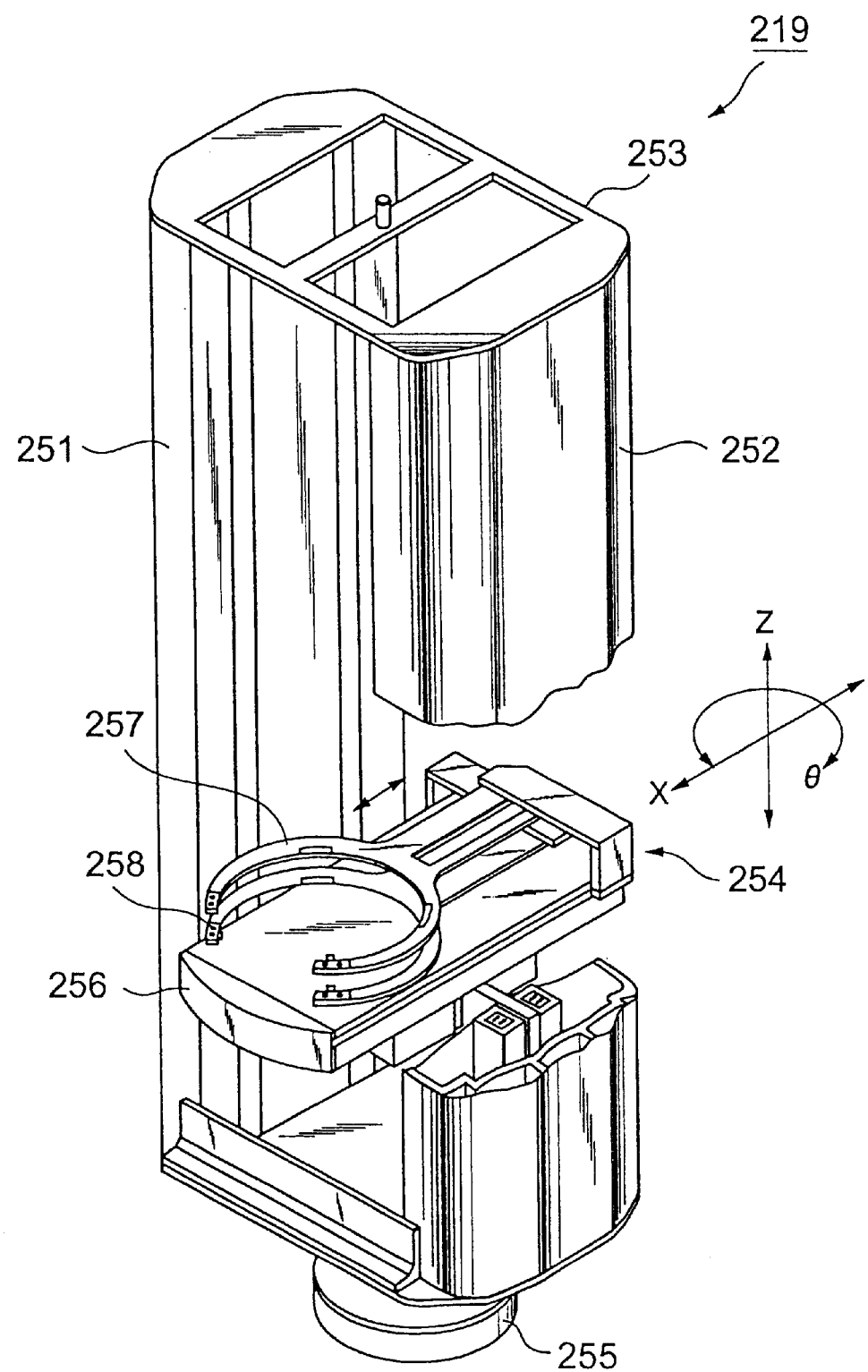
FIG. 35 is a perspective view showing the structure of a transfer device.

As shown in FIG. 35, the transfer device 219 is provided with a wafer W transfer means 254 which is ascendable and descendable in the vertical direction (the Z-direction) inside a cylindrical supporting body 253 composed of a pair of wall portions 251 and 252 which are connected at respective upper ends and lower ends and face each other. The cylindrical supporting body 253 is connected to a rotating shaft of a motor 255 and rotated integrally with the Wafer W transfer means 254 around the rotating shaft by rotational driving force of the motor 255. Accordingly, the wafer W transfer means 254 is rotatable in the θ-direction.

A plurality of, for example, two tweezers 257 and 258 each for holding the wafer W are vertically provided on a transfer base 256 of the wafer W transfer means 254. The tweezers 257 and 258 have basically the same structure and each have a shape and a size capable of freely passing through a side opening between both the wall portions 251 and 252 of the cylindrical supporting body 253. Each of the tweezers 257 and 258 is freely movable in a forward and a backward direction by a motor (not illustrated) contained in the transfer base 256.

Figure 36:
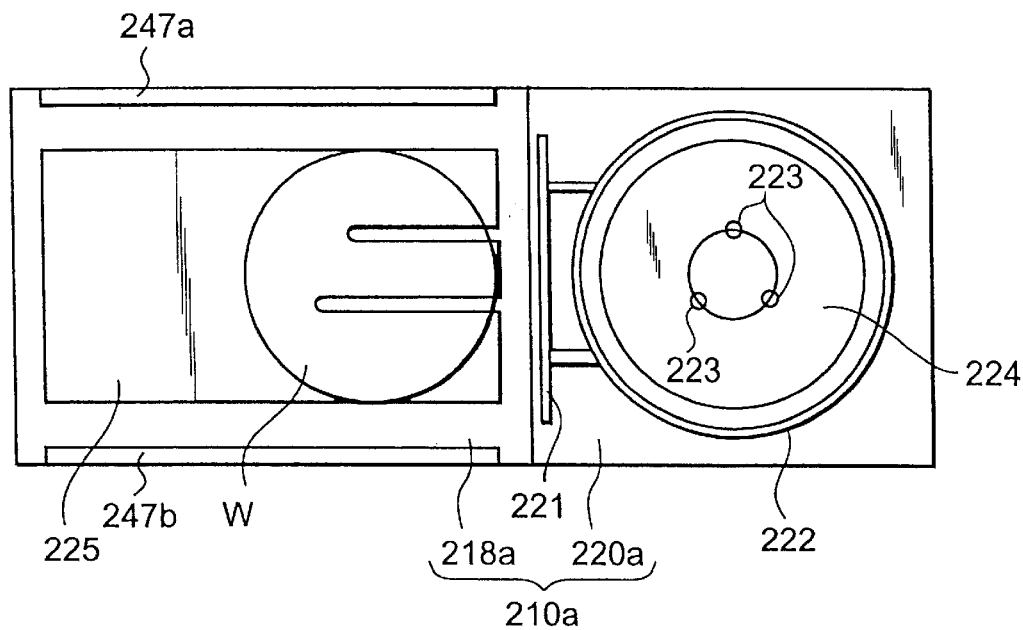
FIG. 36 is a plan view showing the structure of a heating and temperature regulation processing unit.

Next, the structure of the aforesaid first heating and temperature regulation processing unit 210a will be explained by means of FIG. 34, FIG. 36, and FIG. 37. FIG. 36 is a plan view of the heating and temperature regulation processing unit, and FIG. 37 is a sectional view of the heating and temperature regulation processing unit.

Figure 37:
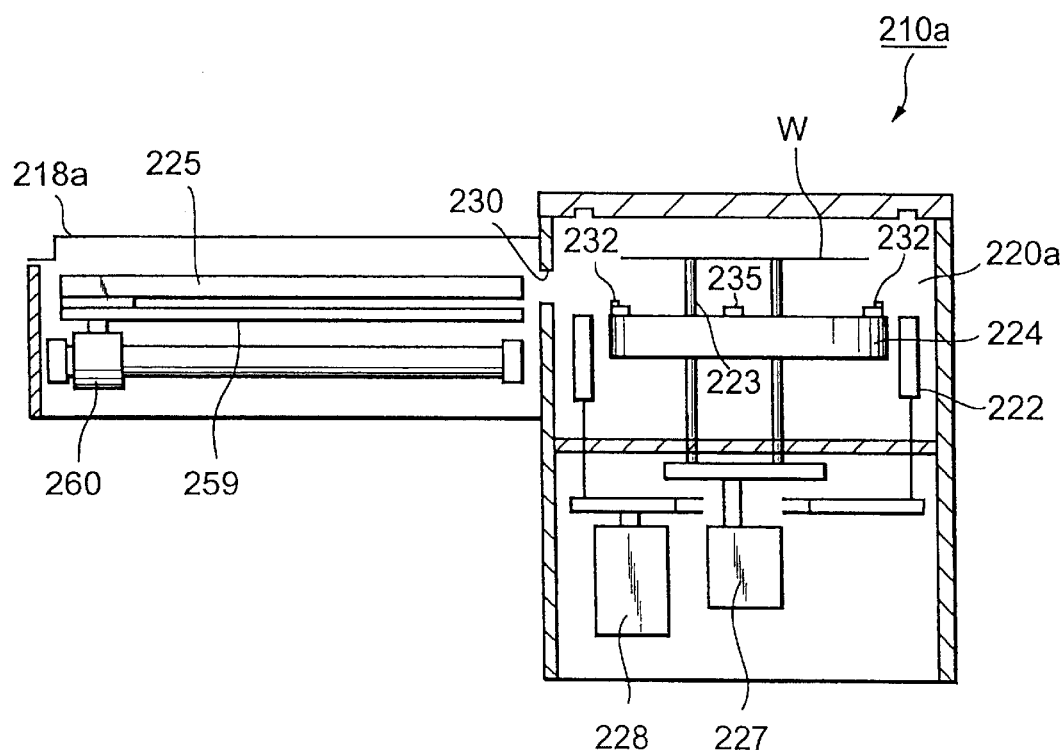
FIG. 37 is a sectional view showing the structure of the heating and temperature regulation processing unit shown in FIG. 36.

As shown in FIG. 36 and FIG. 37, the first heating and temperature regulation processing unit 210a has structure in which the heat processing unit (HP) 220a for performing heat processing for the wafer W and the temperature regulation processing unit (CPL) 218a for performing temperature regulation processing for the wafer W are disposed adjacent to each other and integrated.

The heat processing unit (HP) 220a has a hot plate 224 capable of regulating its set temperature at about 200° C. The heat processing unit (HP) 220a further includes a gate shutter 221 for opening and closing a portion between the heat processing unit (HP) 220a and the temperature regulation processing unit (CPL) 218a and a ring shutter 222 which is raised and lowered together with the gate shutter 221 while surrounding the wafer W around the hot plate 224. Three lifting pins 223 for raising and lowering the wafer W while the wafer W is mounted thereon are provided to be ascendable and descendable in the hot plate 224. A shielding plate screen may be provided between the hot plate 223 and the ring shutter 222. Provided below the heat processing unit 220*a* are a raising and lowering mechanism 227 for raising and lowering the aforesaid three lifting pins 223 and a raising and lowering mechanism 228 for raising and lowering the ring shutter 222 together with the gate shutter 221. A proximity pin 235 with a height of 0.2 mm and guides 232 are placed on the hot plate 223.

The temperature regulation processing unit (CPL) 218*a* has a temperature regulating plate 225 for regulating the temperature of the wafer W at normal temperature about 23° C. As shown in FIG. 34 and FIG. 36, an opening for the delivery of the wafer W from/to the cassette station 202 is provided in a side face on the cassette station side of the temperature regulation processing unit (CPL) 218*a*, and the shutter member 247*a* capable of opening and closing is placed in this opening. Moreover, an opening for the delivery of the wafer W from/to the transfer device 219 is provided in a side face on the transfer device 219 side of the temperature regulation processing unit (CPL) 218*a*, and the shutter member 247*b* capable of opening and closing is placed in this opening.

As shown in FIG. 37, the heat processing unit (HP) 220*a* and the temperature regulation processing unit (CPL) 218*a* communicate with each other through a communicating port 230, and the temperature regulating plate 225 for regulating the temperature of the wafer W while the wafer W is mounted thereon is structured to be movable horizontally along a guide plate 259 by a moving mechanism 260. Thereby, the temperature regulating plate 225 can get into the heat processing unit (HP) 220*a* through the communicating port 230, and receives the wafer W which has been heated by the hot plate 224 in the heat processing unit (HP) 220*a* from the lift pins 223, carries the wafer W into the temperature regulating unit (CPL) 218*a*, and regulates the temperature of the wafer W.

Although the first heating and temperature regulation processing unit 210*a* is explained above, the fourth heating and temperature regulation processing unit 210*d* of the fourth heating and temperature regulation processing unit group 214*d* has the same structure. Also, the second heating and temperature regulation processing unit 210*b* and the third heating and temperature regulation processing unit 210*c* have almost the same structure as the first heating and temperature regulation processing unit 210*a*, but as shown in FIG. 31 and FIG. 34, they are different in that the shutter members 247*a* and 247*b* are provided at both side faces in the first heating and temperature regulation processing unit 210*a*, whereas the shutter member 247*a* or 247*b* is provided only at one side face on the transfer device 219 side in the second and third heating and temperature regulation processing units 210*b* and 210*c*. In this embodiment, opening and closing motion is performed so that both the shutter members 247*a* and the 248*b* do not open simultaneously in each of the temperature processing units (CPL) 218*a* and 218*d*. Namely, one opening is closed by the shutter member 247*b* when another opening is opened by the shutter member 247*a*, whereas one opening is opened by the shutter member 247*b* when another opening is closed by the shutter member 247*a*. The aforesaid control of the opening and closing motion of the shutter members 247*a* and 247*b* permits the temperature regulation processing unit (CPL) to function as a so-called load lock chamber, whereby temperature control in the processing solution supplying units (BARC, CT, and DEV) each for processing the wafer W about normal temperature can be performed more precisely.

As described above, in this embodiment, a temperature regulating mechanism in which the heat insulating walls 239 and the passages 240 allowing gas exhausted from the bottoms of the first processing unit groups 213 to flow to the tops thereof are disposed respectively between the first processing unit groups 213*a*, 213*b*, 213*c*, 213*d* and the second processing unit groups 214*a*, 214*b*, 214*c*, and 214*d*. This temperature regulating mechanism will be explained below by means of FIG. 38. Incidentally, FIG. 38 is a schematic sectional view of the first processing unit group 231*a* in which the processing solution supplying units, the antireflection film coating units (BARC) 216 in this example, are stacked in a plurality of tiers.

Figure 38:
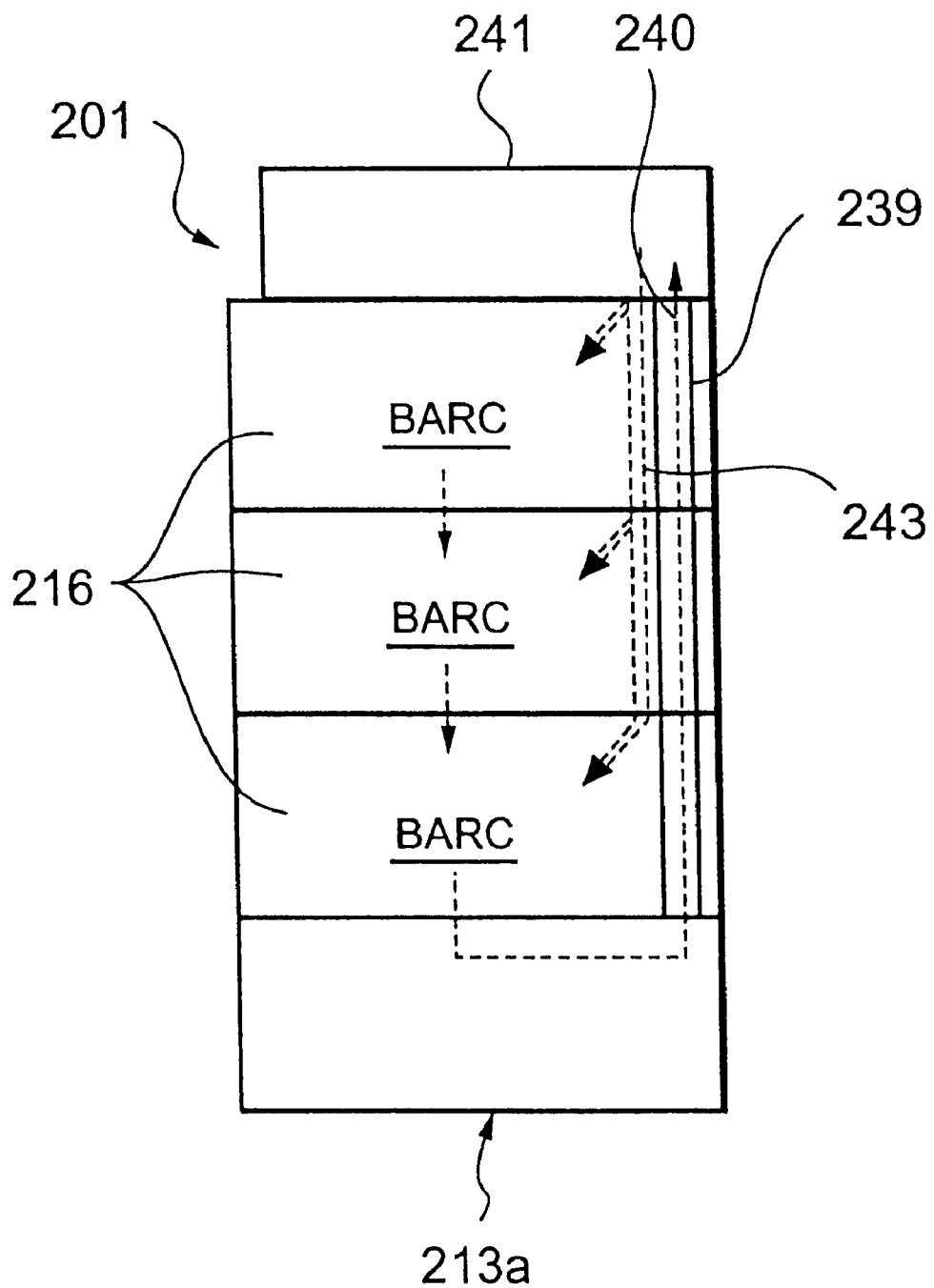
FIG. 38 is a sectional view showing the structure of temperature regulating mechanism.

As shown in FIG. 38, a clean air supplying section 241 for supplying clean air the temperature of which is regulated to the antireflection film coating unit (BARC) group 213*a* as the first processing unit group in the first processing station 203 is disposed at the upper portion of the coating and developing processing system 201. The clean air supplying section 241 includes an FFU (a fan filter unit), a temperature regulating device for regulating the temperature and humidity, and the like, and supplies clean air, which is obtained by regulating the temperature and humidity of gas exhausted from the bottom of the antireflection film coating unit (BARC) group 213*a* and flowing in through the passage 24 allowing the gas to flow to the top thereof and by removing particles and the like from the gas, to each of the antireflection film coating units (BARC) 216. Moreover, as shown in FIG. 31, the heat insulating wall 239 is provided between the passage 240 and the heating and temperature regulation processing units 210*a* as the second processing unit group. In this embodiment, the aforesaid provision of the heat insulating wall and the temperature regulating mechanism allows the temperature control in the processing solution supplying units (BARC, CT, and DEV) each for processing the wafer W about normal temperature to be performed more precisely. Similarly, as shown in FIG. 31, clean air supplying sections 240 and the heat insulating walls 239 are provided individually between the first processing unit groups 213*b*, 213*c*, and 213*d* and the corresponding heating and temperature regulation processing unit groups 214*b*, 214*c*, and 214*d*.

Next, processing steps in the coating and developing processing system 201 structured as above will be explained.

In the coating and developing processing system 201, the unprocessed wafer W housed in the cassette C is taken out by the wafer transfer body 211 of the cassette station 202 and transferred into the temperature regulation processing unit (CPL) 218*a* in the first heating and temperature regulation processing unit 210*a* of the first processing station 203 to undergo temperature regulation processing while being mounted on the temperature regulating plate 225.

The wafer W which has undergone the temperature regulation processing in the temperature regulation processing unit (CPL) 218*a* is transferred into the antireflection film coating unit (BARC) 216 in the antireflection film coating unit (BARC) group 213*a* by the transfer device 219*a*.

The wafer W coated with a processing solution for an antireflection film in the antireflection film coating unit (BARC) 216 is transferred into the temperature regulation processing unit (CPL) 218*a* in the first heating and temperature regulation processing unit 210*a* by the transfer device 219a and mounted on the temperature regulating plate 225. The wafer W mounted on the temperature regulating plate 225 is transferred into the heat processing unit (HP) 220a through the communicating port 230 by the temperature regulating plate 225 which is moved horizontally by the moving mechanism 260 as shown in FIG. 37. The transferred wafer W is supported by the raised lift pins 223. Thereafter, the lift pins 223 are lowered, and thereby the wafer W is mounted on the hot plate 224 and subjected to heat processing in a heat processing space formed by raising the ring shutter 222 and the gate shutter 221. After the completion of the heat processing, the lift pins 223 are raised, and the ring shutter 222 and the gate shutter 221 are lowered. The wafer W is then moved away from the hot plate 224 and supported by the lift pins 223.

Thereafter, the temperature regulating plate 225 is inserted again into the heat processing unit (HP) and receives the wafer W which has undergone the heat processing. The wafer W is transferred into the temperature regulation processing unit (CPL) 218a by the temperature regulating plate 225 to undergo temperature regulation processing.

The wafer W which has undergone the temperature regulation processing in the temperature regulation processing unit (CPL) 218a is transferred into the resist film coating unit (CT) 217 in the resist film coating unit group 213b by the transfer device 219a, and coated with a resist solution.

The wafer W coated with the resist solution in the resist film coating unit (CT) 217 is transferred to the temperature regulation processing unit (CPL) 218b in the second heating and temperature regulation processing unit 210b by the transfer device 219a and mounted on the temperature regulating plate 225. The wafer W mounted on the temperature regulating plate 225 is transferred into the heat processing unit (HP) 220b through the communicating port 230 by the temperature regulating plate 225 which is moved horizontally by the moving mechanism 260. The transferred wafer W is supported by the raised lift pins 223. Thereafter, the lift pins 223 are lowered, and thereby the wafer W is mounted on the hot plate 224 and subjected to heat processing in a heat processing space formed by raising the ring shutter 222 and the gate shutter 221. After the completion of the heat processing, the lift pins 223 are raised, and the ring shutter 222 and the gate shutter 221 are lowered. The wafer W is then moved away from the hot plate 224 and supported by the lift pins 223.

Thereafter, the temperature regulating plate 225 is inserted again into the heat processing unit (HP) 220b and receives the wafer W which has undergone the heat processing. The wafer W is transferred into the temperature regulation processing unit (CPL) 218b to undergo temperature regulation processing.

The wafer W which has undergone the temperature regulation processing in the temperature regulation processing unit (CPL) 218b is transferred to the transfer unit (STL) 238b arranged at the lowest tier of the second heating and temperature regulation processing unit group 214b by the transfer device 219a, and then transferred to the transfer unit (STL) 238c in the third heating and temperature regulation processing unit group 214c through the communicating path 242.

The wafer W transferred to the transfer unit (STL) of the third heating and temperature regulation processing unit group 214c is transferred to the temperature regulation processing unit of the heating and temperature regulation processing unit 210d of the fourth heating and temperature regulation processing unit group 214d by the transfer device 219b.

The wafer W transferred to the temperature regulation processing unit is transferred into the peripheral aligner 234 by the wafer transfer body 237 in the interface section 205 and subjected to wafer edge exposure.

The wafer W which has undergone the wafer edge exposure is transferred to the buffer cassette 233 by the wafer transfer body 237, and temporarily held or transferred to the aligner (not illustrated) via the wafer transfer body 237, the pre-exposure temperature regulating unit (not illustrated) and the wafer transfer body 237.

It is possible here to provide, for example, two buffer cassettes 233, and to use one as a cassette for holding the wafer W before wafer edge exposure and the other as a cassette for holding the wafer W before wafer edge exposure. On this occasion, it is desirable to provide a mechanism for regulating the temperature of the wafer W at a normal temperature about 23° C. in the cassette for holding the wafer W before wafer edge exposure. Alternatively, it is suitable that the buffer cassette 233 holds the wafer W which has undergone wafer edge exposure only and that the vacant temperature regulation processing unit 218c or 218d out of the heating and temperature regulation unit 210c or 210d in the second processing unit group 214c or 214d can be used as a place for making the wafer W which has not undergone wafer edge exposure yet wait. In this case, it is unnecessary to provide the buffer cassette for holding the wafer W before wafer edge exposure.

Thereafter, the wafer W which has undergone exposure processing by the aligner is transferred from the interface section 205 into the temperature regulation processing unit (CPL) 218d of the fourth heating and temperature regulation processing unit 210d in the fourth heating and temperature regulation processing unit group 214d of the second processing station 204 via the wafer transfer body 237, the buffer cassette 233, and the wafer transfer body 237, and subjected to temperature regulation processing.

The wafer W which has undergone the temperature regulation processing in the temperature regulation processing unit (CPL) 218d is transferred to the developing processing unit (DEV) 226 in the first developing processing unit group 213c or the second developing processing unit group 213d by the transfer device 219b, and subjected to developing processing.

The wafer W which has undergone the developing processing in the developing processing unit (DEV) 226 is transferred into the heat processing unit (HP) adjacent to the temperature regulation processing unit (CPL) 218c, for example, via the temperature regulation processing unit (CPL) 218c of the heating and temperature regulation processing unit 210c in the third heating and temperature regulation processing unit group 214c by the transfer device 219b, and subjected to heat processing.

The wafer W which has undergone the heat processing in the heat processing unit (HP) 220c is transferred to the temperature regulation processing unit 218c, then transferred to the transfer unit (STL) 238c in the second processing station 204 by the transfer device 219b, and then transferred to the transfer unit (STL) 238b in the first processing station 203 through the communicating path 242.

The wafer W transferred to the transfer unit (STL) is transferred to the temperature regulation processing unit 218a of the first heating and temperature regulation processing unit 210a in the first heating and temperature regulation processing unit group 214a by the transfer device 219a. The wafer W in the temperature regulation processing unit 218a is housed in the cassette C by the wafer transfer body 211 of the cassette station 202. When the inspection machine 206 is provided, the wafer W in the temperature regulation processing unit 218a is transferred to the inspection machine 206 by the wafer transfer body 211 of the cassette station 202. In the inspection machine 206, it is judged whether a pattern width obtained by exposure and developing processing is appropriate or not by measuring the thickness of a resist film. The inspected wafer W is housed in the cassette C by the wafer transfer body 211 of the cassette station 202.

According to the coating and developing processing system in accordance with this embodiment structured as above, the temperature regulation processing unit (CPL) is placed between the solution processing unit and the heat processing unit (HP) by placing the temperature processing unit (CPL) of the heating and temperature regulation processing unit on the solution processing unit side, whereby the thermal influence of the heat processing units on the solution processing unit side can be held to a great extent. Accordingly, in the coating and developing processing system, temperature control in the solution processing units (BARC, CT, and DEV) for performing solution processing for the wafer W can be performed precisely.

Furthermore, according to the coating and developing processing system in accordance with this embodiment, the heat insulating walls 239 and the passages 240 allowing gas exhausted from the bottoms of the solution processing unit groups 213a, 213b, 213c, and 213d to flow to the tops thereof are disposed between the solution processing unit groups(the antireflection film coating unit (BARC) group 213a, the resist film coating unit (CT) group 213b, the first developing processing unit group 213c, and the second developing processing unit group 213d) and the heating and temperature regulation processing unit groups (the first to fourth heating and temperature regulation processing unit groups 214a, 214b, 214c, and 214d) in the first and second processing stations 203 and 204. Thereby, the passages 240 have the function of heat insulating means, and thus double heat insulating means are disposed between the first processing unit group 213 and the second processing unit group 214. As a result, the thermal influence of the heat processing units of the heating and temperature regulation processing units on the solution processing unit groups can be inhibited, and temperature control in the solution processing unit groups each for performing solution processing for the wafer W about normal temperature can be performed very precisely.

Figure 39:
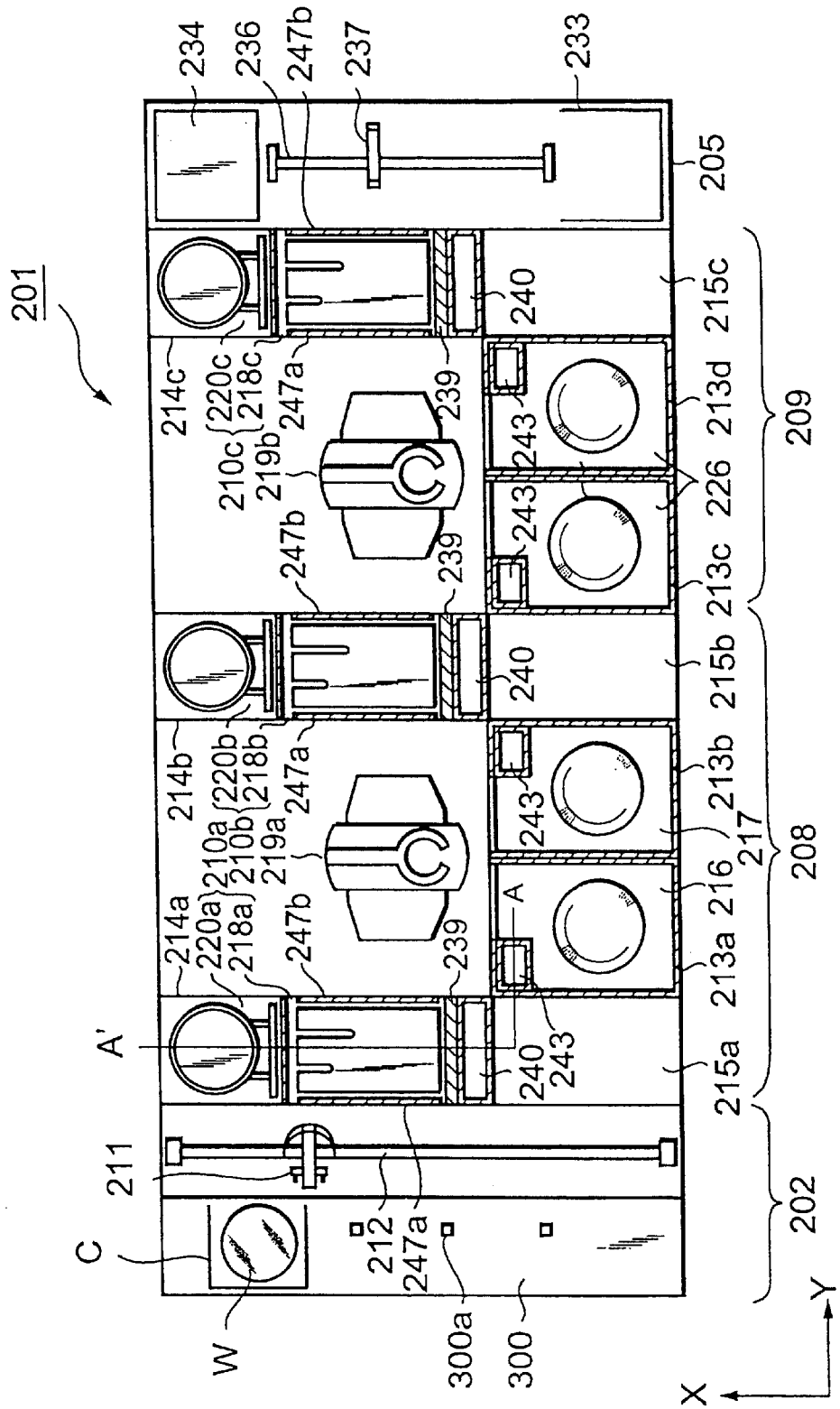
FIG. 39 is a plan view showing a coating and developing processing system according to a fifth embodiment of the present invention.
Figure 40:
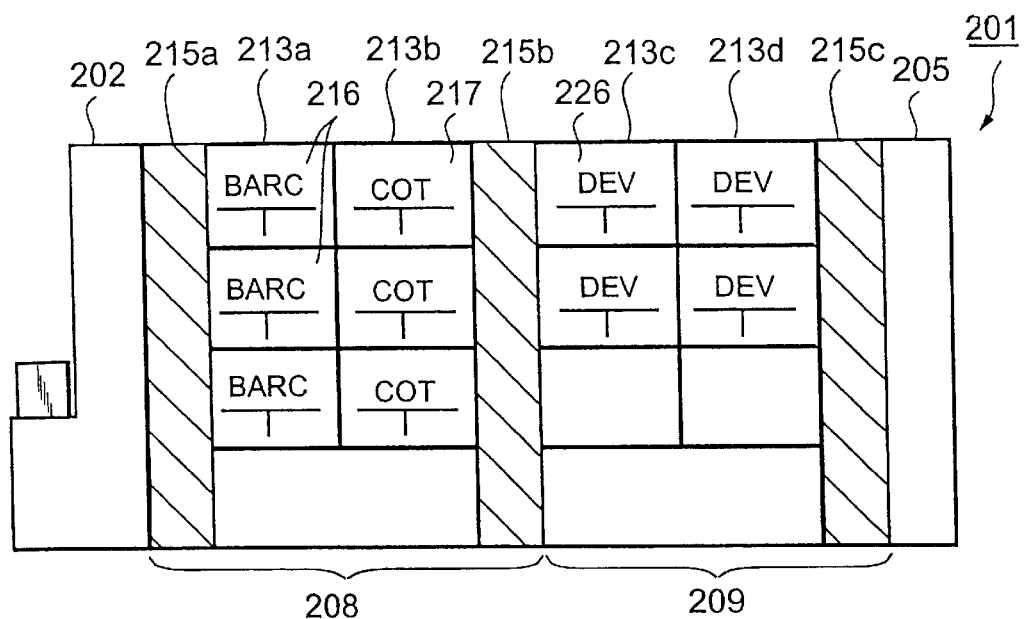
FIG. 40 is a front view of the coating and developing processing system shown in FIG. 39.
Figure 41:
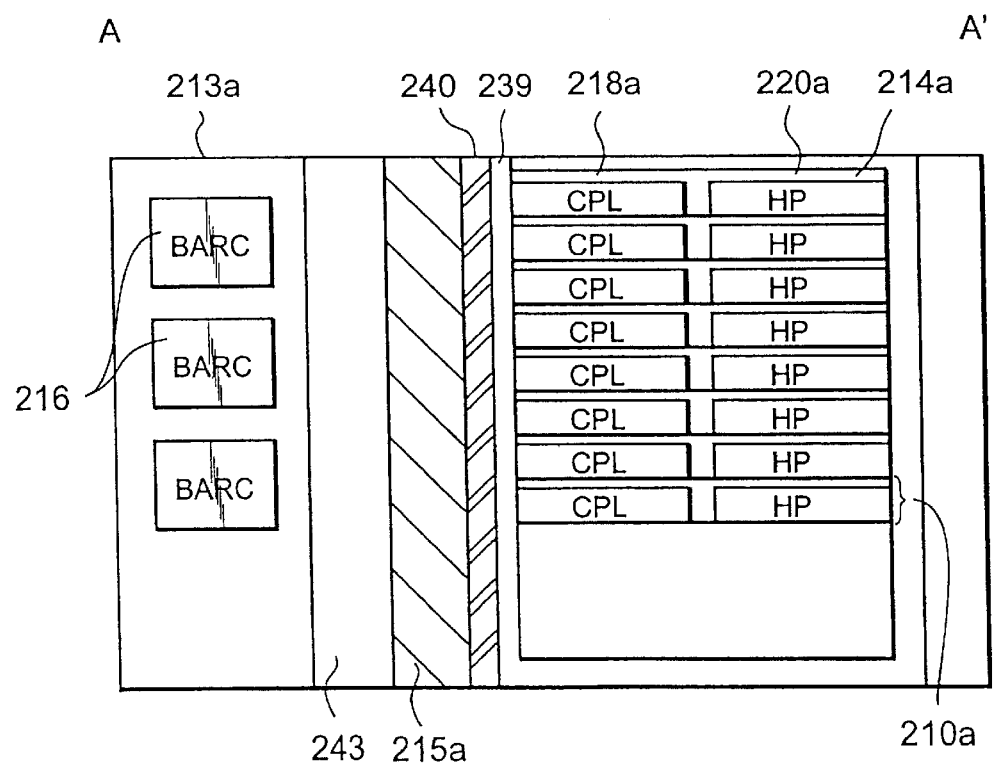
FIG. 41 is a sectional view taken along the line A–A' in FIG. 39.

Next, a fifth embodiment of the present invention will be explained with reference to FIG. 39 to FIG. 41. FIG. 39 and FIG. 41 are diagrams showing a coating and developing processing system according to an embodiment of the present invention, FIG. 39 is a plan view, and FIG. 40 is a front view. FIG. 41 is a sectional view taken along the line A–A' in FIG. 39, showing the positional relationship in the X-direction between the first processing unit group 213a, the second processing unit group 214a, and the chemical tower 215a.

This embodiment is different from the aforesaid fourth embodiment in terms of structure in the placement of the chemical tower for storing the processing solution and in that the number of the heating and temperature regulation processing device placed between two transfer devices 219a and 219b is one. The fifth embodiment will be explained below, but the explanation of the same structure as in the fourth embodiment will be partially omitted. Moreover, the same numerals and symbols will be used to designate the same components as those in the fourth embodiment.

As shown in FIG. 39, this coating and developing processing system 201 has structure in which the same cassette station 202 as in the fourth embodiment, a first processing station 208 in which various kinds of processing units each for performing predetermined processing for the wafers W one by one in coating and developing processing steps are multi-tiered, a second processing station 209 disposed adjacent to the first processing station, and the interface section 205 for transferring the wafer W from/to an aligner (not illustrated) disposed adjacent the second processing station 209 are integrally connected. Coating processing of applying an antireflection film and a resist film on the wafer W is mainly performed in the first processing station 208, and developing processing of the exposed resist film is performed in the second processing station 209.

The cassette station 202 has the same structure as in the fourth embodiment, so that the explanation thereof will be omitted.

As shown in FIG. 39 and FIG. 40, in the first processing station 208, as first processing unit groups for performing solution processing, the antireflection film coating unit (BARC) group 213a and the resist film coating unit (CT) group 213b are provided at the front. In the antireflection film coating unit (BARC) group 213a, the antireflection film coating units (BARC) 216 for performing coating processing for the wafer W about normal temperature are stacked in three tiers in the Z-axis direction. In the resist film coating unit (CT) group 213b, resist film coating units (CT) 217 for performing coating processing for the wafer W about normal temperature are stacked in three tiers in the Z-axis direction. Moreover, chemical towers 215a and 215b are disposed respectively adjacent to the antireflection film coating unit (BARC) group 213a and the resist film coating unit (CT) group 213b. The chemical tower 215a stores an antireflection film material as a processing solution to be supplied to the antireflection film coating units (BARC) 216, and the chemical tower 215b stores a resist material as a processing solution to be supplied to the resist film coating units (CT) 217.

At the back of the first processing station 208, the first heating and temperature regulation processing unit group 214a and the second heating and temperature regulation processing unit group 214b are arranged as the second processing unit groups with the transfer device 219a between them. The first heating and temperature regulation processing unit group 214a and the second heating and temperature regulation processing unit group 214b are arranged respectively adjacent to the chemical towers 215a and 215b. In the first heating and temperature regulation processing unit group 214a, the first heating and temperature regulation processing units 210a are stacked in eight tiers in the Z-axis direction. In the second heating and temperature regulation processing unit group 214b, the second heating and temperature regulation processing units 210b are stacked in eight tiers in the Z-axis direction. In the first and second heating and temperature regulation processing units 210a and 210b, the temperature regulation processing units (CPL) 218a and 218b for performing temperature regulation processing for the wafer W and heat processing units (HP) 220a and 220b for performing heat processing are disposed adjacent to each other and integrated, respectively.

As shown in FIG. 41, the first heating and temperature regulation processing unit group 214a is structured by stacking the first heating and temperature regulation processing units 210a in multiple tiers. Incidentally, FIG. 41 is a sectional view taken along the line A–A' in FIG. 39, showing the positional relationship between the first processing unit group 213a, the chemical tower 215a, and the second processing unit group 214a along the X-direction. As shown in FIG. 39 and FIG. 41, the first heating and temperature regulation processing unit group 214a as the second processing unit group is structured by stacking the first heating and temperature regulation processing units 210a in eight tiers, and the temperature regulation processing unit (CPL) 218a out of the heat processing unit (HP) 220a and the temperature regulation processing unit (CPL) 218a is positioned on the side of the chemical tower 215a as a processing solution supplying section in each of the first heating and temperature regulation processing units 210a. The antireflection film coating unit group 213a as the first processing unit group is disposed adjacent to the chemical tower 215a. Similarly, the second heating and temperature regulation processing unit group 214b is structured by stacking the second heating and temperature regulation processing units 210b in eight tiers, and the temperature regulation processing unit (CPL) 218b out of the heat processing unit (HP) 220b and the temperature regulation processing unit (CPL) 218b is positioned on the side of the chemical tower 215b as a processing solution supplying section in each of the second heating and temperature regulation processing units 210b. The resist film coating unit group 213b and the first developing processing unit group 213c which will be described later as the first processing unit groups are disposed adjacent to this chemical tower 215b.

Around the vertical transfer-type transfer device 219a, the antireflection film coating unit (BARC) group 213a, the resist film coating unit (CT) group 213b, the first and second heating and temperature regulation processing unit groups 214a and 214b are arranged. The structures of the transfer device 219a, the antireflection film coating unit (BARC) group 213a, the resist film coating unit (CT) group 213b, and the first heating and temperature regulation processing unit group 214a in the first processing station 208 are the same as those in the first processing station 203 in the aforesaid fourth embodiment, so that the derailed explanation thereof will be omitted. The second heating and temperature regulation processing unit group 214b in this embodiment is different from the second heating and temperature regulation processing unit group 214b in the aforesaid fourth embodiment in terms of structure in that the shutter members 247a and 247b are provided at both side faces and in that the transfer unit (STL) is not provided. In this embodiment, the wafer W can be transferred between the first processing station 208 and the second processing station 209 which will be described later via the temperature regulation processing unit 218b of each of the second heating and temperature regulation processing units 210b in the second heating and temperature regulation processing unit group 214b. Therefore, the shutter members 247a and 247b are provided at both side faces of each temperature regulation processing unit 218b.

Meanwhile, as shown in FIG. 39 and FIG. 40, in the second processing station 209, similarly to the first processing station 208, as the first processing unit groups for performing solution processing for the wafer W about normal temperature, the first developing processing unit group 213c and the second developing processing unit group 213d are disposed at the front. In the first developing processing unit group 213c, the developing processing units (DEV) 226 are stacked in two tiers in the Z-axis direction. Also in the second developing processing unit group 213d, the developing processing units (DEV) 226 are stacked in two tiers in the Z-axis direction. Moreover, a chemical tower 215c is disposed adjacent to the second developing processing unit group 213d. This chemical tower 215c stores a developing solution as a processing solution to be supplied to the developing processing units (DEV) 226.

At the back of the second processing station 209, the third heating and temperature regulation processing unit group 214c as the second processing unit group is disposed to face the second heating and temperature regulation processing unit group 210b with the transfer device 219b between them. The third heating and temperature regulation processing unit group 214c is disposed adjacent to the chemical tower 215c, and structured by stacking the third heating and temperature regulation processing units 210c in eight tiers the Z-axis direction.

In each of the third heating and temperature regulation processing units 210c, the temperature regulation processing unit (CPL) 218c for performing temperature regulation processing for the wafer W and the heat processing unit (HP) 220c for performing heat processing are disposed adjacent to each other and integrated. As shown in FIG. 39, the temperature regulation processing unit (CPL) 218c out of the temperature regulation processing unit (CPL) 218c and the heat processing unit (HP) 220c of each of all the stacked third heating and temperature regulation processing units 210c is positioned on the side of the chemical tower 215c as a processing solution supplying section. The second developing processing unit (DEV) group 213d as the first processing unit group is disposed adjacent to this chemical tower 215c.

Around the vertical transfer-type transfer device 219b, the first developing processing unit group 213c, the second developing processing unit group 213d, the second and third heating and temperature regulation processing unit groups 214b and 214c are arranged. In this case, the second heating and temperature regulation processing unit group 214b can cope with all of heat processing or temperature regulation processing before or after the formation of a coating film on the wafer, and heat processing or temperature regulation processing before or after developing processing. The transfer of the wafer W between the second heating and temperature regulation processing unit group 214b and the third heating and temperature regulation processing unit group 214, the transfer of the wafer W between the second heating and temperature regulation processing unit group 214b and the first or the second developing processing unit (DEV) group 213c or 213d, and the transfer of the wafer W between the third heating and temperature regulation processing unit group 214c and the first or the second developing processing unit (DEV) group 213c or 213d are performed by the transfer device 219b. The wafer W is delivered from/to the second and the third heating and temperature regulation processing unit group 214b and 214c to/from the transfer device 219b respectively via the shutter members 247b and 247a which are provided in the temperature regulation processing units 218b and 218c. Also, the wafer W is delivered from/to the temperature regulation processing units 218b of the third heating and temperature regulation processing units 210c to/from the wafer transfer body 237 via the shutter member 247b of the temperature regulation processing unit 218c.

The interface section 205 has the same structure as the interface section 205 in the aforesaid fourth embodiment, so that the explanation thereof will be omitted.

Furthermore, as shown in FIG. 39 and FIG. 41, in the coating and developing processing system 201, the chemical towers 215 (215a, 215b, and 215c) are disposed between the first processing unit groups 213 (the antireflection film coating unit (BARC) group 213a, the resist film coating unit (CT) group 213b, the first developing processing unit (DEV) group 213c, and the second developing processing unit (DEV) group 213d) and the second processing unit groups 214 (the first heating and temperature regulation processing unit group 214a, the second heating and temperature regulation processing unit group 214b, and the third heating and temperature regulation processing unit group 214c) respectively in the first processing station 208 and the second processing station 209, and in addition, the heat insulating walls 239 and the passages 240 allowing gas exhausted from the bottoms of the first processing unit groups 213 to flow to the tops thereof are disposed between the chemical towers 215 and the second processing unit groups 214. The passage 240 and the heat insulating wall 239 provided adjacent to the chemical tower 215b function as a temperature regulating mechanism and a heat insulating means for two first processing unit groups 213b and 213c corresponding to one second processing unit group 214b. In this embodiment, similarly to the aforesaid fourth embodiment, a clean air supplying section for supplying clean air the temperature of which is regulated to the first processing unit groups from above is disposed at the upper portion of the coating and developing processing system. The clean air supplying section includes an FFU (a fan filter unit), a temperature regulating device for regulating the temperature and humidity, and the like, and supplies clean air, which is obtained by regulating the temperature and humidity of gas exhausted from the bottoms of the first processing unit groups and flowing in through the passage 240 allowing the gas to flow to the tops thereof and by removing particles and the like from the gas, to the first processing units. Also in this embodiment, likewise with the aforesaid fourth embodiment, temperature control in the processing solution supplying units (BARC, CT, and DEV) for processing the wafer W about normal temperature can be performed precisely by providing temperature regulating mechanisms in which the heat insulating walls 239 and the passages 240 allowing gas exhausted from the bottoms of the first processing unit groups 213 to flow to the tops thereof. Moreover, the passages 240 have the function of heat insulating means, and thus double heat insulating means are disposed by providing the heat insulating walls 239 and the passages 240 between the second processing unit groups 214 and the chemical towers 215. As a result, temperature control in the solution processing unit groups each for performing solution processing for the wafer W about normal temperature can be performed very precisely, and the processing solutions stored in the chemical towers 215 do not easily receive a thermal influence from the heat processing units 220, thereby facilitating the temperature regulation of the processing solution.

As shown in FIG. 40, in the aforesaid antireflection film coating unit (BARC) group 213a, the antireflection film coating units (BARC) 216 each for performing antireflection film coating processing for the wafer W by coating the wafer W with an antireflection film while the wafer W is mounted on a spin chuck in a cup are stacked in three tiers. In the resist film coating unit group 213b, the resist film coating units (CT) each for performing resist film coating processing for the wafer W by coating the wafer W with a resist solution while the wafer W is mounted on a spin chuck in a cup are stacked in three tiers. In the first developing processing unit group 213c, the developing processing units (DEV) 226 each for performing developing processing for the wafer W by supplying a developing solution while the wafer W is mounted on a spin chuck in a cup are stacked in the upper two tiers. Similarly, in the second developing processing unit group 213d, the developing processing units (DEV) 226 each for performing developing processing for the wafer W by supplying the developing solution while the wafer W is mounted on a spin chuck in a cup are stacked in the upper two tiers.

In each of the first, second, and third heating and temperature regulation processing unit groups 214a, 214b, and 214c, the heating and temperature regulation processing units 210 in each of which the heat processing unit (HP) 220 for performing heat processing for the wafer W and the temperature regulation processing unit (CPL) 218 for performing temperature regulation processing for the wafer W are disposed adjacent to each other and integrated are stacked in eight tiers, and as described above, the shutter members 247a and 247b are provided on side faces of each temperature regulation processing unit. The structure of the heating and temperature regulation processing unit 210 in this embodiment is the same as in the aforesaid fourth embodiment, and thus the explanation thereof is omitted.

The structures of the transfer devices 219a and 219b are the same as those of the transfer devices 219a and 219b in the aforesaid fourth embodiment, and thus the explanation thereof is omitted.

Next, processing steps in the coating and developing processing system 201 structured as above will be explained. Operations in the heating and temperature regulation processing unit are the same as in the aforesaid fourth embodiment, and thus the explanation thereof is omitted.

In the coating and developing processing system 201, the unprocessed wafer W housed in the cassette C is taken out by the wafer transfer body 211 of the cassette station 202 and transferred into the temperature regulation processing unit (CPL) 218a in the first heating and temperature regulation processing unit 210a of the first processing station 208 to undergo temperature regulation processing while being mounted on the temperature regulating plate 225.

The wafer W which has undergone the temperature regulation processing in the temperature regulation processing unit (CPL) 218a is transferred into the antireflection film coating unit (BARC) 216 in the antireflection film coating unit (BARC) group 213a by the transfer device 219a, and coated with a processing solution for an antireflection film.

The wafer W coated with the processing solution for the antireflection film in the antireflection film coating unit (BARC) 216 is transferred into the temperature regulation processing unit (CPL) 218a of the first heating and temperature regulation processing unit 210a by the transfer device 219a and mounted on the temperature regulating plate 225. The wafer W mounted on the temperature regulating plate 225 is transferred into the heat processing unit (HP) 220a to be subjected to heat processing.

Thereafter, the wafer W is transferred into the temperature regulation processing unit (CPL) 218a to be subjected to temperature regulation processing.

The wafer W which has undergone the temperature regulation processing in the temperature regulation processing unit (CPL) 218a is transferred into the resist film coating unit (CT) 217 in the resist film coating unit group 213b by the transfer device 219a, and coated with a resist solution.

The wafer W coated with the resist solution in the resist film coating unit (CT) 217 is transferred to the temperature regulation processing unit (CPL) 218b of the second heating and temperature regulation processing unit 210b by the transfer device 219a. The wafer W is then transferred into the heat processing unit (HP) 220b and subjected to heat processing.

Thereafter, the wafer W is transferred into the temperature regulation processing unit (CPL) 218b to undergo temperature regulation processing. The wafer W which has undergone the temperature regulation processing in the temperature regulation processing unit (CPL) 218b is transferred to the temperature regulation processing unit 218c of the heating and temperature regulation processing unit 210c in the third heating and temperature regulation processing unit group 214c by the transfer device 219b.

The wafer W transferred to the temperature regulation processing unit is transferred into the peripheral aligner 234 by the wafer transfer body 237 in the interface section 205 and subjected to wafer edge exposure.

The wafer W which has undergone the wafer edge exposure is transferred to the buffer cassette 233 by the wafer transfer body 237, and temporarily held or transferred to the aligner (not illustrated) via the wafer transfer body 237, the pre-exposure temperature regulating unit (not illustrated) and the wafer transfer body 237.

Thereafter, the wafer W which has undergone exposure processing by the aligner is transferred from the interface section 205 into the temperature regulation processing unit (CPL) 218c of the third heating and temperature regulation processing unit 210c in the third heating and temperature regulation processing unit group 214c of the second processing station 209 via the wafer transfer body 237, the buffer cassette 233, and the wafer transfer body 237, and subjected to temperature regulation processing.

The wafer W which has undergone the temperature regulation processing in the temperature regulation processing unit (CPL) 218c is transferred to the developing processing unit (DEV) 226 in the first developing processing unit group 213c or the second developing processing unit group 213d by the transfer device 219b, and subjected to developing processing.

The wafer W which has undergone the developing processing in the developing processing unit (DEV) 226 is transferred into the heat processing unit (HP) 220b adjacent to the temperature regulation processing unit (CPL) 218b, for example, via the temperature regulation processing unit (CPL) 218b of the heating and temperature regulation processing unit 210b in the second heating and temperature regulation processing unit group 214b by the transfer device 219b, and subjected to heat processing.

The wafer W which has undergone the heat processing in the heat processing unit (HP) 220b is transferred to the temperature regulation processing unit 218b, and then transferred to the temperature regulation processing unit 218a of the first heating and temperature regulation processing unit 210a in the first heating and temperature regulation processing station group 214a by the transfer device 219a. The wafer W in the temperature regulation processing unit 218a is housed in the cassette C by the wafer transfer body 211 of the cassette station 202.

According to the coating and developing processing system in accordance with this embodiment structured as above, the chemical tower as a solution supplying section is disposed adjacent to each of the solution processing units (BARC, CT, and DEV), heating and temperature processing units are disposed adjacent to the chemical tower, and the temperature processing unit (CPL) of each of the heating and temperature regulation processing units is disposed on the chemical tower side, whereby the chemical tower is positioned between the heat processing units of the heating and temperature regulation processing units and the solution processing units. As a result, the thermal influence of the heat processing units on the solution processing unit side can be greatly reduced, and temperature control in the solution processing units (BARC, CT, and DEV) each for performing solution processing for the wafer W can be performed precisely.

Moreover, according to the coating and developing processing system in accordance with this embodiment, the heat insulating walls 239 and the passages 240 allowing gas exhausted from the bottoms of the solution processing unit groups 213a, 2213b, 213c, and 214d to flow to the tops thereof are disposed between the solution processing unit groups (the antireflection film coating unit (BARC) group 213a, the resist film coating unit (CT) group 213b, the first developing processing unit (DEV) group 213c, and the second developing processing unit (DEV) group 213d) and the heating and temperature regulation processing unit groups (the first to third heating and temperature regulation processing unit group 214a, 214b, and 214c) respectively. Consequently, the thermal influence of the heat processing units of the heating and temperature regulation units on the solution processing unit groups can be prevented, and temperature control in the solution processing unit groups each for performing solution processing for the wafer W about normal temperature can be performed very precisely.

Figure 42:
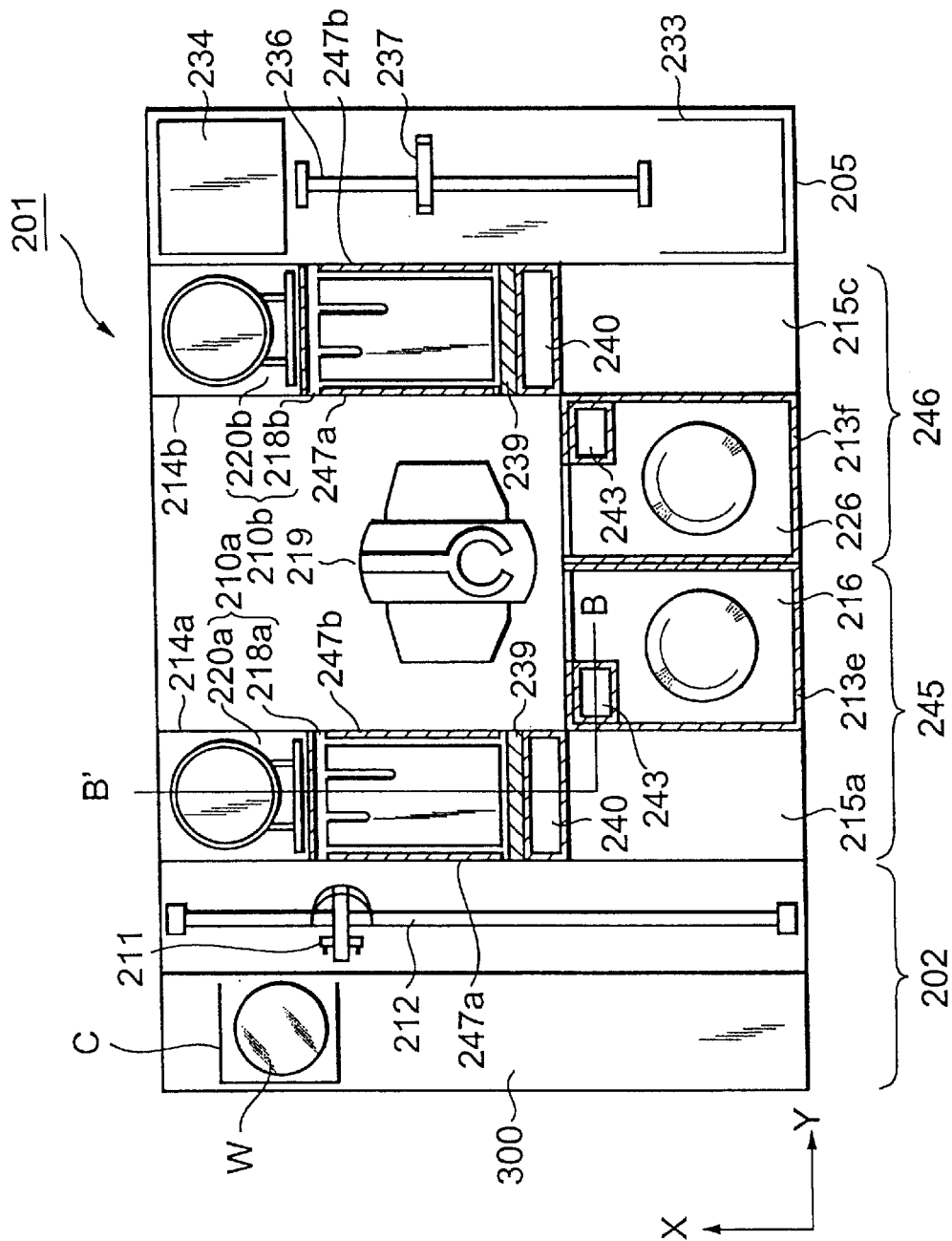
FIG. 42 is a plan view showing a coating and developing processing system according to a sixth embodiment of the present invention.
Figure 43:
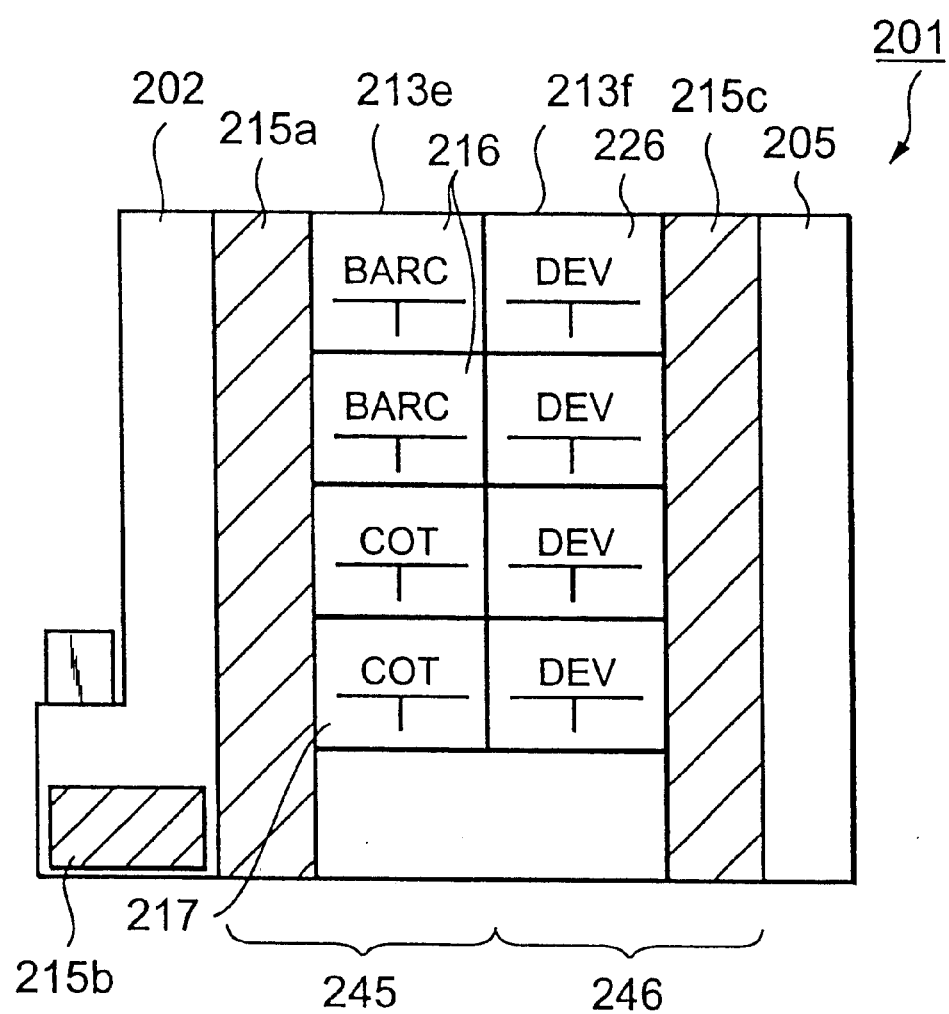
FIG. 43 is a front view of the coating and developing processing system shown in FIG. 42.
Figure 44:
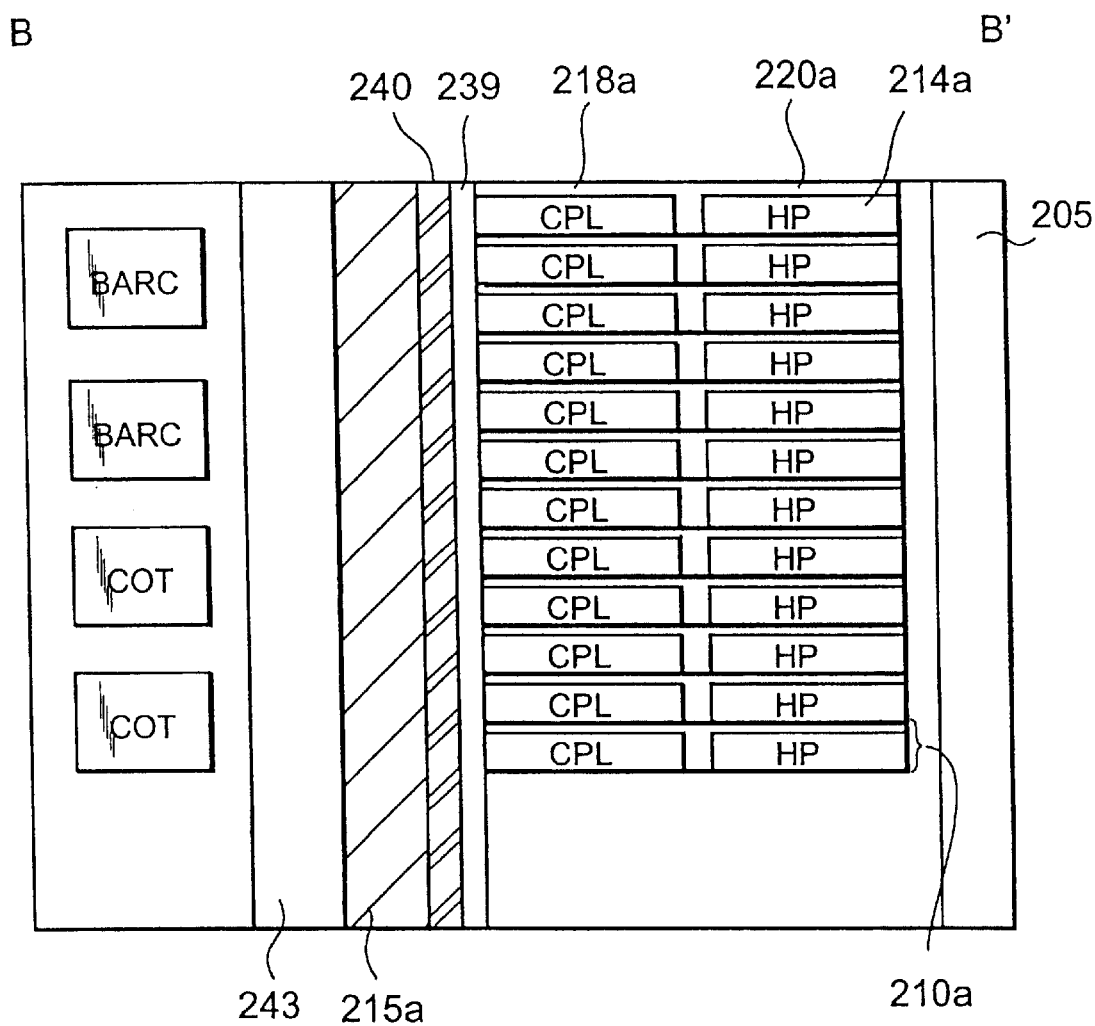
FIG. 44 is a sectional view taken along the line B–B' in FIG. 42.

A sixth embodiment of the present invention will be explained below with reference to FIG. 42 to FIG. 44. FIG. 42 to FIG. 44 are diagrams showing a coating and developing processing system according to an embodiment of the present invention, FIG. 42 is a plan view, FIG. 43 is a front view, and FIG. 44 is a sectional view taken along the line B–B' in FIG. 42, showing the positional relationship in the X-direction between a first processing unit group 213e and the second processing unit group 214a.

This embodiment is different from the aforesaid fourth embodiment in terms of structure in the positions of the chemical towers for housing the processing solution, and in that the number of the transfer devices and the heating and temperature regulation processing units is smaller and the antireflection film coating units (BARC) and the resist film coating units (CT) are stacked on top of one another. Compared with the fourth and fifth embodiments, the whole system is downsized in this embodiment.

Although the sixth embodiment will be explained below, the explanation of the same structure as in the fourth embodiment will be partially omitted. The same structure as in the fourth embodiment will be explained with the same numerals and symbols as those in the fourth embodiment.

As shown in FIG. 42, this coating and developing processing system 201 has structure in which the same cassette station 202 as in the fourth embodiment, a first processing station 245 in which various kinds of processing units each for performing predetermined processing for the wafers W one by one in coating and developing processing steps are multi-tiered, a second processing station 246 disposed adjacent to the first processing station, and the interface section 205 for receiving and sending the wafer W from/to an aligner (not illustrated) disposed adjacent the second processing station 246 are integrally connected. Coating processing of applying an antireflection film and a resist film on the wafer W is mainly performed in the first processing station 245, and developing processing of the exposed resist film is performed in the second processing station 246. In the almost central portion of the coating and developing processing system 201, the transfer device 219 is disposed and used for transferring the wafer W under processing in the first processing station 245 and the second processing station 246.

The cassette station 202 has almost the same structure as in the fourth embodiment, so that only different portions will be explained. As shown in FIG. 43, the chemical tower 215b for storing a resist film material as a processing solution to be supplied to the resist film coating units (CT) 217 which will be described later is disposed at the bottom of the cassette station 202.

As shown in FIG. 42 and FIG. 43, in the first processing station 245, as the first processing unit group for performing solution processing, the antireflection film and resist film coating unit (BARC) group 213e is provided at the front. In the antireflection film and resist film coating unit (BARC) group 213e, the antireflection film coating units (BARC) 216 and the resist film coating units (CT) 217 each for performing coating processing for the wafer W about normal temperature are stacked both in two tiers in the Z-axis direction. Moreover, the chemical tower 215a is disposed adjacent to the antireflection film and resist film coating unit (BARC) group 213e. The chemical tower 215a stores an antireflection film material as a processing solution to be supplied to the antireflection film coating units (BARC) 216.

At the back of the first processing station 245, the first heating and temperature regulation processing unit group 214a as the second processing unit group is arranged adjacent to the chemical tower 215a. In the first heating and temperature regulation processing unit group 214a, the first heating and temperature regulation processing units 210a are stacked in multiple tiers in the Z-axis direction. In each of the first heating and temperature regulation processing units 210a, the temperature regulation processing unit (CPL) 218a for performing temperature regulation processing for the wafer W and the heat processing unit (HP) 220a for performing heat processing are disposed adjacent to each other and integrated.

As shown in FIG. 44, the first heating and temperature regulation processing unit group 214a is structured by stacking the first heating and temperature regulation processing units 210a in twelve tiers. Incidentally, FIG. 44 is a sectional view taken along the line B–B' in FIG. 42, showing the positional relationship between the first processing unit group 213e, the second processing unit group 214a, and the chemical tower 215a along the X-direction. As shown in FIG. 42 and FIG. 44, the first heating and temperature regulation processing unit group 214a is structured by stacking the first heating and temperature regulation processing units 210a in twelve tiers, and disposed adjacent to the chemical tower 215a. In each of the first heating and temperature regulation processing units 210a of the first heating and temperature regulation processing unit group 214a, the temperature regulation processing unit (CPL) 218a out of the heat processing unit (HP) 220a and the temperature regulation processing unit (CPL) 218a is positioned on the chemical tower 215a side. The antireflection film and resist film coating unit group (CT) 213e is disposed adjacent to the chemical tower 215a.

Meanwhile, as shown in FIG. 42 and FIG. 43, in the second processing station 246, as the first processing unit group for performing solution processing for the wafer W about normal temperature, a developing processing unit group 213f is disposed at the front. In the developing processing unit group 213f, the developing processing units (DEV) 226 are stacked in four tiers in the Z-axis direction. Moreover, the chemical tower 215c is disposed adjacent to the developing processing unit group 213f. This chemical tower 215c stores a developing solution as a processing solution to be supplied to the developing processing units (DEV) 226.

At the back of the second processing station 246, the second heating and temperature regulation processing unit group 214b is disposed adjacent to the chemical tower 215c, and structured by stacking the second heating and temperature regulation processing units 210b in twelve tiers in the Z-axis direction. In each of the second heating and temperature regulation processing units 210b of the second heating and temperature regulation processing unit group 214b, the temperature regulation processing unit (CPL) 218b out of the heat processing unit (HP) 220b and the temperature regulation processing unit (CPL) 218b is positioned on the chemical tower 215c side. The developing processing unit (DEV) group 213f is disposed adjacent to the chemical tower 215c.

Around the vertical transfer-type transfer device 219, the antireflection film and resist film coating unit (CT) group 213e, the developing processing unit group 213f, the first and second heating and temperature regulation processing unit groups 214a and 214b are arranged. The transfer of the wafer W between respective unit groups is performed by the transfer device 219. The delivery of the wafer W from/to the first heating and temperature regulation processing unit group 214a to/from the wafer transfer body 211, the delivery of wafer W from/to the second heating and temperature regulation processing unit group 214b to/from the wafer transfer body 237, and the delivery of the wafer W from/to the first or the second heating and temperature regulation processing unit group 214a or 214b to/from the transfer device 219 are performed via the shutter members 247a and 247b provided on both side faces of the temperature regulation processing unit 218a or 218b of each of the heating and temperature regulation processing units 210a or 210b in the first or the second heating and temperature regulation processing unit group 214a and 214b.

The interface section 205 has the same structure as the interface section 205 in the aforesaid fourth embodiment, so that the explanation thereof is omitted.

As shown in FIG. 42 and FIG. 43, in the coating and developing processing system 201, the chemical towers 215 (215a and 215c) are disposed between the first processing unit groups 213 (the antireflection film and resist film coating unit (CT) group 213e and the developing processing unit group 213f) and the second processing unit groups 214 (the first heating and temperature regulation processing unit group 214a and the second heating and temperature regulation processing unit group 214b) respectively, and in addition, the heat insulating walls 239 and the passages 240 allowing gas exhausted from the bottoms of the first processing unit groups 213 to flow to the tops thereof are disposed between the chemical towers 215 and the second processing unit groups 214. In this embodiment, similarly to the aforesaid fourth embodiment, a clean air supplying section for supplying clean air the temperature of which is regulated to the first processing unit groups from above is disposed at the upper portion of the coating and developing processing system. The clean air supplying section includes an FFU (a fan filter unit), a temperature regulating device for regulating the temperature and humidity, and the like, and supplies clean air, which is obtained by regulating the temperature and humidity of gas which has flowed in through the passages 240 allowing the gas exhausted from the bottoms of the first processing unit groups to flow to the tops thereof and removing particles and the like from the gas, to the first processing unit groups through a passage 243. Also in this embodiment, likewise with the aforesaid fourth embodiment, temperature control in the processing solution supplying units (BARC, CT, and DEV) for processing the wafer W about normal temperature can be performed precisely by providing temperature regulating mechanisms in which the heat insulating walls 239 and the passages 240 allowing gas exhausted from the bottoms of the first processing unit groups 213 to flow to the tops thereof.

As shown in FIG. 43, in the aforesaid antireflection film and resist film coating unit (BARC) group 213e, two antireflection film coating units (BARC) 216 each for performing antireflection film coating processing for the wafer W by coating the wafer W with an antireflection film while the wafer W is mounted on a spin chuck in a cup and two resist film coating units (CT) 217 each for performing resist coating processing for the wafer W by coating the wafer W with a resist solution while the wafer W is mounted on a spin chuck in a cup are stacked vertically. In the developing processing unit group 213f, the developing processing units (DEV) 226 each for performing developing processing for the wafer W by supplying a developing solution while the wafer W is mounted on a spin chuck in a cup are stacked in four tiers.

In each of the first and second heating and temperature regulation processing unit groups 214a and 214b, the heating and temperature regulation processing units 210 in each of which the heat processing unit (HP) 220 for performing heat processing for the wafer W and the temperature regulation processing unit (CPL) 218 for performing temperature regulation processing for the wafer W are disposed adjacent to each other and integrated are stacked in twelve tiers. The shutter members 247a and 247b are provided on side faces of the temperature regulation processing unit of each of the heating and temperature regulation processing units 210.

The structure of the heating and temperature regulation processing unit 210 in this embodiment is the same as in the aforesaid fourth embodiment, and thus the explanation thereof is omitted.

The structure of the transfer device 219 is the same as those of the transfer devices 219a and 219b in the aforesaid fourth embodiment, and hence the explanation thereof is omitted.

Next, processing steps in the coating and developing processing system 201 structured as above will be explained. Operations in the heating and temperature regulation processing unit are the same as in the aforesaid fourth embodiment, and thus the explanation thereof is omitted.

In the coating and developing processing system 201, the unprocessed wafer W housed in the cassette C is taken out by the wafer transfer body 211 of the cassette station 202 and transferred into the temperature regulation processing unit (CPL) 218a in the first heating and temperature regulation processing unit 210a of the first processing station 245 to undergo temperature regulation processing while being mounted on the temperature regulating plate 225.

The wafer W which has undergone the temperature regulation processing in the temperature regulation processing unit (CPL) 218a is transferred into the antireflection film coating unit (BARC) 216 in the antireflection film and resist film coating unit (CT) group 213e by the transfer device 219, and coated with a processing solution for an antireflection film.

The wafer W coated with the processing solution for the antireflection film in the antireflection film coating unit (BARC) 216 is transferred into the temperature regulation processing unit (CPL) 218a of the first heating and temperature regulation processing unit 210a by the transfer device 219 and mounted on the temperature regulating plate 225. The wafer W mounted on the temperature regulating plate 225 is transferred into the heat processing unit (HP) 220a and subjected to heat processing.

Thereafter, the wafer W is transferred into the temperature regulation processing unit (CPL) 218a to undergo temperature regulation processing.

The wafer W which has undergone the temperature regulation processing in the temperature regulation processing unit (CPL) 218a is transferred into the resist film coating unit (CT) 217 in the antireflection film and resist film coating unit group 213e by the transfer device 219, and coated with a resist solution.

The wafer W coated with the resist solution in the resist film coating unit (CT) 217 is transferred into the temperature regulation processing unit (CPL) 218b of the second heating and temperature regulation processing unit 210b by the transfer device 219. The wafer W is then transferred into the heat processing unit (HP) 220b and subjected to heat processing.

Thereafter, the wafer W is transferred into the temperature regulation processing unit (CPL) 218b to undergo temperature regulation processing. The wafer W which has undergone the temperature regulation processing in the temperature regulation processing unit (CPL) 218b is transferred into the peripheral aligner 234 by the wafer transfer body 237 in the interface section 205 and subjected to wafer edge exposure.

The wafer W which has undergone the wafer edge exposure is transferred to the buffer cassette 233 by the wafer transfer body 237, and temporarily held or transferred to the aligner (not illustrated) via the wafer transfer body 237, the pre-exposure temperature regulating unit (not illustrated) and the wafer transfer body 237.

Thereafter, the wafer W which has undergone exposure processing by the aligner is transferred from the interface section 205 into the temperature regulation processing unit (CPL) 218b of the second heating and temperature regulation processing unit 210b in the second heating and temperature regulation processing unit group 214b of the second processing station 246 via the wafer transfer body 237, the buffer cassette 233, and the wafer transfer body 237, and subjected to temperature regulation processing.

The wafer W which has undergone the temperature regulation processing in the temperature regulation processing unit (CPL) 218b is transferred to the developing processing unit (DEV) 226 in the developing processing unit group 213f by the transfer device 219, and subjected to developing processing.

The wafer W which has undergone the developing processing in the developing processing unit (DEV) 226 is transferred into the heat processing unit (HP) 220a adjacent to the temperature regulation processing unit (CPL) 218a via the temperature regulation processing unit (CPL) 218a of the heating and temperature regulation processing unit 210a in the first heating and temperature regulation processing unit group 214a by the transfer device 219, and subjected to heat processing.

The wafer W which has undergone the heat processing in the heat processing unit (HP) 220a is transferred to the temperature regulation processing unit 218a, and then housed in the cassette C by the wafer transfer body 211 of the cassette station 202.

According to the coating and developing processing system in accordance with this embodiment structured as above, the chemical tower as a solution supplying section is disposed adjacent to each of the solution processing units (BARC, CT, and DEV), heating and temperature processing units are disposed adjacent to the chemical tower, and the temperature processing unit (CPL) of each of the heating and temperature regulation processing units is disposed on the chemical tower side, whereby the temperature regulation processing units and the chemical tower are positioned between the heat processing units of the heating and temperature regulation processing units and the solution processing units. As a result, the thermal influence of the heat processing units on the solution processing unit side can be greatly reduced, and temperature control in the solution processing units (BARC, CT, and DEV) each for performing solution processing for the wafer W can be performed precisely in this coating and developing processing system.

Moreover, according to the coating and developing processing system in accordance with this embodiment, the heat insulating walls 239 and the passages 240 allowing gas exhausted from the bottoms of the solution processing unit groups 213e and 213f to flow to the tops thereof are disposed between the solution processing unit groups (the antireflection film and resist film coating unit (CT) group 213e and the developing processing unit group 213f) and the heating and temperature regulation processing unit groups (the first and second heating and temperature regulation processing unit group 214a and 214b) respectively. Consequently, the thermal influence of the heat processing units of the heating and temperature regulation processing units on the solution processing unit groups can be prevented, and temperature control in the solution processing unit groups each for performing solution processing for the wafer W about normal temperature can be performed very precisely. Moreover, the passage 240 has a kind of heat insulating means, and hence structure with double heat insulating means is given by providing the heat insulating walls 239 and the passages 240 between the second processing unit groups 214 and the chemical towers 215. As a result, the processing solutions stored in the chemical towers 215 do not easily receive a thermal influence from the heat processing units 220, thereby facilitating the temperature regulation.

Although the aforesaid embodiments are explained with the examples in which the wafer W is used as a substrate, the present invention can be applied to other substrates such as an LCD substrate.

It should be noted that the present invention is not limited to the embodiments explained above.

Although three thermal processing system unit sections (G3 to G5), two main wafer transfer sections (A1, A2), two coating system unit sections (G1 and G2) are provided in the aforesaid first embodiment, four thermal processing system unit sections, three main wafer transfer sections, and three coating system unit sections, for example, may be provided by adding sections in rightward and leftward directions while the arrangement in FIG. 1 is maintained. Moreover, it is possible to add more sections as required.

In the thermal processing unit shown in FIG. 11 and FIG. 12, it is suitable that a shielding plate 93 shown by the dashed line for inhibiting mutual thermal interference is provided between the temperature regulation and transfer device C and the thermal processing device H, and that this shielding plate 93 is opened and closed by sliding the shielding plate 93 itself at the time of transfer by the temperature regulation and transfer device C.

Further, the present invention can be applied not only to the semiconductor wafer but also to a glass substrate used for a liquid crystal display device and the like.

Furthermore, the present invention can be applied not only to the resist coating and developing system but also other systems such as an SOD (Spin on Dielectric) processing system for forming a layer insulating film on a substrate, and the like. The SOD processing system includes a coating unit for coating the substrate with a layer insulating film material and a heating and temperature regulation processing unit for heating the substrate coated with the insulating film material and regulating the temperature of this substrate. This heating and temperature regulation processing unit has a heat processing unit and a temperature regulation processing unit provided adjacent thereto likewise with the heating and temperature regulation processing unit in the aforesaid embodiments. The heat processing unit in the SOD processing system has a hot plate capable of regulating its set temperature at 200° C. to 470° C. It is very effective to dispose the coating unit and the heating and temperature regulation processing unit so that the temperature regulation processing unit is disposed on the coating unit side as in the present invention in such a system having the unit for performing high-temperature processing and the coating unit as a solution processing unit. Alternatively, it is very effective to dispose a processing solution storing section for storing a processing solution to be supplied to the coating unit disposed adjacent to the solution processing unit adjacent to the heating and temperature regulation processing unit, and to dispose the temperature regulation processing unit on the processing solution storing section side. Consequently, temperature control in a solution processing unit group can be performed very precisely.

The disclosure of Japanese Patent Application No. 11-296395 filed Oct. 19, 1999 including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A substrate processing apparatus, comprising:

a temperature regulating section for regulating the temperature of a substrate at a predetermined temperature;

a temperature regulation and transfer mechanism for regulating the temperature of the substrate at a predetermined temperature and transferring the substrate;

a main transfer section for receiving and sending the substrate from/to said temperature regulating section and said temperature regulation and transfer mechanism; and a solution supplying section for supplying a predetermined solution to the substrate, wherein said main transfer section receives and sends the substrate from/to said solution supplying section.

2. The apparatus as set forth in claim 1, wherein said temperature regulating sections, said temperature regulation and transfer mechanisms, said processing sections, and said solution supplying sections are vertically stacked in multiple tiers individually.

3. The apparatus as set forth in claim 2, wherein said temperature regulation and transfer mechanism and said processing section are surrounded by the same casing to compose a processing unit, and wherein the processing units and said temperature regulating sections are vertically stacked in multiple tiers while being intermingled.

4. A substrate processing apparatus, comprising:

a main transfer section for transferring a substrate;

a processing section for performing thermal processing for the substrate;

a temperature regulation and transfer section for regulating the temperature of the substrate at a predetermined temperature and transferring the substrate between said main transfer section and said processing section; and a casing surrounding said processing section and said temperature regulation and transfer section and having an opening for the delivery of the substrate from/to said main transfer section to/from said temperature regulation and transfer section.

5. The apparatus as set forth in claim 4, further comprising:

a shutter mechanism for opening and closing the opening.

6. The apparatus as set forth in claim 4, wherein said casings are vertically disposed in multiple tiers.

7. The apparatus as set forth in claim 6, wherein said main transfer device comprises:

an arm for holding the substrate;

a forward and backward movement driving mechanism for moving said arm forward and backward;

a rotation driving mechanism for rotating said arm; and a vertical transfer mechanism for vertically moving said arm, said forward and backward movement driving mechanism, and said rotation driving mechanism integrally.

8. A substrate processing apparatus, comprising:

a main transfer section for transferring a substrate:

a first processing section for performing thermal processing for the substrate;

a second processing section for performing thermal processing for the substrate; and a temperature regulation and transfer section for regulating the temperature of the substrate at a predetermined temperature and transferring the substrate between said main transfer section, and said first processing section and said second processing section, said first processing section, said second processing section, and said temperature regulation and transfer section being disposed linearly.

9. The apparatus as set forth in claim 8, further comprising:

a casing surrounding said first processing section, said second processing section, and said temperature regulation and transfer section and having an opening for the delivery of the substrate from/to said main transfer section to/from said temperature regulation and transfer section.

10. A substrate processing apparatus, comprising:

a temperature regulating section for regulating the temperature of a substrate at a predetermined temperature;

a processing section for performing thermal processing for the substrate;

a main transfer section for receiving and sending the substrate at least from/to said temperature regulating section;

a sub-transfer section for transferring the substrate between said temperature regulating section and said processing section; and a casing surrounding said temperature regulating section and said sub-transfer section and having an opening for the delivery of the substrate from/to said main transfer section to/from said temperature regulating section.

11. A substrate processing apparatus, comprising:

a temperature regulating section for regulating the temperature of a substrate at a predetermined temperature;

a first processing section for performing thermal processing for the substrate;

a second processing section for performing thermal processing for the substrate;

a main transfer section for receiving and sending the substrate at least from/to said temperature regulating section; and a sub-transfer section for transferring the substrate between said temperature regulating section, said first processing section, and said second processing section, said temperature regulating section, said first processing section, and said second processing section being disposed linearly.

12. The apparatus as set forth in claim 11, further comprising:

a casing surrounding said first processing section, said second processing section, said temperature regulating section, and said sub-transfer section and having an opening for the delivery of the substrate from/to said main transfer section to/from said temperature regulating section.

13. A substrate processing apparatus, comprising:

a main transfer section for transferring a substrate;

a processing section for performing thermal processing for the substrate;

a temperature regulation and transfer section for regulating the temperature of the substrate at a predetermined temperature and transferring the substrate from/to said processing section; and a plurality of ascending and descending pins which are ascendable and descendable, for receiving and sending the substrate from/to said main transfer section when the pins are raised fully, and receiving and sending the substrate from/to said temperature regulation and transfer section when the pins are lowered fully.

14. The apparatus as set forth in claim 13, further comprising:

a casing surrounding said processing section, said temperature regulation and transfer section, and said ascending and descending pins and having an opening for the delivery of the substrate from/to said main transfer section to/from said ascending and descending pins.

15. A substrate processing apparatus, comprising:

a main transfer section for transferring a substrate;

a first processing section for performing thermal processing for the substrate;

a second processing section for performing thermal processing for the substrate;

a temperature regulation and transfer section for regulating the temperature of the substrate at a predetermined temperature and transferring the substrate between said first processing section and said second processing section; and a plurality of ascending and descending pins which are ascendable and descendable, for receiving and sending the substrate from/to said main transfer section when the pins are raised fully, and receiving and sending the substrate from/to said temperature regulation and transfer section when the pins are lowered fully, said first processing section, said second processing section, said temperature regulation and transfer section, and said ascending and descending pins being disposed linearly.

16. The apparatus as set forth in claim 15, further comprising:
a casing surrounding said first processing section, said second processing section, said temperature regulation and transfer section, and said ascending and descending pins and having an opening for the delivery of the substrate from/to said main transfer section to/from said ascending and descending pins.

17. A substrate processing apparatus, comprising:
a main transfer section for transferring a substrate;
a processing section for performing thermal processing for the substrate;
a temperature regulation and transfer section for regulating the temperature of the substrate at a predetermined temperature and transferring the substrate between said main transfer section and said processing section; and
a solution supplying section for supplying a predetermined solution to the substrate,
wherein said main transfer section receives and sends the substrate from/to said solution supplying section.

18. The apparatus as set forth in claim 17,
wherein said solution supplying sections are vertically disposed in multiple tiers.

19. A substrate processing apparatus, comprising:
a processing unit having openings for the delivery of a substrate on both sides; and
a first and second main transfer sections, disposed to face the respective openings of said processing unit, for carrying the substrate into/out of said processing unit through the openings,
said processing unit, comprising:
a processing section for performing thermal processing for the substrate; and
a temperature regulation and transfer section for regulating the temperature of the substrate at a predetermined temperature and transferring the substrate from/to said first and second transfer sections through the respective openings and from/to said processing section.

20. A substrate processing apparatus, comprising:
a processing unit having openings for the delivery of a substrate on both sides; and
a first and second main transfer sections, disposed to face the respective openings of said processing unit, for carrying the substrate into/out of said processing unit through the openings,
said processing unit, comprising:
a first processing section for performing thermal processing for the substrate;
a second processing section for performing thermal processing for the substrate; and
a temperature regulation and transfer section for regulating the temperature of the substrate at a predetermined temperature and transferring the substrate from/to said first and second transfer sections through the respective openings and between said first processing section and said second processing section,
said first processing section, said second processing section, and said temperature regulation and transfer section being disposed linearly.

21. A substrate processing apparatus, comprising:
a processing unit having openings for the delivery of a substrate on both sides; and
a first and second main transfer sections, disposed to face the respective openings of said processing unit, for carrying the substrate into/out of said processing unit through the openings,
said processing unit, comprising:
a temperature regulating section for receiving and sending the substrate from/to said first and second transfer sections through the openings and regulating the temperature of the substrate at a predetermined temperature;
a processing section for performing thermal processing for the substrate; and
a sub-transfer section for transferring the substrate between said temperature regulating section and said processing section.

22. A substrate processing section, comprising:
a processing unit having openings for the delivery of a substrate on both sides; and
a first and second main transfer sections, disposed to face the respective openings of said processing unit, for carrying the substrate into/out of said processing unit through the openings,
said processing unit, comprising:
a temperature regulating section for receiving and sending the substrate from/to said first and second transfer sections through the openings and regulating the temperature of the substrate at a predetermined temperature;
a first processing section for performing thermal processing for the substrate;
a second processing section for performing thermal processing for the substrate; and
a sub-transfer section for transferring the substrate between said temperature regulating section, said first processing section, and said second processing section,
said temperature regulating section, said first processing section, and said second processing section being disposed linearly.

23. A substrate processing apparatus, comprising:
a processing unit having openings for the delivery of a substrate on both sides; and
a first and second main transfer sections, disposed to face the respective openings of said processing unit, for carrying the substrate into/out of said processing unit through the openings,
said processing unit, comprising:
a processing section for performing thermal processing for the substrate;
a temperature regulation and transfer section for regulating the temperature of the substrate at a predetermined temperature and transferring the substrate from/to said processing section; and
a plurality of ascending and descending pins which are ascendable and descendable, for receiving and sending the substrate from/to said first and second main transfer sections through the openings when the pins are raised fully, and receiving and sending the substrate from/to said temperature regulation and transfer section when the pins are lowered fully.

24. A substrate processing apparatus, comprising:
a processing unit having openings for the delivery of a substrate on both sides; and a first and second main transfer sections, disposed to face the respective openings of said processing unit, for carrying the substrate into/out of said processing unit through the openings, said processing unit, comprising:

a first processing section for performing thermal processing for the substrate;

a second processing section for performing thermal processing for the substrate;

a temperature regulation and transfer section for regulating the temperature of the substrate at a predetermined temperature and transferring the substrate between said first processing section and said second processing section; and a plurality of ascending and descending pins which are ascendable and descendable, for receiving and sending the substrate from/to said first and second main transfer sections through the openings when the pins are raised fully, and receiving and sending the substrate from/to said temperature regulation and transfer section when the pins are lowered fully, said first processing section, said second processing section, said temperature regulation and transfer section, and said ascending and descending pins being disposed linearly.

25. The apparatus as set forth in claim 19, wherein said processing units are vertically disposed in multiple tiers.

26. The apparatus as set forth in claim 19, further comprising:

a solution supplying section, disposed at a position allowing the delivery of the substrate from/to said first or said second main transfer section, for supplying a predetermined solution to the substrate.

27. The apparatus as set forth in claim 26, wherein said solution supplying sections are vertically disposed in multiple tiers.

28. The apparatus as set forth in claim 19, further comprising:

an inspection section, disposed at a position allowing the delivery of the substrate from/to said first or said second main transfer section, for inspecting the substrate.

29. The apparatus as set forth in claim 28, wherein said inspection sections are vertically disposed in multiple tiers.

30. The apparatus as set forth in claim 28, wherein said inspection section performs microscopic inspection for the substrate.

31. The apparatus as set forth in claim 19, wherein said processing unit is further disposed on the opposite side to a face facing said processing unit of said first main transfer section.

32. The apparatus as set forth in claim 19, further comprising:

a receiving section for temporarily receiving and holding the substrate before and after processing is further disposed on the opposite side to a face facing said first or said second main transfer section of said processing unit.

33. The apparatus as set forth in claim 32, further comprising:

an inspection section, disposed in said receiving section, for inspecting the substrate.

34. The apparatus as set forth in claim 33, wherein said inspection section performs macroscopic inspection for the substrate.

35. A substrate processing apparatus, comprising:

a main transfer section for transferring a substrate;

a processing unit, disposed around said main transfer section, at least for performing thermal processing for the substrate;

a solution supplying unit, disposed around said main transfer section, for supplying a predetermined solution onto the substrate; and means for controlling atmospheric pressure so that said solution supplying unit has more positive pressure than said processing unit and said main transfer section and so that said main transfer section and said processing unit have almost the same atmospheric pressure.

36. The apparatus as set forth in claim 35, wherein said main transfer section, said processing unit, and said solution supplying unit are disposed in separate casings, wherein each of the casings has an opening for the delivery of the substrate, and wherein a passage connecting adjacent openings of respective casings is surrounded by a surrounding member.

37. The apparatus as set forth in claim 36, wherein a small gap is provided between the surrounding member and at least one of the casings.

38. The apparatus as set forth in claim 35, wherein respectively with respect to said main transfer section, said processing unit, and said solution supplying unit, said atmospheric pressure controlling means, comprises:

a gas supplying section for supplying a gas;

a gas exhausting section for exhausting the gas; and an atmospheric pressure measuring section for measuring atmospheric pressure, and controls at least either one of the amount of gas to be supplied by said gas supplying section or the amount of gas to be exhausted by said gas exhausting section based on the measured atmospheric pressure.

39. The apparatus as set forth in claim 38, wherein said processing units are vertically disposed in multiple tiers, and wherein each of said processing units has said gas supplying section, said gas exhausting section, and said atmospheric pressure measuring section.

40. The apparatus as set forth in claim 36, wherein at least one of the casings of said main transfer section, said processing unit, and said solution supplying unit is provided with a door capable of opening and closing used for inner maintenance, and wherein said atmospheric pressure controlling means controls atmospheric pressure so that the atmospheric pressure in the casing increases when the door is opened.

41. The apparatus as set forth in claim 36, further comprising:

an outer casing wholly surrounding the casings of said main transfer section, said processing unit, and said solution supplying unit and including a panel capable of opening and closing used for inside maintenance, wherein said atmospheric pressure controlling means controls atmospheric pressure so that the atmospheric pressure in the outer casing increases when the panel is opened.

42. The apparatus as set forth in claim 40,
wherein a gas supplying section which operates only when the door or the panel is opened is further provided in the casing or the outer casing.

43. A substrate processing apparatus, comprising:
a main transfer section for transferring a substrate;
a solution supplying unit, disposed around said main transfer section, for supplying a predetermined solution onto the substrate;
a processing unit, disposed around said main transfer section; and
unit temperature regulating means for performing temperature regulation or humidity control in said main transfer section, said solution supplying unit, and said processing unit separately,
said processing unit, comprising:
a temperature regulating section, disposed to adjoin said main transfer section, for regulating the temperature of the substrate at a predetermined temperature; and
a processing section, disposed so that said temperature regulating section is positioned between said main transfer section and said processing section itself, for performing thermal processing for the substrate.

44. The apparatus as set forth in claim 43,
wherein said processing section is covered with a temperature regulating mechanism.

45. The apparatus as set forth in claim 43,
wherein a heat shielding plate capable of opening and closing is disposed between said temperature regulating section and said processing section.

46. The apparatus as set forth in claim 43,
wherein said processing units are vertically disposed in multiple tiers, and
wherein said unit temperature regulating means performs temperature regulation or humidity control for said processing units separately.

47. The apparatus as set forth in claim 43,
wherein said solution supplying units are vertically disposed in multiple tiers, and
wherein said unit temperature regulating means performs temperature regulation or humidity control for said solution supplying units separately.

48. The apparatus as set forth in claim 43, further comprising:
a solution supplying mechanism for supplying the solution to said solution supplying unit,
wherein said unit temperature regulating means performs temperature regulation or humidity control also for said solution supplying mechanism.

49. The apparatus as set forth in claim 48,
wherein said solution supplying mechanism is disposed under said solution supplying unit.

50. The apparatus as set forth in claim 43,
wherein said solution supplying unit is allowed to be replaced with a solution supplying mechanism for supplying the solution to said solution supplying unit.

51. A substrate processing apparatus, comprising:
a processing unit group in which processing units each having a processing section for performing thermal processing for a substrate and a temperature regulating section for regulating the temperature of the substrate at a predetermined temperature are vertically disposed in multiple tiers;
a first main transfer device which is vertical transfer-type, disposed on one side of said processing unit group and allowed to get access to each of the processing units;
a first solution supplying unit, disposed around said first main transfer device for supplying a predetermined solution onto the substrate;
a second main transfer device which is a vertical transfer-type, disposed on the other side of said processing unit group and allowed to get access to each of the processing units and to move in a predetermined plane direction; and
a plurality of second solution supplying units, disposed along the direction of plane movement of said second main transfer device, each for supplying a predetermined solution onto the substrate.

52. The apparatus as set forth in claim 51,
wherein said first and second solution supplying units are vertically disposed in multiple tiers.

53. A substrate processing apparatus, comprising:
a substrate transfer device for transferring a substrate; and
processing units disposed on both sides and at the front of said substrate transfer device,
said processing units at least on one side being vertically disposed in multiple tiers, and
said substrate transfer device being a vertical transfer type capable of receiving and sending the substrate from/to each of the units, in which a supporting member for vertically supporting said substrate transfer device is attached on the side of said processing unit disposed at the front.

54. A substrate processing apparatus, comprising:
a first processing unit having a first and second openings for the delivery of a substrate on both sides;
a first and second transfer devices, disposed to face the respective openings of said first processing unit, for carrying the substrate into/out of said first processing unit through the respective openings;
a first and second shutter members for opening and closing the respective openings; and
means for controlling the opening and closing of the shutter members so that the second opening is closed when the first opening is open.

55. The apparatus as set forth in claim 54,
wherein said first processing unit comprises:
a thermal processing section for performing thermal processing for the substrate; and
a temperature regulating section for regulating the temperature of the substrate at a predetermined temperature.

56. The apparatus as set forth in claim 54,
wherein said first and second transfer devices are each surrounded by a surrounding member and practically blocked off from the outside.

57. A substrate processing apparatus, comprising:
a transfer device for delivering a substrate;
a first and second processing units disposed to adjoin said transfer device, each having a first and second openings for the delivery of the substrate from/to said transfer device on both sides;
a first and second shutter members for opening and closing the respective openings; and
means for controlling the opening and closing of the shutter members so that the second opening is closed when the first opening is open.

58. The apparatus as set forth in claim 57,
wherein said first processing unit is a unit for regulating the temperature of the substrate or heating the substrate, and wherein said second processing unit is a unit for supplying a predetermined solution to the substrate.

59. The apparatus as set forth in claim 57,
wherein said first and second transfer devices are each surrounded by a surrounding member and practically blocked off from the outside.

60. A substrate processing apparatus, comprising:
a transfer device for delivering a substrate;
a first and second processing units disposed to adjoin said transfer device, each having a first and second openings for the delivery of the substrate from/to said transfer device on both sides;
a first and second shutter members for opening and closing the respective openings; and
means for controlling the opening and closing of the shutter members so that the second opening is closed when the first opening is open.

61. A substrate processing apparatus, comprising:
a main transfer device for transferring a substrate;
a first processing unit, disposed to adjoin the front face side of said main transfer device, for receiving and sending the substrate from/to said main transfer device and supplying a predetermined solution to the substrate; and
a second processing unit, disposed to adjoin one side face of said main transfer device, for receiving and sending the substrate from/to said main transfer device and having a temperature regulating section for regulating the temperature of the substrate at a predetermined temperature and a heating section for performing heat processing for the substrate,
wherein the temperature regulating section of said second processing unit is disposed to adjoin said main transfer device, and the heating section is disposed to adjoin the temperature regulating section and to protrude to the back side of said main transfer device.

62. A substrate processing method, comprising the steps of:
subjecting a substrate to thermal processing in a processing section;
delivering the substrate subjected to the thermal processing to a main transfer section for transferring the substrate while regulating the temperature of the substrate at a predetermined temperature by a temperature regulation and transfer section; and
delivering the substrate from/to the main transfer section to/from the temperature regulation and transfer section via a plurality of ascending and descending pins which are ascendable and descendable, for receiving and sending the substrate from/to the main transfer section when the pins are raised fully, and receiving and sending the substrate from/to the temperature regulation and transfer section when the pins are lowered fully.

63. The method as set forth in claim 62, further comprising the steps of:
delivering the substrate from the main transfer section to the temperature regulation and transfer section; and
transferring the substrate to the processing section while regulating the temperature of the substrate at a predetermined temperature by the temperature regulation and transfer section.

64. A substrate processing apparatus, comprising:
a first processing unit group in which first processing units each for supplying a predetermined solution onto a substrate to perform solution processing are stacked in multiple tiers;
a processing solution supplying section, disposed adjacent to said first processing unit group, for supplying the predetermined solution to each of the first processing units;
a second processing unit group in which second processing units, in which a heating section for performing heat processing for the substrate and a temperature regulating section for performing temperature regulation processing for the substrate are disposed adjacent to each other and integrated, are stacked in multiple tiers; and
a transfer device for transferring the substrate between the first processing units and the second processing units,
said processing solution supplying section and said second processing unit group being disposed adjacent to each other so that the temperature regulating section out of the heating section and the temperature regulating section in each of the second processing units is positioned on said processing solution supplying section side.

65. The apparatus as set forth in claim 64,
wherein a clean air supplying section for supplying clean air to said first processing unit group is provided, and the clean air supplying section exhausts gas from the bottom of said first processing unit group, circulates the exhausted gas, and lets the gas of which the temperature is regulated out of the top of said first processing unit group, and further has a passage for letting the gas exhausted from the bottom of said first processing unit group to flow to the top thereof so that an area where said processing solution supplying section is disposed and an area where said second processing unit group is disposed are separated from each other.

66. The apparatus as set forth in claim 64,
wherein a heat insulating wall is provided so that an area where said processing solution supplying section is disposed and an area where said second processing unit group is disposed are separated from each other.

* * * * *